(12) United States Patent
Loeppert et al.

(10) Patent No.: US 12,240,748 B2
(45) Date of Patent: *Mar. 4, 2025

(54) MEMS DIE AND MEMS-BASED SENSOR

(71) Applicant: Knowles Electronics, LLC, Itasca, IL (US)

(72) Inventors: Peter V. Loeppert, Durand, IL (US); Michael Pedersen, Long Grove, IL (US); Vahid Naderyan, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 517 days.

This patent is subject to a terminal disclaimer.

(21) Appl. No.: 17/207,722

(22) Filed: Mar. 21, 2021

(65) Prior Publication Data
US 2022/0298005 A1    Sep. 22, 2022

(51) Int. Cl.
*B81B 3/00* (2006.01)

(52) U.S. Cl.
CPC .......... *B81B 3/0021* (2013.01); *B81B 3/0054* (2013.01); *B81B 2201/0257* (2013.01); *B81B 2203/0127* (2013.01); *B81B 2203/04* (2013.01)

(58) Field of Classification Search
CPC ............... B81B 3/0054; B81B 3/0021; B81B 2201/0257; B81B 2203/0127;
(Continued)

(56) References Cited

U.S. PATENT DOCUMENTS

| 4,154,115 A | 5/1979 | Hartung |
| 4,435,986 A | 3/1984 | Choffat |

(Continued)

FOREIGN PATENT DOCUMENTS

| CN | 106162476 A | 11/2016 |
| CN | 205754849 | 11/2016 |

(Continued)

OTHER PUBLICATIONS

Loeppert, U.S. Appl. No. 17/037,959, U.S. Patent and Trademark Office, Sep. 30, 2020.
(Continued)

*Primary Examiner* — Hrayr A Sayadian
(74) *Attorney, Agent, or Firm* — Hickman Becker Bingham Ledesma LLP; Matthew C. Loppnow

(57) ABSTRACT

A micro-electro-mechanical systems (MEMS) die includes a piston; an electrode facing the piston, wherein a capacitance between the piston and the electrode changes as the distance between the piston and the electrode changes; and a resilient structure (e.g., a gasket or a pleated wall) disposed between the piston and the electrode, wherein the resilient structure supports the piston and resists the movement of the piston with respect to the electrode. A back volume is bounded by the piston and the resilient structure and the resilient structure blocks air from leaving the back volume. The piston may be a rigid body made of a conductive material, such as metal or a doped semiconductor. The MEMS die may also include a second resilient structure, which provides further support to the piston and is disposed within the back volume.

19 Claims, 44 Drawing Sheets

(58) Field of Classification Search
CPC .. B81B 2203/04; H04R 19/005; H04R 17/02;
H04R 7/04; H04R 1/04; H04R 7/08;
H04R 2410/03; H04R 2201/003; H04R
19/04; H04R 1/021; H04R 2207/021
USPC .......................................................... 257/415
See application file for complete search history.

(56) References Cited

U.S. PATENT DOCUMENTS

| | | | |
|---|---|---|---|
| 5,575,310 A | 11/1996 | Kamen | |
| 6,075,867 A | 6/2000 | Jesper | |
| 6,431,003 B1 | 8/2002 | Stark | |
| 6,435,033 B2 | 8/2002 | Delaye | |
| 6,535,460 B2 | 3/2003 | Loeppert | |
| 6,571,445 B2 | 6/2003 | Ladabaum | |
| 6,662,663 B2 | 12/2003 | Chen | |
| 7,030,407 B2 | 4/2006 | Michler | |
| 7,040,173 B2 | 5/2006 | Dehe | |
| 7,124,638 B2 | 10/2006 | Kandler | |
| 7,150,195 B2 | 12/2006 | Jacobsen | |
| 7,190,038 B2 | 3/2007 | Dehe | |
| 7,470,546 B2 | 12/2008 | Lehmann | |
| 7,473,572 B2 | 1/2009 | Dehe | |
| 7,489,593 B2 | 2/2009 | Nguyen-Dinh | |
| 7,535,156 B2 | 5/2009 | Kvisteroy | |
| 7,545,012 B2 | 6/2009 | Smith | |
| 7,781,249 B2 | 8/2010 | Laming | |
| 7,793,550 B2 | 9/2010 | Elian | |
| 7,795,695 B2 | 9/2010 | Weigold | |
| 7,825,484 B2 | 11/2010 | Martin | |
| 7,829,961 B2 | 11/2010 | Hsiao | |
| 7,856,804 B2 | 12/2010 | Laming | |
| 7,903,831 B2 | 3/2011 | Song | |
| 7,918,135 B2 | 4/2011 | Hammerschmidt | |
| 8,127,619 B2 | 3/2012 | Hammerschmidt | |
| 8,339,764 B2 | 12/2012 | Steeneken | |
| 8,461,655 B2 | 6/2013 | Klein | |
| 8,575,037 B2 | 11/2013 | Friza | |
| 8,650,963 B2 | 2/2014 | Barr | |
| 8,723,277 B2 | 5/2014 | Dehe | |
| 8,809,973 B2 | 8/2014 | Theuss | |
| 8,989,411 B2 | 3/2015 | Hall | |
| 9,031,266 B2 | 5/2015 | Dehe | |
| 9,131,319 B2 | 9/2015 | Zoellin | |
| 9,179,221 B2 | 11/2015 | Barzen | |
| 9,181,080 B2 | 11/2015 | Dehe | |
| 9,237,402 B2 | 1/2016 | Loeppert | |
| 9,290,379 B2 | 3/2016 | Theuss | |
| 9,321,630 B2 | 4/2016 | Xu | |
| 9,332,330 B2 | 5/2016 | Elian | |
| 9,363,609 B2 | 6/2016 | Friza | |
| 9,380,381 B2 | 6/2016 | Straeussnigg | |
| 9,383,282 B2 | 7/2016 | Besling | |
| 9,383,285 B2 | 7/2016 | Phan Le | |
| 9,425,757 B2 | 8/2016 | Straeussnigg | |
| 9,432,759 B2 | 8/2016 | Elian | |
| 9,438,979 B2 | 9/2016 | Dehe | |
| 9,503,814 B2 | 11/2016 | Schultz | |
| 9,510,107 B2 | 11/2016 | Dehe | |
| 9,516,428 B2 | 12/2016 | Dehe | |
| 9,549,263 B2 | 1/2017 | Uchida | |
| 9,550,211 B2 | 1/2017 | Dirksen | |
| 9,631,996 B2 | 4/2017 | Wiesbauer | |
| 9,641,137 B2 | 5/2017 | Duenser | |
| 9,689,770 B2 | 6/2017 | Hammerschmidt | |
| 9,828,237 B2 | 11/2017 | Walther | |
| 9,884,757 B2 | 2/2018 | Winkler | |
| 9,903,779 B2 | 2/2018 | Hammerschmidt | |
| 9,942,677 B2 | 4/2018 | Wiesbauer | |
| 9,945,746 B2 | 4/2018 | Wiesbauer | |
| 9,986,344 B2 | 5/2018 | Dehe | |
| 9,998,812 B2 | 6/2018 | Elian | |
| 10,129,676 B2 | 11/2018 | Walther | |
| 10,153,740 B2 | 12/2018 | Albers | |
| 10,189,699 B2 | 1/2019 | Walther | |
| 10,200,801 B2 | 2/2019 | Wiesbauer | |
| 10,231,061 B2 | 3/2019 | Dehe | |
| 10,322,481 B2 | 6/2019 | Dehe | |
| 10,362,408 B2 | 7/2019 | Kuntzman | |
| 10,405,106 B2 | 9/2019 | Lee | |
| 10,433,070 B2 | 10/2019 | Dehe | |
| 10,560,771 B2 | 2/2020 | Dehe | |
| 10,575,101 B2 | 2/2020 | Walther | |
| 10,582,306 B2 | 3/2020 | Dehe | |
| 10,589,990 B2 | 3/2020 | Dehe | |
| 10,641,626 B2 | 5/2020 | Bretthauer | |
| 10,648,999 B2 | 5/2020 | Meinhold | |
| 10,669,151 B2 | 6/2020 | Strasser | |
| 10,676,346 B2 | 6/2020 | Walther | |
| 10,689,250 B2 | 6/2020 | Fueldner | |
| 10,715,926 B2 | 7/2020 | Bretthauer | |
| 10,939,214 B2 | 3/2021 | Kuntzman | |
| 11,509,980 B2 * | 11/2022 | Naderyan | H04R 1/02 |
| 11,910,138 B2 * | 2/2024 | Naderyan | H04R 1/02 |
| 2005/0177045 A1 | 8/2005 | Degertekin | |
| 2005/0207605 A1 | 9/2005 | Dehe | |
| 2005/0219953 A1 | 10/2005 | Bayram | |
| 2007/0205492 A1 | 9/2007 | Wang | |
| 2007/0278501 A1 | 12/2007 | Macpherson | |
| 2008/0175425 A1 | 7/2008 | Roberts | |
| 2008/0267431 A1 | 10/2008 | Leidl | |
| 2008/0279407 A1 | 11/2008 | Pahl | |
| 2008/0283942 A1 | 11/2008 | Huang | |
| 2009/0001553 A1 | 1/2009 | Pahl | |
| 2009/0175477 A1 | 7/2009 | Suzuki | |
| 2009/0180655 A1 | 7/2009 | Tien | |
| 2010/0046780 A1 | 2/2010 | Song | |
| 2010/0052082 A1 | 3/2010 | Lee | |
| 2010/0128914 A1 | 5/2010 | Khenkin | |
| 2010/0164025 A1 | 7/2010 | Yang | |
| 2010/0170346 A1 | 7/2010 | Opitz | |
| 2010/0173437 A1 | 7/2010 | Wygant | |
| 2010/0183181 A1 | 7/2010 | Wang | |
| 2010/0246877 A1 | 9/2010 | Wang | |
| 2010/0290644 A1 | 11/2010 | Wu | |
| 2010/0322443 A1 | 12/2010 | Wu | |
| 2010/0322451 A1 | 12/2010 | Wu | |
| 2011/0013787 A1 | 1/2011 | Chang | |
| 2011/0075875 A1 | 3/2011 | Wu | |
| 2012/0087521 A1 | 4/2012 | Delaus | |
| 2012/0328132 A1 | 12/2012 | Wang | |
| 2013/0001550 A1 | 1/2013 | Seeger | |
| 2013/0094675 A1 | 4/2013 | Je | |
| 2014/0071642 A1 | 3/2014 | Theuss | |
| 2015/0001647 A1 | 1/2015 | Dehe | |
| 2015/0090043 A1 | 4/2015 | Ruhl | |
| 2015/0110291 A1 | 4/2015 | Furst | |
| 2015/0247879 A1 | 9/2015 | Meinhold | |
| 2015/0296307 A1 | 10/2015 | Shao | |
| 2016/0066099 A1 | 3/2016 | Dehe | |
| 2016/0096726 A1 | 4/2016 | Dehe | |
| 2018/0091906 A1 | 3/2018 | Khenkin | |
| 2018/0194615 A1 | 7/2018 | Nawaz | |
| 2018/0234774 A1 | 8/2018 | Walther | |
| 2018/0317022 A1 | 11/2018 | Evans | |
| 2019/0100429 A1 | 4/2019 | Hanley | |
| 2019/0112182 A1 | 4/2019 | Metzger-Brueckl | |
| 2019/0181776 A1 | 6/2019 | Tumpold | |
| 2019/0246459 A1 | 8/2019 | Tumpold | |
| 2019/0255669 A1 | 8/2019 | Dehe | |
| 2019/0270639 A1 | 9/2019 | Lorenz | |
| 2019/0331531 A1 | 10/2019 | Glacer | |
| 2019/0339193 A1 | 11/2019 | Eberl | |
| 2019/0352175 A1 | 11/2019 | Tumpold | |
| 2019/0363757 A1 | 11/2019 | Mikolajczak | |
| 2020/0057031 A1 | 2/2020 | Theuss | |
| 2020/0112799 A1 | 4/2020 | Kuntzman | |
| 2020/0216309 A1 | 7/2020 | Fueldner | |
| 2020/0239302 A1 | 7/2020 | Strasser | |
| 2020/0252728 A1 | 8/2020 | Niederberger | |
| 2020/0252729 A1 | 8/2020 | Mueller | |

(56) References Cited

U.S. PATENT DOCUMENTS

| | | |
|---|---|---|
| 2021/0029470 A1 | 1/2021 | Nawaz |
| 2021/0120323 A1 | 4/2021 | Naderyan et al. |

FOREIGN PATENT DOCUMENTS

| | | |
|---|---|---|
| CN | 206212271 U | 5/2017 |
| CN | 108551646 | 9/2018 |
| CN | 110115048 | 8/2019 |
| CN | 110115048 A | 8/2019 |
| CN | 112689228 | 10/2020 |
| IN | 103344377 A | 10/2013 |
| KR | 100571967 B1 | 4/2006 |
| WO | 2012085335 A1 | 6/2012 |
| WO | WO2018/125839 | 7/2018 |
| WO | 2019183283 A2 | 9/2019 |

OTHER PUBLICATIONS

Loeppert, U.S. Appl. No. 17/286,231 U.S. Patent and Trademark Office, Apr. 16, 2021.
Chandrasekaran, U.S. Appl. No. 17/127,794 U.S. Patent and Trademark Office, Dec. 18, 2020.
Nawaz, U.S. Appl. No. 17/117,073 U.S. Patent and Trademark Office, Dec. 9, 2020.
Naderyan, U.S. Appl. No. 17/037,959 U.S. Patent and Trademark Office, Sep. 30, 2020.
Niederberger, U.S. Appl. No. 17/317,832 U.S. Patent and Trademark Office, May 11, 2021.
Loeppert, U.S. Appl. No. 17/133,506 U.S. Patent and Trademark Office, Dec. 23, 2020.
Guo, U.S. Appl. No. 17/137,678 U.S. Patent and Trademark Office, Dec. 30, 2020.
Loeppert, U.S. Appl. No. 17/111,465 U.S. Patent and Trademark Office, Dec. 3, 2020.
Wang, Search Report, Application No. 202011103002.5, China National Intellectual Property Administration, Beijing, Dec. 28, 2021.
Kang, International Search Report and Written Opinion, PCT/US2019/054695, Knowles Electronics, LLC (dated Jan. 23, 2020).
Andrews, "A comparison of squeeze-film theory with measurements on a microstructure," Industrial Research Ltd., Mar. 24, 1992.(9 pages).
Bay, "Design of a silicon microphone with differential read-out of a sealed double parallel-plate capacitor," Sensors and Acutators A 53 (1996), pp. 232-236, 5 pages.
Hansen, "Wideband micromachined capacitive microphones with radio frequency detection," Edward L. Ginzton Laboratory, Stanford University, Stanford, California, May 21, 2004, pp. 828-842, 15 pages.
Lin "Interface Engineering of Capacitive Micromachined Ultrasonic Transducers for Medical Applications," A Dissertation Submitted to the Department of Mechanical Engineering and the Committee on Graduate Studies of Stanford University in Partial Fulfillment of the Requirements for the Degree of Doctor of Philosophy, Jun. 2011, 168 pages.
Park, "Fabrication of Capacitive Micromachined Ultrasonic Transducers via Local Oxidation and Direct Water Bonding," Journal of Microelectromechanical Systems, vol. 20, No. 1, Feb. 2011, 10 pages.
Unknown, "Smart Sensors for Industrial Applications," Figure 19. 1, p. 306, 1 page (2013).
Wygant, "50 KHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

\* cited by examiner

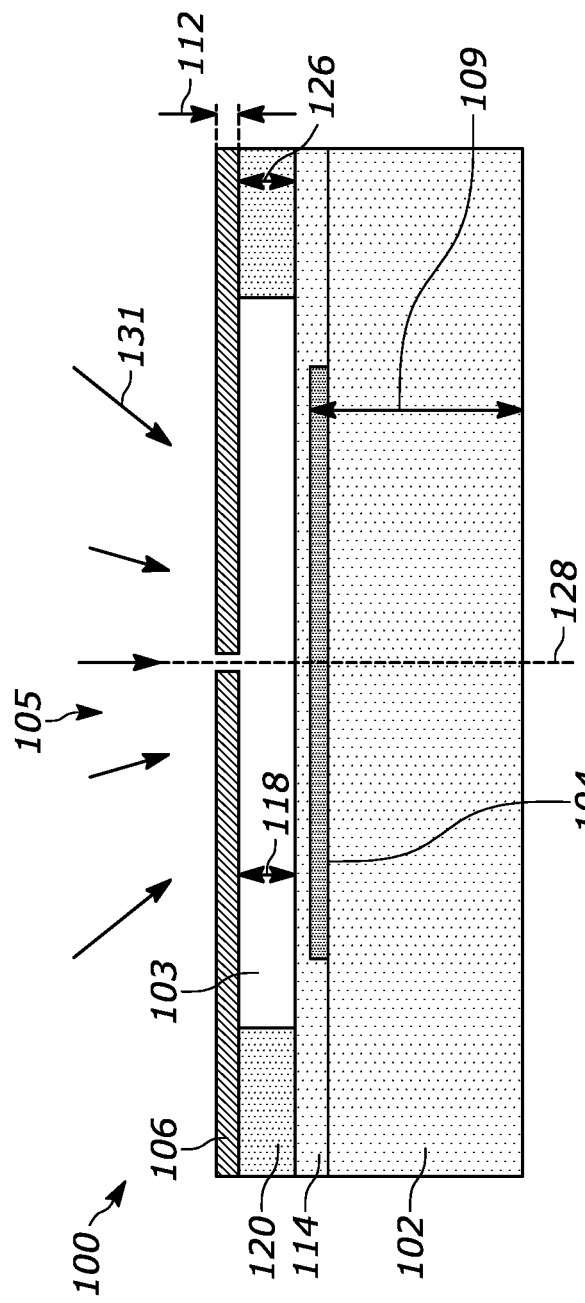
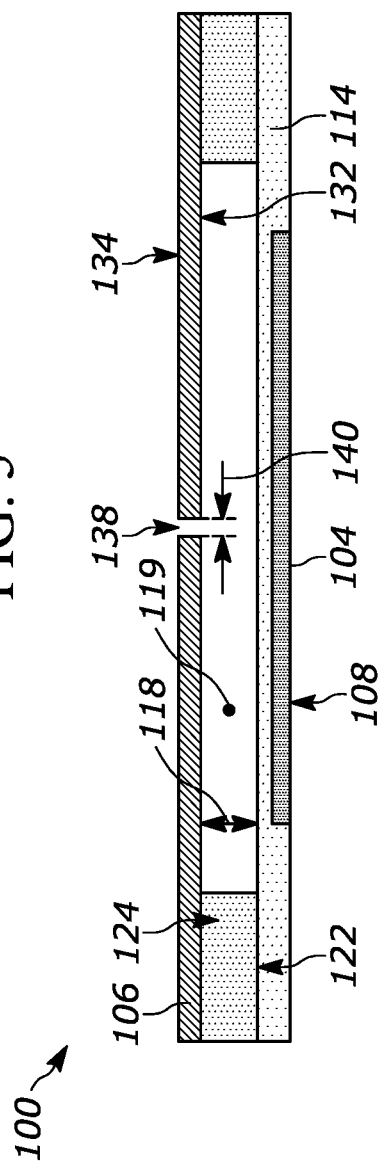
FIG. 5
FIG. 6

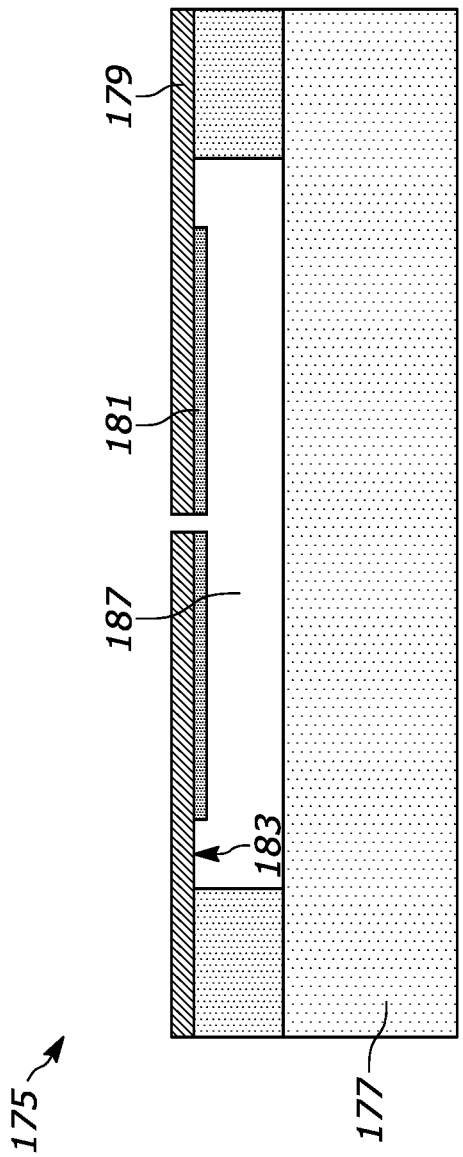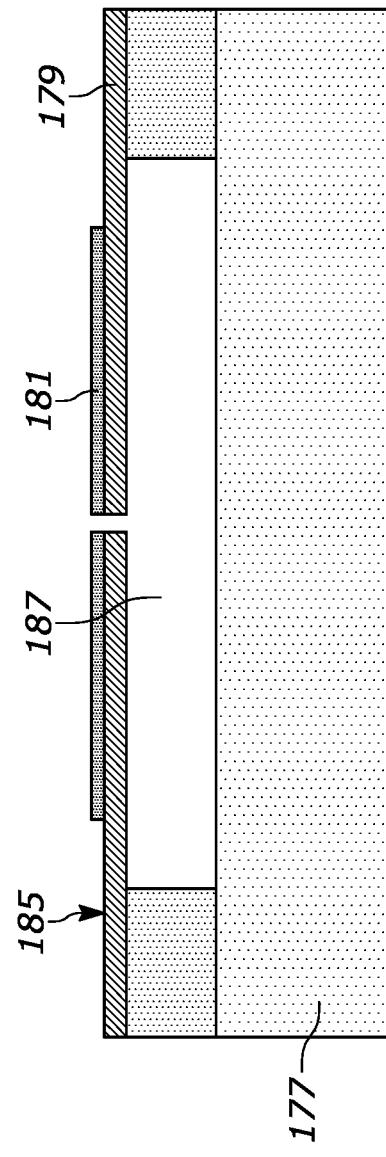
FIG. 7
FIG. 8

MEMS DIE AND MEMS-BASED SENSOR

FIELD OF THE DISCLOSURE

The present disclosure relates to microelectromechanical systems (MEMS) dies and MEMS-based sensors.

BACKGROUND

Microphone assemblies that include microelectromechanical systems (MEMS) dies convert acoustic energy into an electrical signal. The microphone assemblies may be employed in mobile communication devices, laptop computers, and appliances, among other devices and machinery. An important parameter for a microphone assembly is the acoustic signal-to-noise ratio (SNR), which compares the desired signal level (e.g., the signal amplitude due to acoustic disturbances captured by the microphone assembly) to the level of background noise. In microphone assemblies that include MEMS acoustic dies, SNR often limits the smallest dimensions that can be achieved and the overall package size of the microphone assembly.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

FIG. 5 is a side cross-sectional view of a MEMS die, according to an embodiment.

FIG. 6 is a partial reproduction of FIG. 5, showing an area near a back volume for the MEMS die.

FIG. 7 is a side cross-sectional view of a MEMS die with piezoelectric elements, according to an embodiment.

FIG. 8 is a side cross-sectional view of a MEMS die with piezoelectric elements, according to another embodiment.

DETAILED DESCRIPTION

Figure 2:
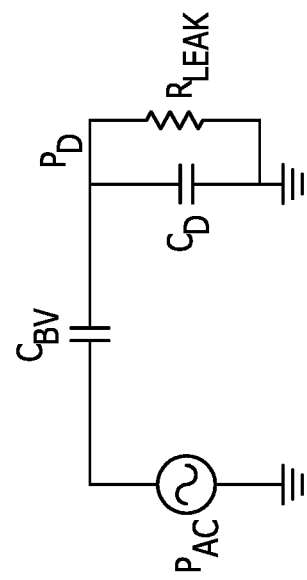
FIG. 2 is a signal lumped element model for the MEMS microphone of FIG. 1, according to an embodiment.

Described herein are various types of micro-electro-mechanical systems (MEMS) dies and sensors that incorporate such MEMS dies.

According to an embodiment, a MEMS die has a back volume in which every point within the back volume is no more than the width of one thermal boundary layer from a solid surface.

In an embodiment, a MEMS die includes a piston; an electrode facing the piston, wherein a capacitance between the piston and the electrode changes as the distance between the piston and the electrode changes; and a resilient structure (e.g., a gasket or a pleated wall) disposed between the piston and the electrode, wherein the resilient structure supports the piston and resists the movement of the piston with respect to the electrode. A back volume is bounded by the piston and the resilient structure and the resilient structure blocks air from leaving the back volume. The piston may be a rigid body made of a conductive material, such as metal or a doped semiconductor. The MEMS die may also include a second resilient structure, which provides further support to the piston and is disposed within the back volume. In some embodiments, the piston comprises a distinct layer of conductive material (e.g., an electrode that is distinct and made of a different material than the rest of the piston).

According to an embodiment, the MEMS die further includes a substrate that supports the resilient structure and the electrode. There are many possible configurations for the substrate. Examples include: (a) the substrate has pillars, with the electrode distributed among the pillars, (b) the substrate includes an electrically insulating layer in which the electrode is embedded, (c) the substrate has a plurality of channels (e.g., spaces between pillars in the substrate or a plurality of channels formed into rings) and the dimensions of the channels is such that any point within the channels is less than a thermal boundary layer thickness from a nearest surface.

There are also many possible configurations for the piston. Examples include: (a) the piston has pillars, (b) the piston has a plurality of channels (e.g., spaces between pillars in the substrate or a plurality of channels formed into rings) and the dimensions of the channels is such that any point within the channels is less than a thermal boundary layer thickness from a nearest surface.

In an embodiment, the MEMS die also has support walls and external conductors, in which each conductor is attached to the piston at one end and to a support wall at the other end.

The MEMS die may also include a vent (e.g., in the piston or in the resilient structure). The vent is configured to permit pressure equalization between the back volume and a region (e.g., a volume) external to the MEMS die at non-acoustic frequencies.

The MEMS die may be part of a sensor (e.g., an acoustic sensor) in which the MEMS die outputs a signal that is based on a change in a capacitance between the piston and the electrode resulting from a change in the distance between the piston and the electrode. In various embodiments, the sensor includes and bias voltage source. In some embodiments, the piston is electrically connected to the bias voltage source (e.g., via an external conductor) and the electrode outputs the signal. In other embodiments, the electrode is electrically connected to the bias voltage source and the piston outputs the signal (e.g., to an integrated circuit). In some embodiments, there is a second electrode facing the piston, and the first electrode is electrically connected to the bias voltage source and the second electrode outputs the signal. The sensor may include a base and a can attached to the base, in which the MEMS die is disposed within the can and sound enters the can and causes the piston to move, thereby causing a change in distance between the piston and the electrode.

According to an embodiment, a sensor includes a MEMS die that has an enclosure; a diaphragm disposed across an opening of the enclosure, in which the diaphragm includes a first electrode and the enclosure and diaphragm enclose a back volume; a second electrode disposed outside of the back volume and facing the diaphragm. Every point within the back volume is less than a thermal boundary layer thickness from a nearest surface. During operation of the sensor, the MEMS die outputs a signal that is based on a capacitance between the first electrode and the second electrode changing due to a change in a distance between the first electrode and the second electrode. In some embodiments, the MEMS die also includes a second diaphragm facing the second electrode, in which the second diaphragm has a third electrode and the second electrode is disposed between the first diaphragm and the second diaphragm. During operation, the MEMS die outputs a second signal that is based on a capacitance between the third electrode and the second electrode changing due to a change in a distance between the third electrode and the second electrode. Posts connecting the first diaphragm and the second diaphragm may extend through the second electrode. The sensor may also include a base having a port and a can attached to the base, where the MEMS die is disposed within the can and wherein sound enters through the port and causes the diaphragm to move during operation of the sensor.

In some embodiments, the first diaphragm and the second diaphragm define a sealed region in which the pressure is lower than an atmospheric pressure.

In various embodiments, the enclosure has a plurality of pillars, and there is a plurality of channels defined between the pillars. In other embodiments, ring-shaped channels are formed into the enclosure.

In an embodiment, a MEMS die includes an enclosure; a first diaphragm disposed across an opening of the enclosure, in which the enclosure and the first diaphragm define a back volume and every point within the back volume is less than a thermal boundary layer thickness from a nearest surface; a second diaphragm disposed outside of the back volume and facing the first diaphragm; a solid dielectric disposed between the first diaphragm and the second diaphragm, the solid dielectric having apertures; a first electrode oriented lengthwise along and parallel to an axis, the first electrode having a first end coupled to the first diaphragm and a second end coupled to the second diaphragm, the first electrode extending through an aperture; a second electrode oriented lengthwise along and parallel to the axis, the second electrode having a first end attached to the second diaphragm and a second end disposed within an aperture; and a third electrode oriented lengthwise along and parallel to the axis, the third electrode having a first end attached to the first diaphragm and a second end disposed within an aperture. The second end of the second electrode and the second end of the third electrode may be disposed within the same aperture.

According to an embodiment, (a) the first electrode is one of a first set of electrodes, each of which has a first end coupled to the first diaphragm, a second end coupled to the second diaphragm, and which extends through an aperture of the plurality of apertures, (b) the second electrode is one of a second set of electrodes, each of which has a first end attached to the second diaphragm and a second end disposed within an aperture, and (c) the third electrode is one of a third set of electrodes, each of which has a first end attached to the first diaphragm and a second end disposed within an aperture.

Figure 1:
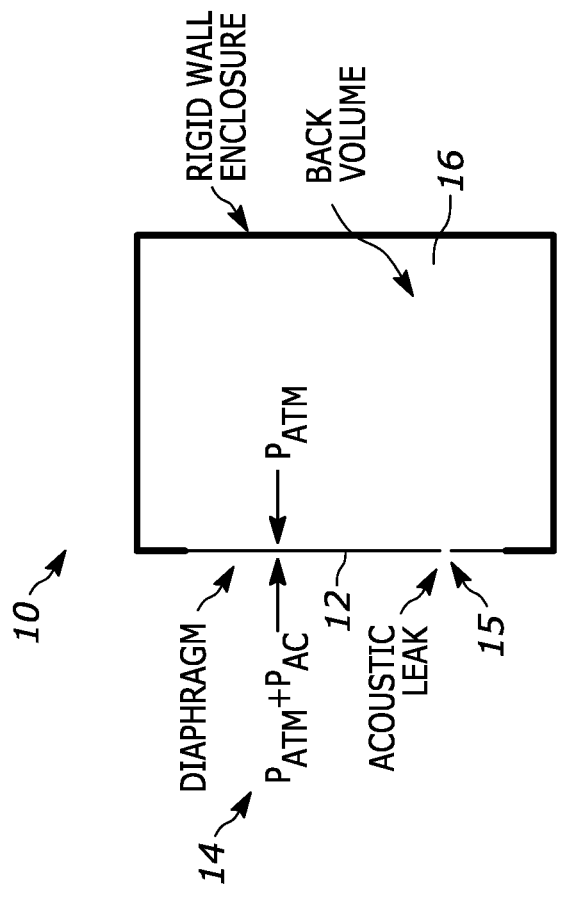
FIG. 1 is a side cross-sectional view of a MEMS microphone, according to an embodiment.

Pressure microphones typically include a diaphragm that responds to the pressure difference on either side of it. Turning to FIG. 1, in an omnidirectional microphone 10 one side of the diaphragm 12 is coupled to an outside environment 14 and the pressure on that side of the diaphragm 12 is the sum of atmospheric pressure ($P_{atm}$) and the desired acoustic signal ($P_{ac}$). The pressure on the other side of the diaphragm 12 is provided by a back volume 16 which is acoustically isolated from the outside environment 14 yet maintains atmospheric pressure in it through a small acoustic leak 15.

A small-signal lumped element model for the omnidirectional microphone 10 of FIG. 1 is shown in FIG. 2. The compliance of the diaphragm 12 and the back volume 16 are represented by capacitors $C_D$ and $C_{BV}$, respectively. The resistance of the acoustic leak 15 is represented by $R_{Leak}$. The acoustic signal is represented as an AC signal source. The pressure across the diaphragm 12, $P_D$, causes the diaphragm 12 to move. Notice that the atmospheric pressure, which is present on both sides of the diaphragm 12, is no factor in the diaphragm motion and is not included in this small signal model. Notice also, that when the back volume compliance ($C_{BV}$) is large compared to that of the diaphragm ($C_D$), most of the acoustic pressure is present across the diaphragm 12. If the back volume compliance ($C_{BV}$) is small compared to that of the diaphragm ($C_D$), very little of the acoustic pressure is present across the diaphragm 12. The acoustic leak resistance ($R_{Leak}$) acts in conjunction with the parallel combination of the back volume compliance ($C_{BV}$) and the diaphragm compliance ($C_D$) to form a high pass filter. Thus only acoustic pressure signals above a certain frequency will be present across the diaphragm 12.

The acoustic leak, being a real resistance, generates thermal noise. This noise appears as a noise pressure across the diaphragm 12. But the parallel combination of the back volume compliance ($C_{BV}$) and the diaphragm compliance ($C_D$) limits the noise to low frequencies so that when the noise is integrated over the audio frequency range (the noise is band limited so this is equivalent to integrating from zero to infinity), the result is the well known quantity kT/C where k is Boltzmann's constant, T is absolute temperature in Kelvin, and C is the parallel combination of the two compliances ($C_D$ and $C_{BV}$). Thus for a particular low frequency cut-off, the noise due to the acoustic leak generally increases with smaller microphones. The only option to reduce this noise is to lower the cut-off frequency for smaller microphones. Traditional A-Weighting depreciates the significance of the low frequency leak noise even for very small microphones with sufficiently low cut-off frequencies.

This has been the traditional view of microphones above a certain size. However, for small microphones another factor becomes significant. As pointed out by Kuntzman et al. (hereafter "Kuntzman"), "Thermal Boundary Layer Limitations on the Performance of Micromachined Microphones," J. Acoust. Soc. Am. 144(5), 2018, which is incorporated by reference herein, the thermal boundary layer is that factor. Kuntzman discloses the effects of acoustic compression and expansion of air within the back volume of a microphone assembly as a function of the dimensions of the microphone assembly enclosure (e.g., as a function of the back volume of the microphone assembly). Kuntzman states: "for cases in which the thermal boundary layer becomes sufficiently large relative to the enclosure dimensions, which occurs for small enclosures and at low frequencies, compression and expansion of the air within the enclosure transitions from adiabatic to isothermal and a correction to the adiabatic cavity impedance becomes necessary. Heat transfer at the enclosure walls dissipates energy from the system and results in acoustic damping, which contributes thermal-acoustic noise according to the fluctuation-dissipation theorem." Kuntzman further states: "the acoustic damping resulting from thermal relaxation losses in the enclosure can be a significant noise contributor, particularly for small enclosure sizes for which the losses are most prominent." Stated generally, Kuntzman teaches that it is desirable to increase the back volume for a microphone assembly to reduce thermal-acoustic noise.

The effects of thermal-acoustic noise are most significant at low frequencies, as indicated by Thompson et al. (hereafter "Thompson"), "Thermal Boundary Layer Effects on the Acoustical Impedance of Enclosures and Consequences for Acoustical Sensing Devices," J. Acoust. Soc. Am. 123 (3), 2008, which is incorporated by reference herein. Thompson states: "the change in microphone sensitivity from thermal effects is caused by the change in the compliance of the [microphone] enclosure at low frequencies . . . the thermal resistance could possibly affect the internal noise of the microphone if the noise from this resistance were comparable to or greater than the other thermal noise sources in the microphone." The thermal-acoustic noise contribution is expected to be greatest for MEMS microphones with small enclosure volumes and low frequencies, where the distances between solid surfaces are on the order of the thickness of the thermal boundary layer within the back volume (which increases with decreasing operating frequency). The thermal boundary layer thickness may be determined approximately as $$\delta_t = \sqrt{\frac{2\kappa}{\omega \rho_0 C_p}}$$

where $\omega$ is the operating angular frequency of the microphone, and where $\kappa$ is the thermal conductivity, $\rho_0$ is the density, and $C_p$ is the specific heat at constant pressure of the gas inside the microphone assembly (e.g., within the back volume of the microphone assembly). The relationship above confirms the dependency between the thermal boundary layer thickness and the operating frequency of the microphone.

The materials that comprise a microphone, metals and plastics for instance, all have much larger thermal capacities than air. Thus at each surface of the back volume, there is heat exchange with the boundary materials and these surfaces are essentially isothermal. The heat exchange is frequency dependent and contributes to the impedance of the back volume. In essence, when the air in the back volume is compressed, its temperature rises. At a given frequency, the portion of the air within a diffusion length of a boundary gives up this heat to the boundary material. When the air in the back volume rarifies, the temperature of the air drops but the portion of the air within a diffusion length of a boundary gains heat from the boundary material.

Figure 4:
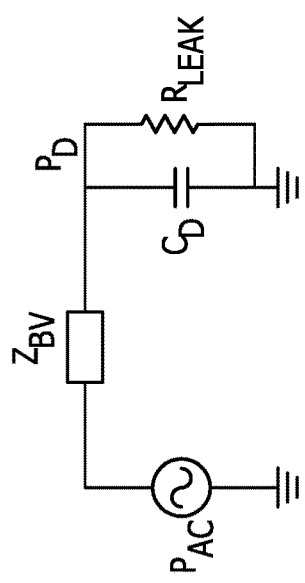
FIG. 4 is a signal lumped element model for the MEMS microphone of FIG. 3, according to an embodiment.
Figure 3:
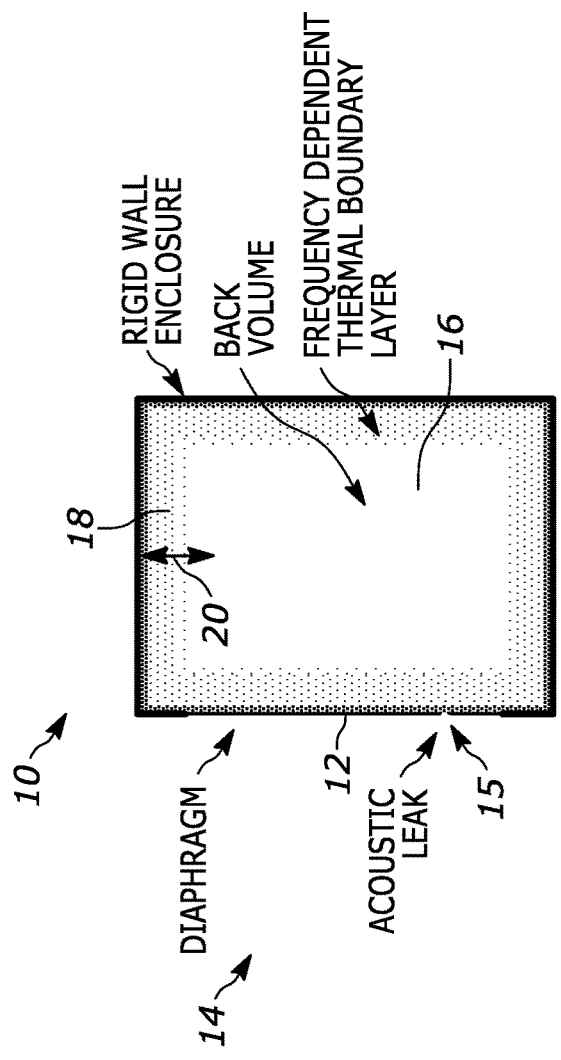
FIG. 3 is a side cross-sectional view of a MEMS microphone that shows a thermal boundary layer within a back volume of the MEMS microphone, according to an embodiment.

FIG. 3 depicts the thermal boundary layer 18 for the omnidirectional microphone 10 of FIG. 1. In this figure, the thermal boundary layer 18 is shaded to depict how the thickness 20 of the thermal boundary layer 18 changes with frequency. Darker shading corresponds to the thickness 20 at higher frequency. Thus, at high frequencies, the thermal boundary layer 18 is quite thin while at low frequencies, the thermal boundary layer 18 is thicker. The impact of the thermal boundary layer 18 on the model is shown in FIG. 4. The compliance of the back volume is now replaced with a complex impedance $Z_{BV}$. The real part of the complex impedance depends on frequency and microphone size and thus a noise contribution is made to the pressure across the diaphragm. The analysis of this noise effect is complex but addressed in Kuntzman. In essence, as the microphone gets smaller, the thermal boundary layer expands to consume more of the total back volume and when integrated, the total noise effect on the pressure across the diaphragm goes up as the microphone size goes down. This is another expected kT/C effect.

According to an embodiment, there is a size region that runs contrary to this conventional wisdom. At very small sizes, where the thermal boundary layer consumes the entire back volume, and particularly for frequencies below audio (<20 kHz) where there is a significant fraction of thermal boundary layer volume within the total back volume, the trend of increasing noise reverses. If the noise from zero to infinite frequency is integrated, kT/C still increases with smaller size, as would be expected. However, if the integration is carried out only over the audio frequency band, the result is a value that is less than kT/C (integrated from zero to infinity). The audio band noise power fraction of kT/C decreases as the back volume size decreases.

In general, disclosed herein are systems and devices for providing high acoustic signal-to-noise ratio (SNR) performance for a MEMS die (e.g., operating as an acoustic transducer) in a microphone. Also disclosed herein are MEMS dies where the distance between any point within the back volume and the nearest solid surface to that point is less than a single thermal boundary layer thickness at an upper limit of the audio frequency band for a MEMS transducer that employs such dies. Because the thermal boundary layer thickness increases with decreasing frequency (as described above), this limit ensures that the distance between any point within the back volume and the nearest solid surface is less than a single thermal boundary layer thickness over a majority of the audio frequency band for the MEMS die. As used hereafter, the upper limit is an upper frequency of the audio band of interest for detection by the microphone. For example, the upper limit may be an upper range of the frequency band that the integrated circuit is monitoring for the audio signal (e.g., 20 kHz). Note that a MEMS die may react to, and a microphone may detect audio signals above the upper limit. However, the design of the microphone would be optimized for a given upper limit.

As used herein, the phrase "enclosed volume" or "enclosed back volume" refers to a volume (such as a back volume) that is substantially enclosed but may not be fully enclosed. For example, the enclosed volume may refer to a volume that is fluidly connected with an environment surrounding the MEMS die via a pierce or opening in a diaphragm, in a piston, or in a resilient structure.

FIG. 5 and FIG. 6 show a side cross-sectional view of a MEMS die 100 for a microphone. The MEMS die 100 is configured to use a capacitive acoustic transduction method to generate an electrical signal in response to acoustic disturbances incident on the MEMS die 100. In other embodiments, the MEMS die 100 may be use another type of transduction, such as piezoelectric transduction, piezoresistive transduction, or optical transduction. The MEMS die 100 includes a substrate 102, an electrode 104, and a movable diaphragm 106. The movable diaphragm 106 may be or may include an electrode and may be referred to as a "first electrode," while the electrode 104 may be referred as a "second electrode." The diaphragm 106 and the electrode 104, along with the gap therebetween (which includes insulative material such as air), form a capacitive element. The electrode 104 may sometimes be referred to as a counter electrode. The substrate 102 supports the electrode 104 and the diaphragm 106. As shown in FIG. 5, the electrode 104 is coupled directly to the substrate 102 along an entire lower surface 108 of the electrode 104. The substrate 102 is large relative to the diaphragm 106 (and relative to the electrode 104), which ensures that the electrode 104 is rigidly supported. In particular, a combined thickness 109 of the substrate 102 and the electrode 104 is an order of magnitude greater than a thickness 112 of the diaphragm 106. In other embodiments, the relative thickness between the substrate 102 and the diaphragm 106 may be different.

According to an embodiment, the electrode 104 is deposited directly onto a first surface (e.g., an upper surface) of the substrate 102. In some embodiments the electrode 104 is deposited onto or otherwise connected to an insulator 114. The insulator 114 may be made from silicon nitride or another dielectric material. The electrode 104 may be made from polycrystalline silicon or another suitable conductor. In the embodiment shown in FIG. 5, the electrode 104 is "sandwiched" or otherwise disposed between the substrate 102 and the insulator 114. The electrode 104 is at least partially embedded within a lower surface of the insulator 114 and is directly coupled to the substrate 102. In other embodiments, the position of the electrode 104 may be different (e.g., the electrode 104 may be embedded within or formed onto an upper surface of the insulator 114). In yet other embodiments, the electrode 104 may extend to an outer perimeter of the volume between the electrode 104 and the diaphragm 106 (e.g., the diameter of the electrode 104 may be approximately the same as the diameter of the diaphragm 106.

In an embodiment, the diaphragm 106 is oriented parallel (or substantially parallel) to the electrode 104 (or insulator 114, whichever is on top) and is spaced apart from the electrode 104 to form a gap. In various embodiments, the gap represents a height 118 of a cylindrically-shaped cavity (e.g., a cylindrically-shaped volume between the insulator 114 and the diaphragm 106, or a cylindrically-shaped volume between the electrode 104 and the diaphragm 106 in those embodiments where the electrode 104 is on top of the insulator 114). The volume between the electrode 104 and the diaphragm 106 forms an entire back volume 103 for the MEMS die 100 (and, to the extent that the MEMS die 100 can be considered to be a microphone, the entire back volume of the microphone) as will be further described. The diaphragm 106 is spaced apart from the electrode 104 by at least an intermediate layer 120. A first side 122 of the intermediate layer 120 is coupled to the insulator 114, which, in turn, is coupled to electrode 104. A second side 124 of the intermediate layer 120 is coupled to the diaphragm 106 along at least a portion of the perimeter of the diaphragm 106. A height 126 of the intermediate layer 120 (e.g., an axial height of the intermediate layer 120 parallel to a central axis 128 of the MEMS die 100), plus a height/thickness of the insulator 114 between the electrode 104 and the intermediate layer 120, is approximately equal to a distance between the diaphragm 106 and the electrode 104 (e.g., the height 118). In other embodiments, the distance between the diaphragm 106 and the electrode 104 is approximately equal to the height of the intermediate layer 120. In various embodiments, the intermediate layer 120 includes a sacrificial layer (e.g., an oxide layer, a phosphosilicate glass (PSG) layer, a nitride layer, or any other suitable material) that is deposited or otherwise formed onto the electrode 104. In some embodiments, the intermediate layer 120 may be made from silicon oxide or other materials that can be etched without affecting the substrate 102, the electrode 104, or the diaphragm 106.

In an embodiment, the diaphragm 106 is made from polycrystalline silicon or another conductive material. In other embodiments, the diaphragm 106 includes both an insulating layer and a conductive layer. As shown in FIG. 6, a first side 132 of the diaphragm 106 faces the back volume 103. A second side 134 of the diaphragm 106, opposing the first side 132, faces toward a front volume 105 for the microphone assembly. Sound energy 131 (e.g., sound waves, acoustic disturbances, etc.) incident on the second side 134 diaphragm 106 from the front volume 105 causes the diaphragm 106 to move toward or away from the electrode 104. The change in distance between the electrode 104 and the diaphragm 106 (e.g., the change in the height 118) results in a corresponding change in capacitance. An electrical signal representative of the change in capacitance may be generated and transmitted to portions of a microphone assembly in which the MEMS die 100 is incorporated, such as to an integrated circuit (not shown), for processing.

According to an embodiment, the electrode 104 is a solid, unperforated structure, such that the volume between the insulator 114 and the diaphragm 106 forms an entire back volume 103 for the MEMS die 100. In contrast, for MEMS dies that include a perforated counter electrode (e.g., a backplate with multiple through-hole openings), the back volume includes both the volume between the structure opposing the diaphragm (the insulator 114 and, if exposed, the electrode 104) and the diaphragm 106 as well as any additional fluid (e.g., air) volume on an opposing side of the opposing structure to which the space between the electrode 104 and the diaphragm 106 is fluidly connected.

Embodiments of the present disclosure may also include other types of MEMS dies. For example, the MEMS die may be piezoelectric, piezoresistive, or optically transductive. FIG. 7 shows an embodiment of a piezoelectric MEMS die 175. The piezoelectric MEMS die 175 includes a substrate 177 and a diaphragm 179 coupled to the substrate 177 and spaced apart from the substrate 177. The piezoelectric MEMS die 175 also includes a piezoelectric layer 181 connected to the diaphragm 179. As shown in FIG. 7, the piezoelectric layer 181 may be connected (e.g., deposited onto or otherwise coupled) to a lower surface 183 of the diaphragm 179. In other embodiments, as shown in FIG. 8, the piezoelectric layer 181 may be connected to an upper surface 185 of the diaphragm 179. In either case, the volume between the substrate 177 and the diaphragm 179 forms an entire back volume 187 for the piezoelectric MEMS die 175.

Figure 9:
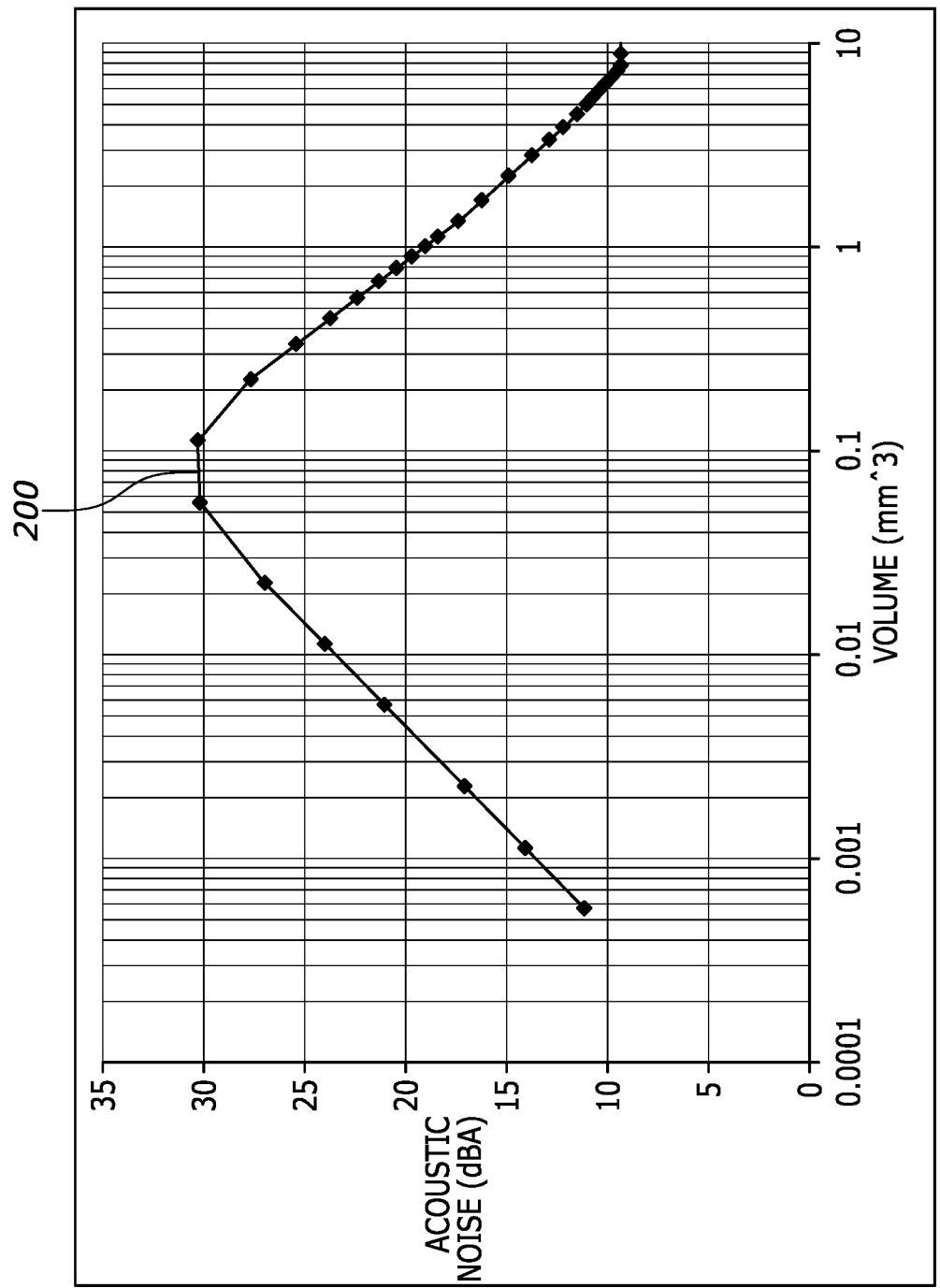
FIG. 9 is a graph of acoustic noise as a function of back volume for a MEMS die, according to an embodiment.

FIG. 9 shows a plot of the A-weighted acoustic noise 200 in the audio frequency band (e.g., range) of 20 Hz to 20 kHz (hereafter "acoustic noise") of a MEMS die as a function of the size of the back volume of the MEMS die. In particular, FIG. 9 shows the simulated relationship between the acoustic noise 200 and the back volume for a MEMS die with a counter electrode and diaphragm of fixed size (e.g., for a diaphragm with fixed diameter), in which the MEMS die is being used as a transducer. In the simulation, the back volume was varied within a range between approximately 0.0006 mm$^3$ and 10 mm$^3$ by changing the size of the gap (e.g., height 118 of FIG. 5) between 0.5 um and 8 mm. As shown in FIG. 9, the acoustic noise 200 increases with decreasing back volume (e.g., decrease in the height 118 of FIG. 5) within a range between approximately 9 mm$^3$ and 0.1 mm$^3$. The trend in acoustic noise 200 between approximately 9 mm$^3$ and 0.1 mm$^3$ is consistent with the discussion provided in both Kuntzman and Thompson, which teach that the acoustic noise increases as the size of the back volume decreases. Surprisingly, a reversal in the trend is observed (for the simulated diaphragm diameter) below a back volume of approximately 0.1 mm$^3$ (in the size range of the MEMS die). As shown in FIG. 9, at a back volume of approximately 0.0006 mm$^3$, the acoustic noise 200 has returned to levels that are approximately equal to those achieved at 4 mm$^3$ (e.g., a reduction in total back volume by a factor of approximately 7500).

Figure 10:
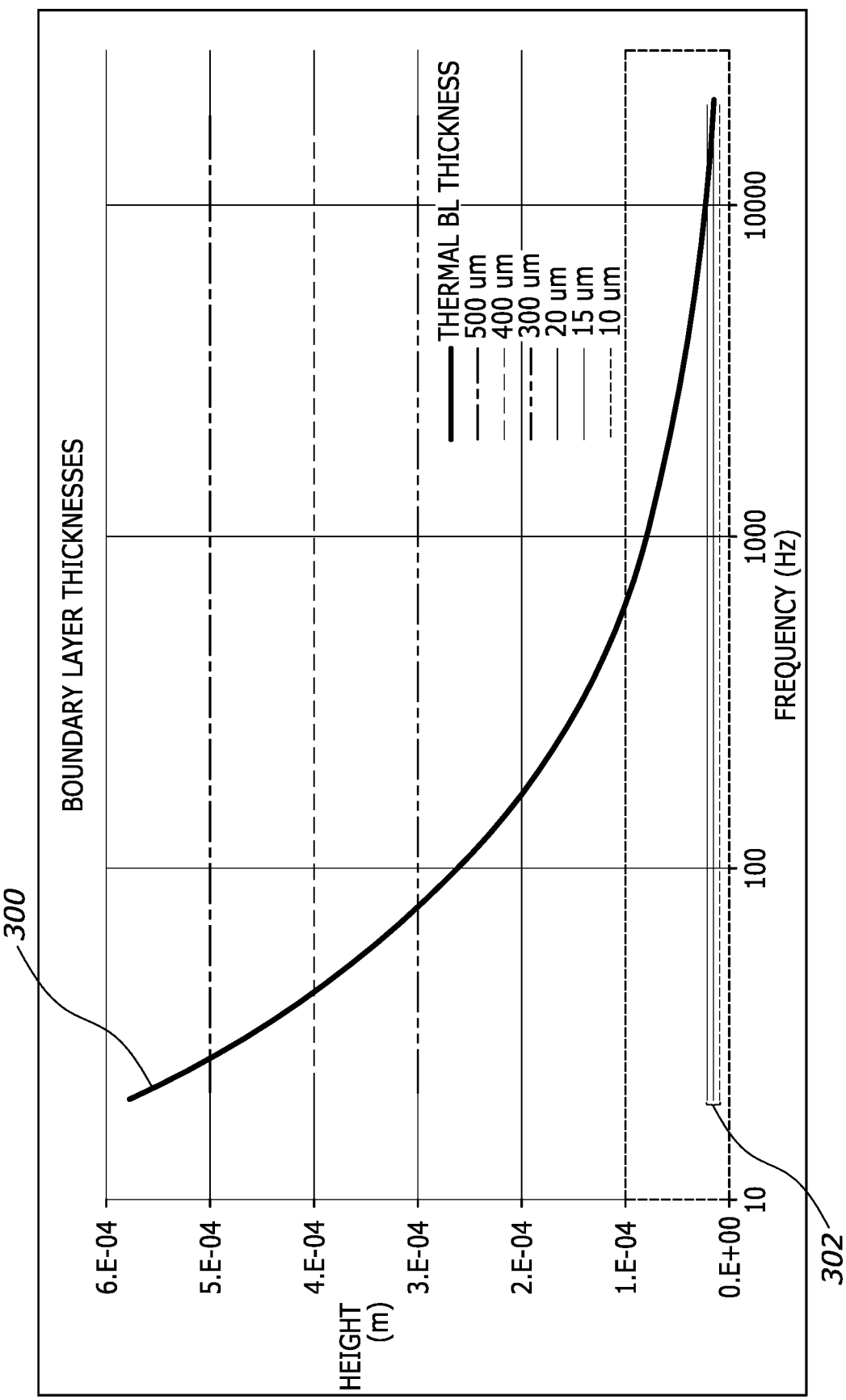
FIG. 10 is a graph showing the variation of thermal boundary layer thickness as a function of sound frequency.

FIG. 10 shows a plot of the relationship between the thermal boundary layer thickness 300 and the operating frequency of a MEMS die being used as a transducer (e.g., the MEMS transducer modeled in FIG. 9, and assuming air is provided within the volume between the counter electrode and the diaphragm). The thermal boundary layer thickness 300 is shown to decrease with increasing operating frequency. This dependency is shown graphically in FIG. 10 over a range of operating frequencies within the audio frequency band of the MEMS die (e.g., within a human audible frequency range between approximately 20 Hz to 20 kHz).

As shown in FIG. 10, when the size of the gap (e.g., the height) between the counter electrode and the diaphragm is large (e.g., when the gap is greater than 500 µm), the thermal boundary layer thickness 300 is less than the size of the gap over a majority of the audio frequency band of the MEMS die. As the gap decreases, the thermal boundary layer thickness 300 becomes equal to or greater than the size of the gap over a larger proportion of the audio frequency band. It is within this range of gap sizes that the thermal-acoustic noise contribution is greatest and the overall SNR of the MEMS die is reduced (e.g., the MEMS die being used as a transducer).

The approximate range of gap sizes that correspond with improved SNR performance (e.g., corresponding with back volumes from FIG. 9 for which the reversal in the trend of acoustic noise is observed) is identified by horizontal lines 302 toward the bottom of FIG. 10. As shown, the size of the gap (e.g., height 118 shown in FIG. 5) is less than approximately two times the boundary layer thickness 300 within the back volume 103 over a majority of the audio frequency band of the MEMS die 100 (e.g., between 20 Hz and 20 kHz). In other words, the back volume 103 is dimensioned such that the distance between any point or location within the back volume 103 and the nearest solid surface contacting the back volume 103 is less than a single thermal boundary layer thickness 300. For example, as shown in FIG. 6, a point 119 approximately half way in between the diaphragm 106 and the insulator 114 is spaced less than one thermal boundary layer thickness 300 from a back volume facing surface of both the diaphragm 106 and the insulator 114 (the solid surfaces of the back volume that are closest to point 119).

Based on this data (and data from FIG. 9), two different thermal regimes and mechanisms appear to exist depending on whether the size of the gap (e.g., the height 118) is 1) greater than two times the thermal boundary layer thickness over the majority of the audio frequency band or 2) less than two times the thermal boundary layer thickness over the majority of the audio frequency band. The fact that acoustic noise decreases at very small gap heights (less than two orders of magnitude less than most existing microphone assemblies) is an unforeseen benefit that has not been previously identified.

Figure 11:
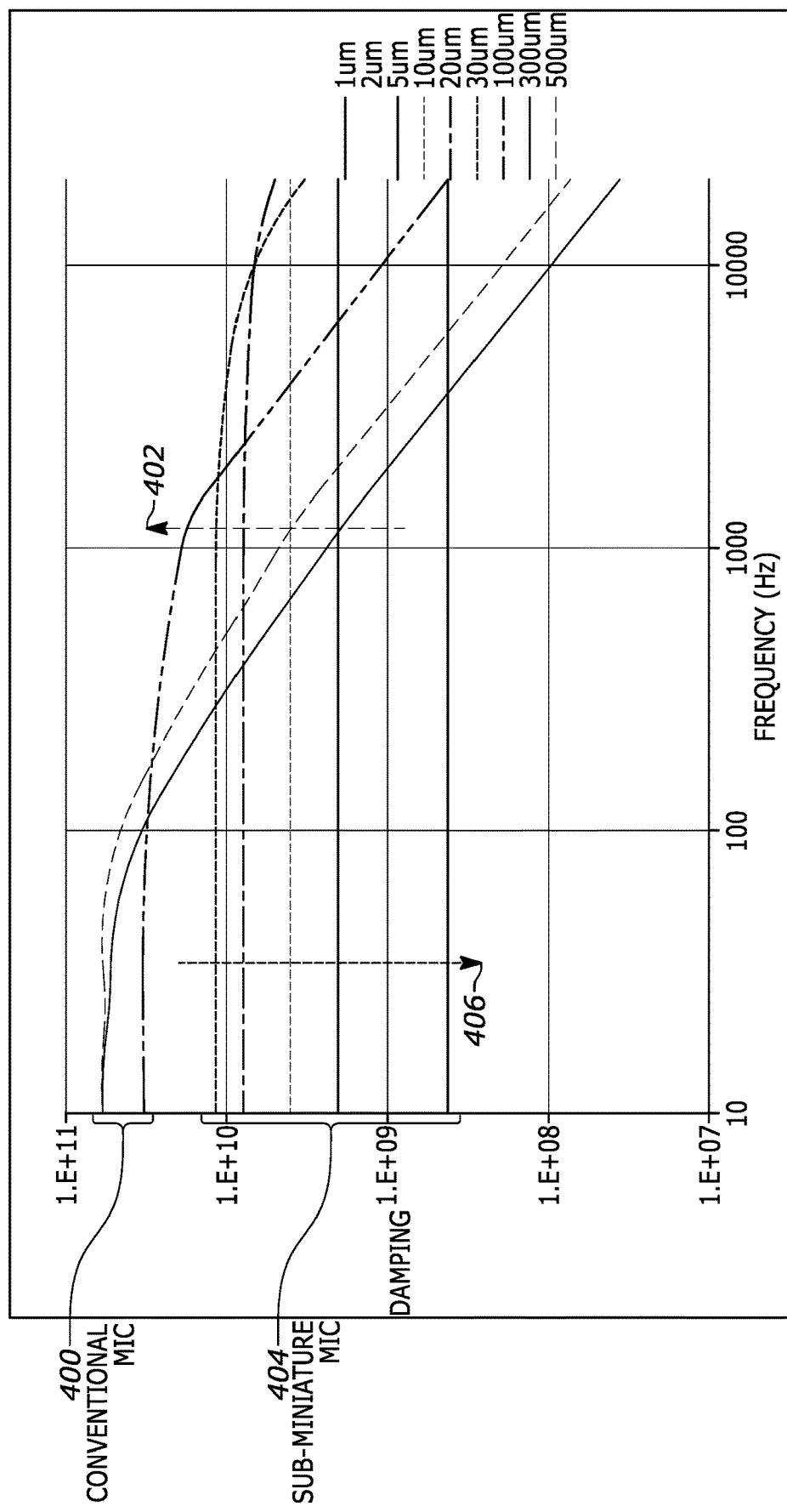
FIG. 11 is a graph showing the acoustic damping as a function of frequency of both a conventional microphone assembly and a microphone assembly configured according to an embodiment of the disclosure as a function of gap height within a MEMS die.

FIG. 11 shows the back volume damping (hereafter "damping") as a function of frequency of a MEMS die operating as a transducer within these two different thermal regimes. The upper set of curves 400 show the damping for MEMS dies having a gap size that is greater than the thermal boundary layer thickness. The direction of decreasing gap size for the curves 400 is indicated by dashed arrow 402. As shown in FIG. 11, as the size of the gap decreases, the damping (and related thermal noise) increases (e.g., the total noise over the audio frequency band of the MEMS die increases). The lower set of curves 404 show the damping response for MEMS dies where the size of the gap is less than the thermal boundary layer thickness (e.g., less than two times the thermal boundary layer thickness, similar to the MEMS die 100 of FIG. 5 and FIG. 6). The direction of decreasing gap size for the curves 404 in FIG. 11 is indicated by dashed arrow 406. The damping (and related thermal noise) is shown to decrease as the size of the gap decreases. Additionally, unlike the trend exhibited by the upper set of curves 400, the lower set of curves 404 exhibits an approximately flat damping response as a function of frequency. Such properties may be particularly advantageous for applications such as beam forming for signal processing, and other applications where the sensitivity of the MEMS die is reduced at low frequencies.

Figure 12:
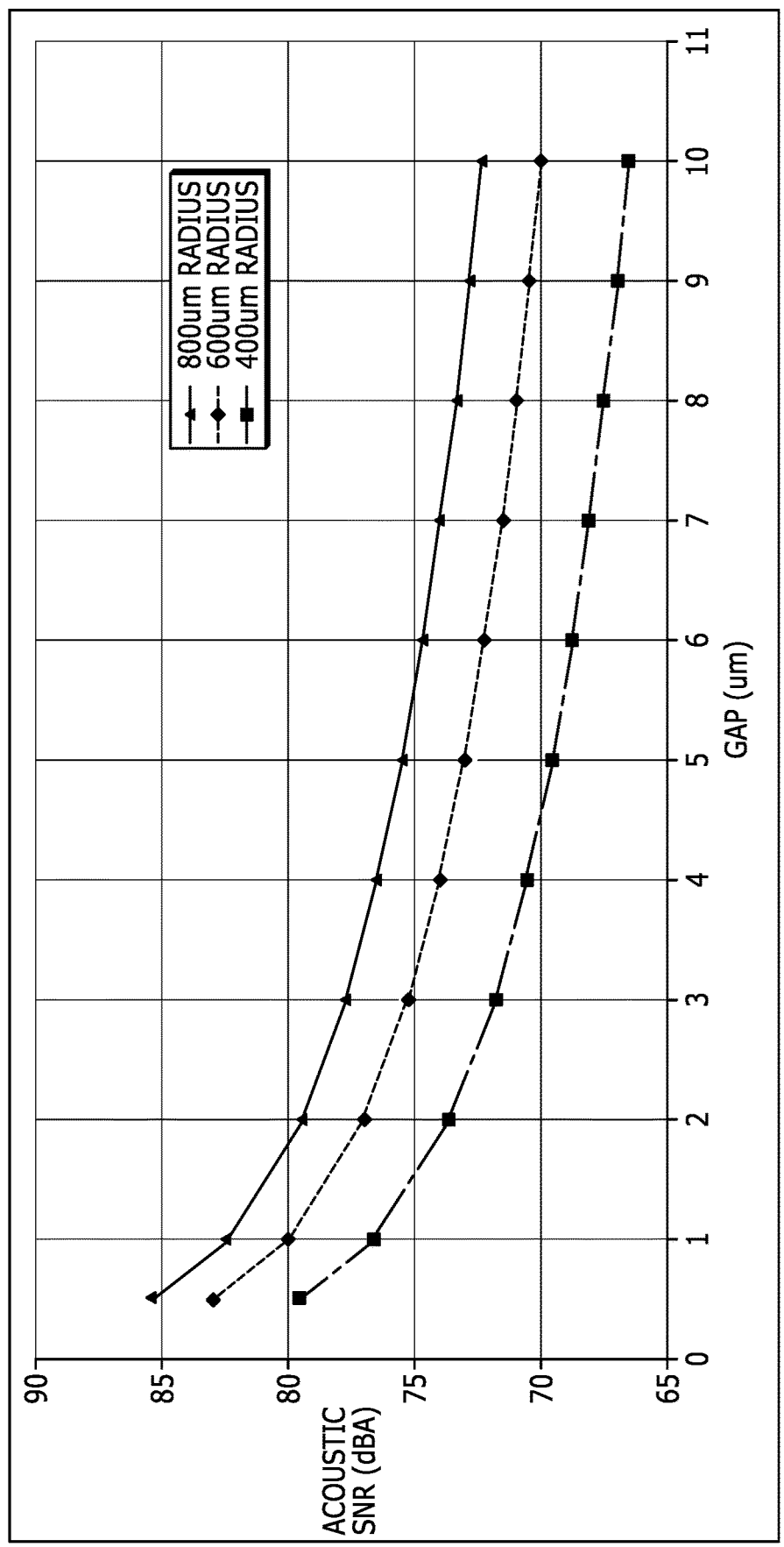
FIG. 12 is a graph of acoustic SNR as a function of gap height within a MEMS die.

FIG. 12 shows the acoustic SNR as a function of the gap size for three different values of the surface area of the diaphragm (e.g., the diameter of the diaphragm, and correspondingly, the diameter of the back volume) for a microphone assembly. Curves of acoustic SNR are provided over a range of different surface areas for the counter electrode and the diaphragm. The acoustic SNR is shown to increase with decreasing gap. The acoustic SNR is shown to decrease with decreasing surface area. Although the trend in SNR with surface area is opposite to the trend in SNR with the size of the gap (e.g., the height between the counter electrode and the diaphragm), the effect of the gap has been observed to dominate.

The results shown in FIGS. 9-12 were simulated assuming piston-like diaphragm displacement (e.g., assuming that the diaphragm does not curve or bow, and that all points along the surface of the diaphragm move by an equal amount). In reality, the diaphragm 106 (see FIG. 5) will not displace uniformly in a piston-like motion but will instead bow or curve under the bias voltage applied to the MEMS die 100 (and further as a result of sound pressure incident on the diaphragm 106). The movement of the diaphragm 106 will therefore move the air within the gap in both an axial direction (e.g., vertically up and down as shown in FIG. 5) and a radial direction (e.g., horizontally left and right as shown in FIG. 5). The radial velocity component of air within the back volume 103 will result in viscous losses, which will increase acoustic noise for the MEMS die above the values shown in FIG. 12.

Figure 13:
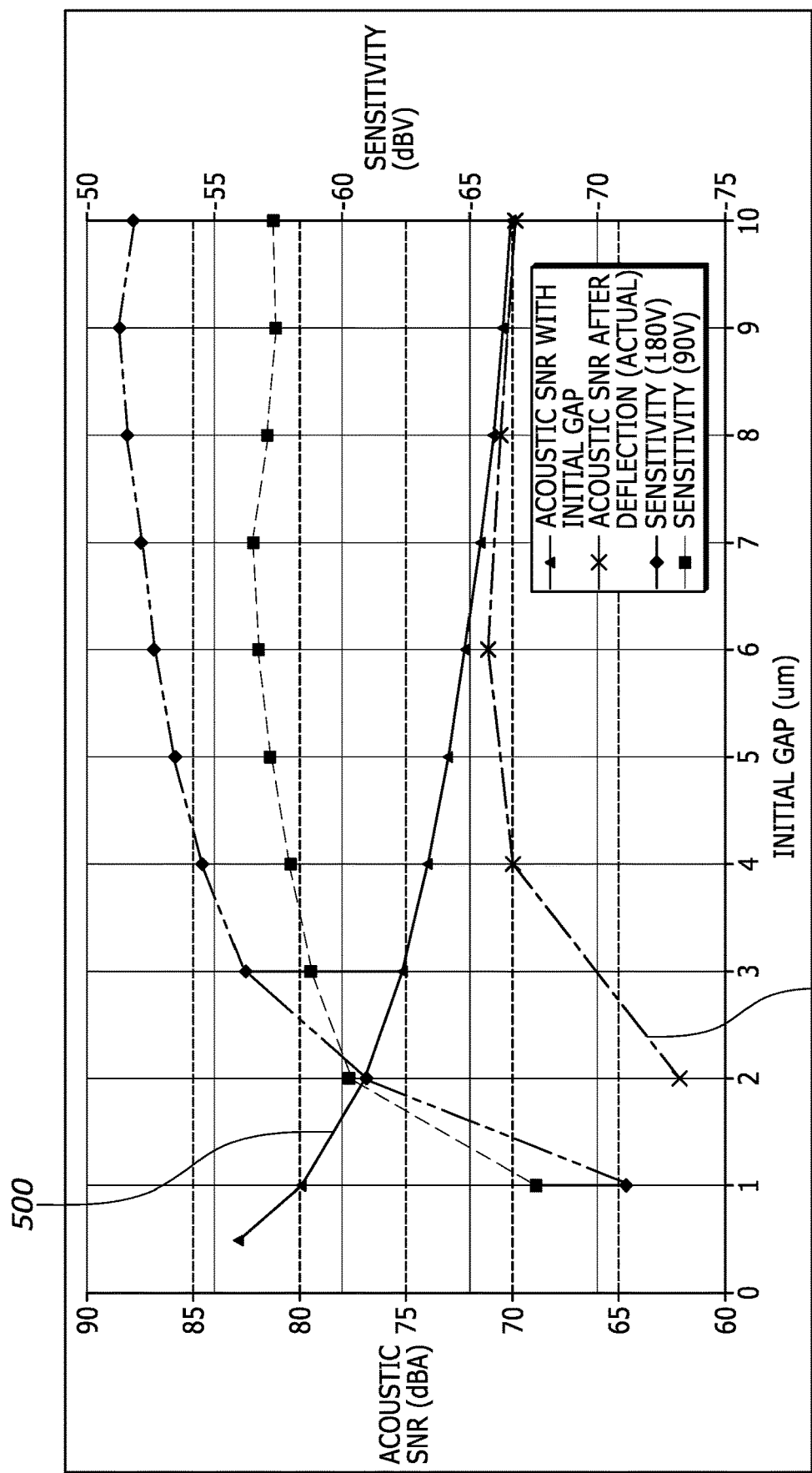
FIG. 13 is a graph of acoustic SNR and sensitivity as a function of gap height within a MEMS die.

FIG. 13 shows a plot of the acoustic SNR as a function of the size of the gap between the counter electrode and the diaphragm (the vertical spacing between the counter electrode and the diaphragm). Curve 500 shows the acoustic SNR for a MEMS die that is modeled assuming a piston-like diaphragm motion. Curve 502 shows the acoustic SNR for a MEMS die that is modeled assuming that the diaphragm bends (e.g., curves) with the application of a bias voltage to the MEMS die. As shown in FIG. 13, the effect of actual diaphragm bending and movement is most prominent at small gap sizes (e.g., below 5 μm in this case). At gap sizes between 5 μm and 11 μm, viscous effects associated with diaphragm movement are significantly reduced. One way to counteract the effects of diaphragm displacement/movement, as shown in FIG. 13, is to constrain the size of the gap to within a range between approximately 5 μm and 12 μm, or another suitable range depending on the geometry of the back volume. Alternatively, or in combination, the bias voltage applied to the MEMS die may be adjusted (e.g., increased) to increase the sensitivity of the microphone assembly to at least partially offset the effects of the additional acoustic noise resulting from viscous losses.

Figure 14:
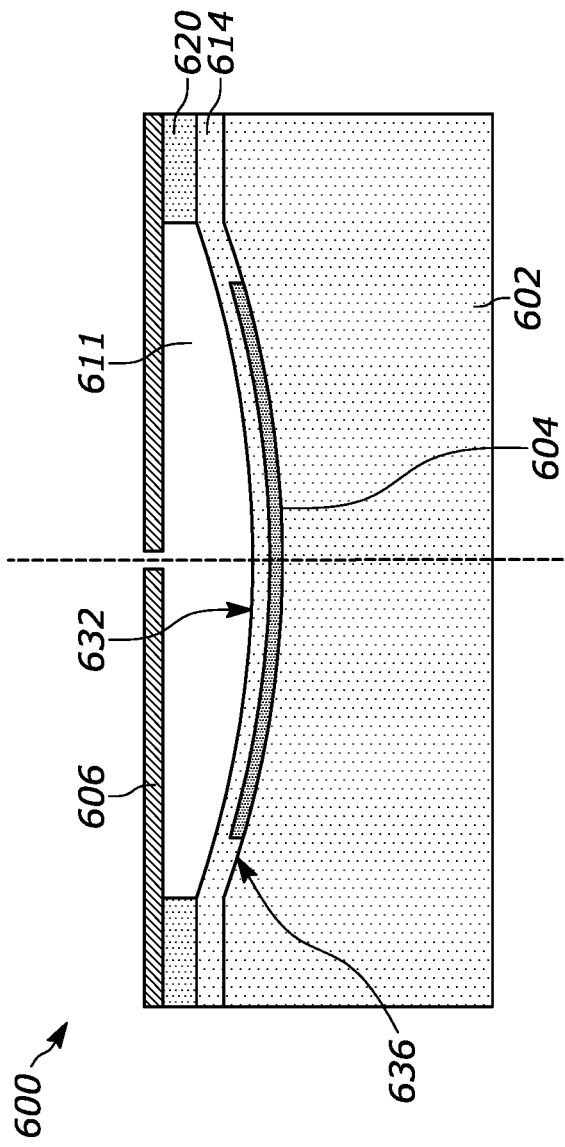
FIG. 14 is a side cross-sectional view of a MEMS die, according to another embodiment.

The geometry of the counter electrode may also be adjusted to reduce the radial velocity component of air within the back volume resulting from non-piston-like diaphragm movement. For example, FIG. 14 shows a MEMS die 600 that includes a curved electrode 604. In particular, an upper surface 632 (e.g., first surface, back volume facing surface, etc.) of the insulator 614 is shaped to approximately match the curvature of the diaphragm 606 under application of a bias voltage such that, during operation, the distance between the diaphragm 606 and the electrode 604 (which is also curved in this embodiment) is approximately equal throughout the back volume 611 (e.g., in a lateral direction, away from a central axis of the MEMS die). To achieve this, the electrode 604 and the diaphragm 606 are not parallel in a resting situation (e.g., when the bias voltage is removed). As shown in FIG. 14, the electrode 604 is deposited or otherwise formed onto a recessed portion 636 of a substrate 602 of the MEMS die 600. The curvature of the electrode 604 is a function of the bias voltage applied to the MEMS die 600, the dimensions of the back volume 611, and the thickness of the diaphragm 606.

Returning to FIG. 6, the MEMS die 100 is shown to include an opening or pierce 138 that extends through the diaphragm 106 (e.g., from the first side 132 of the diaphragm 106 to the second side 134 of the diaphragm 106). The pierce 138 is disposed at a central position on the diaphragm 106 in coaxial arrangement relative to the central axis 128 of the MEMS die 100. The pierce 138 is a circular through-hole in the diaphragm 106. In other embodiments, the size, shape, location, and or number of openings in the diaphragm 106 may be different.

Figure 15:
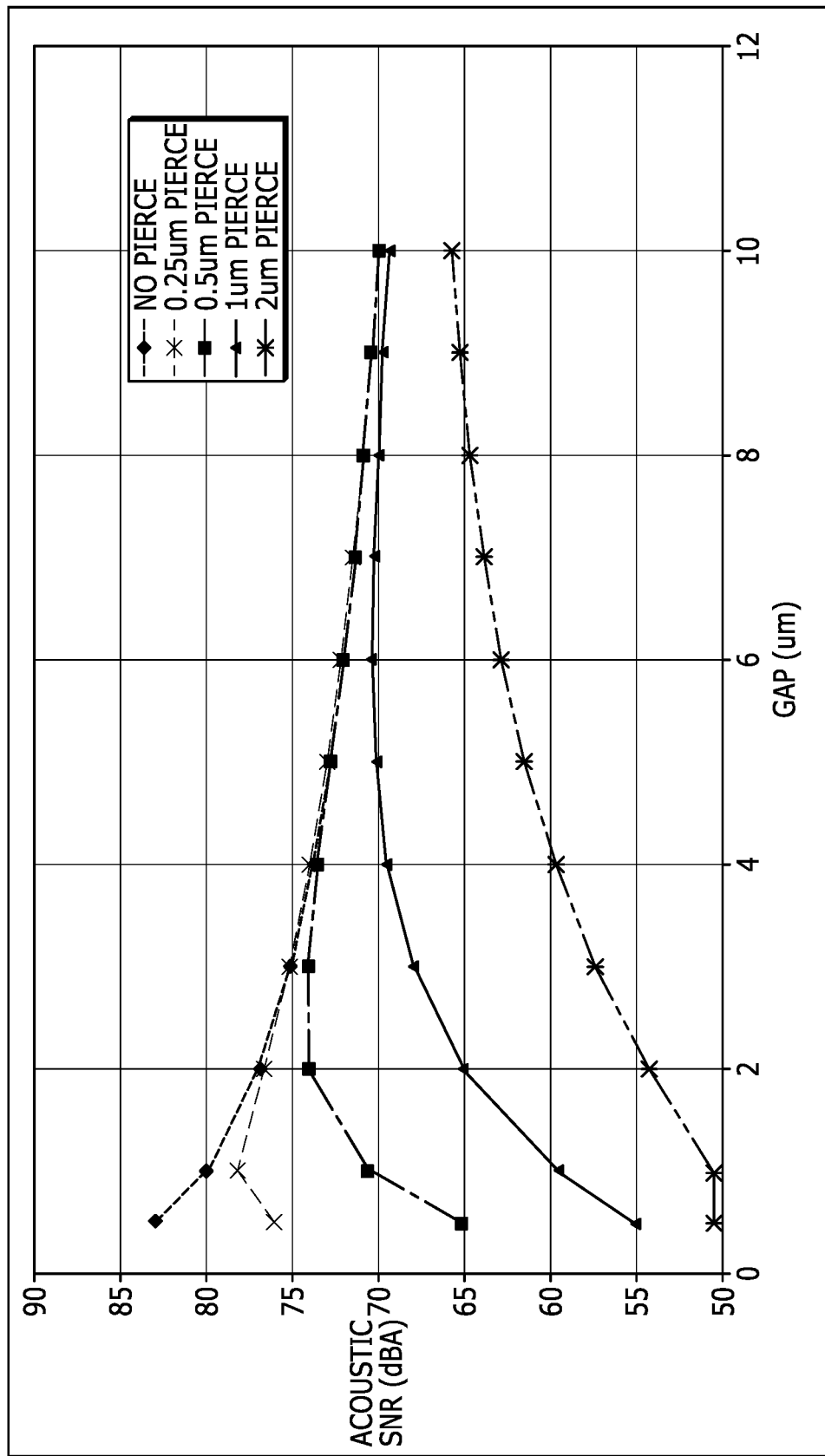
FIG. 15 is a graph of acoustic SNR as a function of gap height within a MEMS die configured according to an embodiment over a range of different diaphragm pierce diameters for the MEMS die.

FIG. 15 shows the acoustic SNR of a MEMS die (configured like the MEMS die 100) as a function of the size of the gap for a range of different diameters for the pierce (e.g., the pierce 138). As shown in FIG. 15, the pierce introduces acoustic noise into the MEMS die 100 (see also FIG. 5), particularly at small gap sizes (e.g., below 5 μm). The rate of change (e.g., increase) of the acoustic noise also increases with the diameter of the pierce. In the MEMS die 100 of FIG. 5, the diameter 140 of the pierce 138 is within a range between approximately 0.25 μm and 2 μm to minimize the effects of the pierce 138 on the overall acoustic SNR. It should be appreciated that the optimal range of pierce 138 diameters will vary depending on the thickness of the diaphragm 106 and the geometry of the back volume 103.

Figure 16:
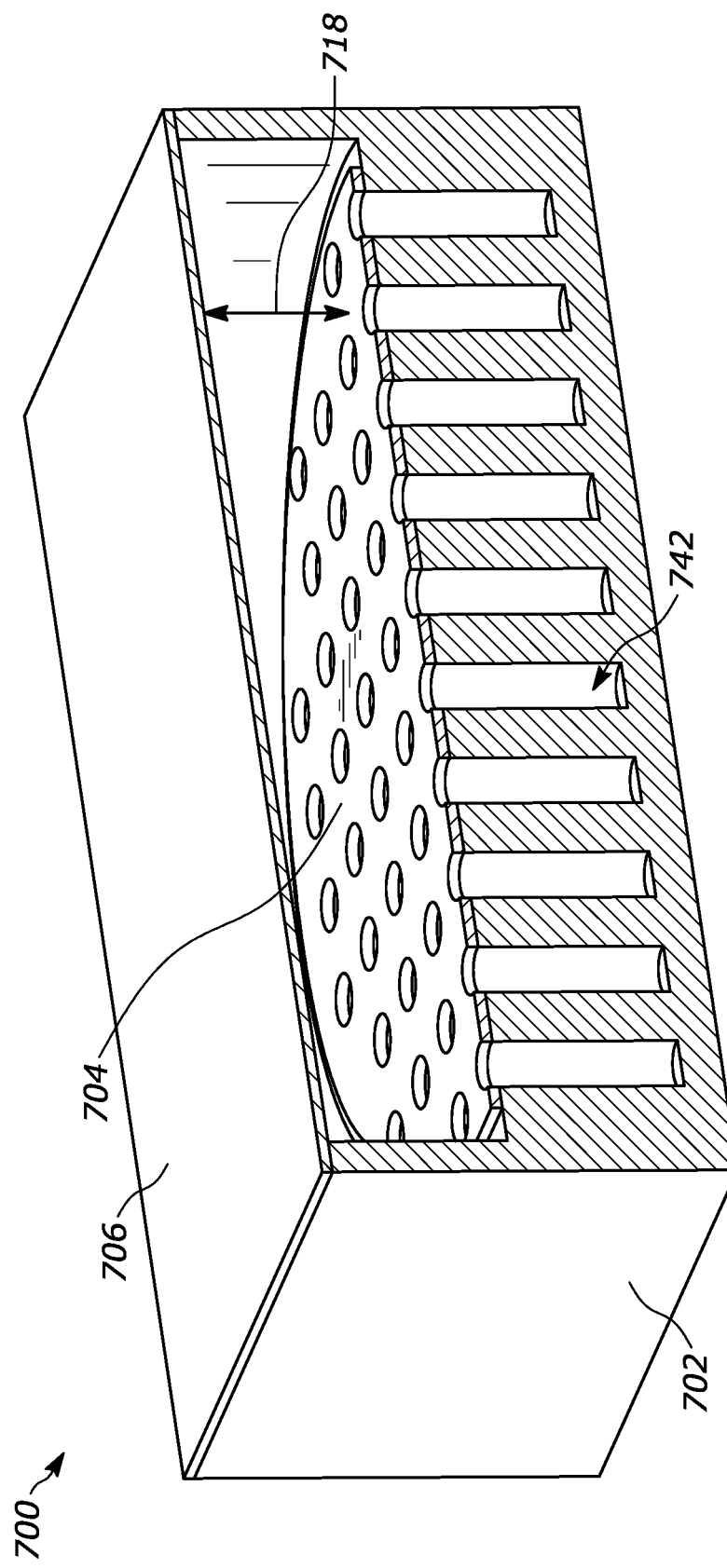
FIG. 16 is a perspective and sectional view of a MEMS die, according to another embodiment.
Figure 17:
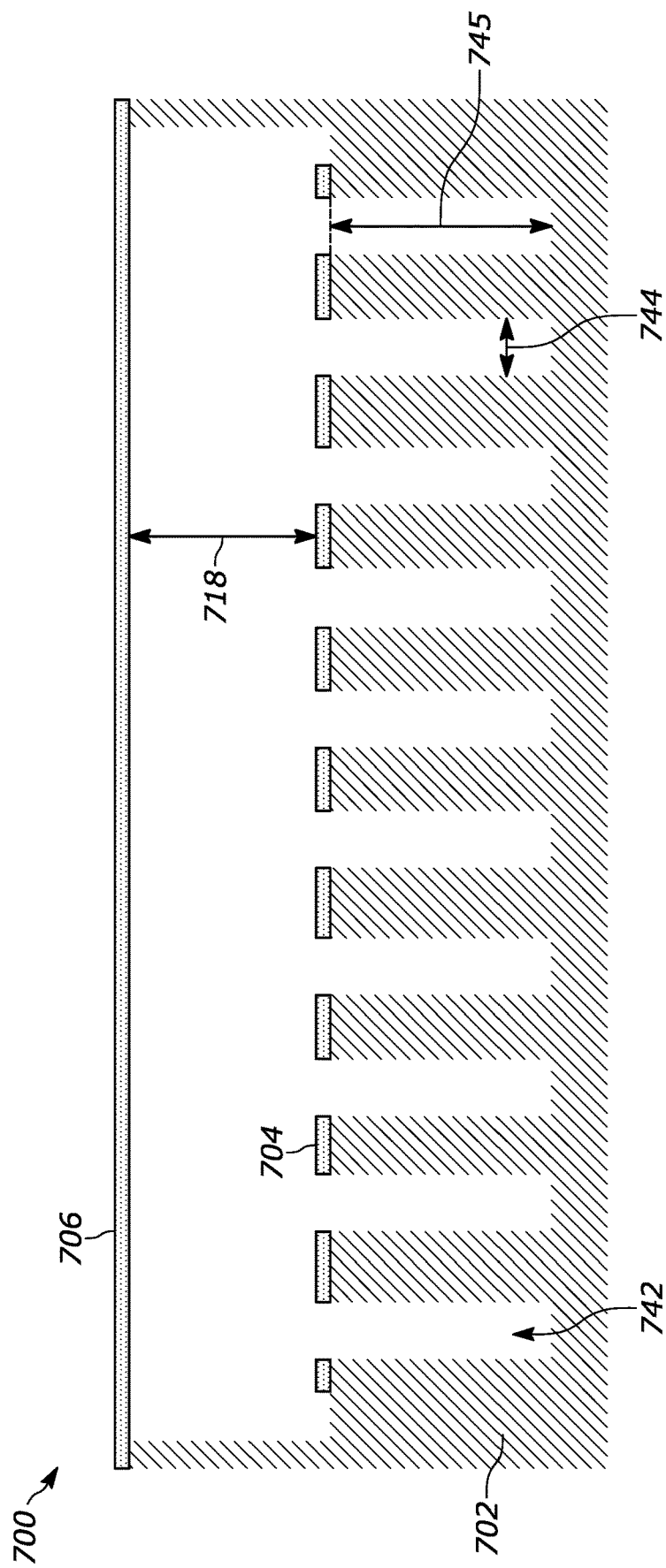
FIG. 17 is a side cross-sectional view of the MEMS die of FIG. 16.

The sensitivity of the MEMS die 100 may also be improved by increasing the compliance of air in the back volume 103 (e.g., by reducing the stiffness of the air contained within the back volume). In an embodiment, this is accomplished by providing channels in the MEMS substrate, such that every point within the channels is no further away from a solid surface than the thickness of a single thermal boundary layer. Turning to FIG. 16 and FIG. 17, a MEMS die 700 configured accordingly is shown. The MEMS die 700 includes an electrode 704 and a substrate 702 that includes a plurality of channels 742 formed into the electrode 704 and substrate 702. More specifically, the MEMS die 700 is structured with the channels 742 formed with dimensions such that any point within the channels 742 is less than a single thermal boundary layer thickness from a nearest boundary surface. In the embodiment of FIG. 16, each one of the plurality of channels 742 extends away from the diaphragm 706 in a substantially perpendicular orientation relative to the diaphragm 706 (e.g., parallel to a central axis of the MEMS die 700). The channels 742 extend through the electrode 704. Among other benefits, the channels 742 increase the overall compliance of air within the MEMS die 700 (e.g., by adding air volume away from the space between the electrode 704 and the diaphragm 706) without fully penetrating through the substrate 702.

The channels 742 in the substrate 702 are sized to reduce thermal-acoustic noise within the MEMS die 700. Specifically, a width 744 (e.g., diameter) of each one of the plurality of channels 742 is less than two times the thermal boundary layer thickness within the back volume over a majority of an audio frequency band of the MEMS die 700, such that the distance between any point or location within the back volume is within a single thermal boundary layer thickness from a nearest solid surface of the substrate or the diaphragm over a majority of the audio frequency band. The depth 745 of each of the channels 742 is approximately equal to the size of the gap, shown as height 718 (e.g., the distance between the electrode 704 and the diaphragm 706). It will be appreciated that the geometry of the channels 742 may be different in various embodiments. For instance, in other embodiments the depth 745 may be different from the size of the gap.

Figure 18:
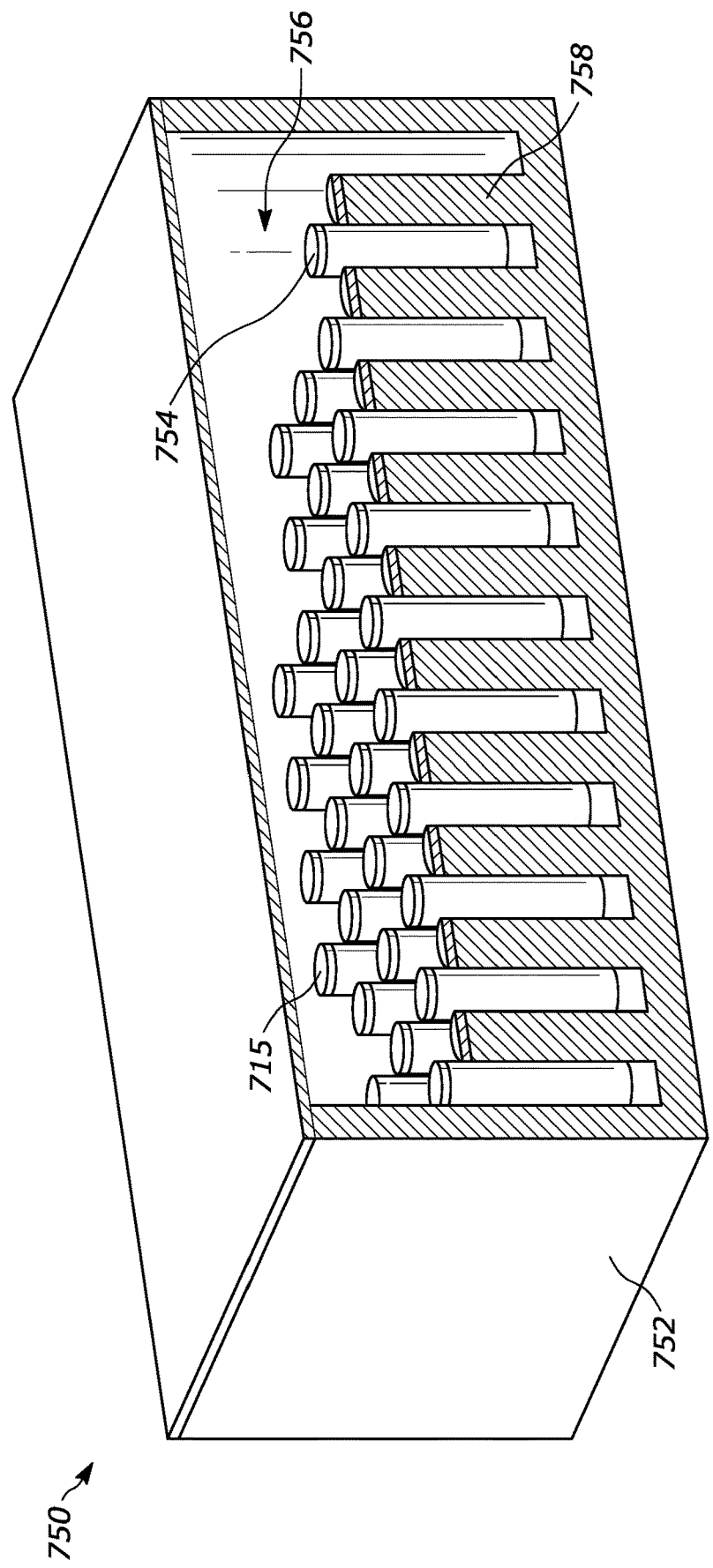
FIG. 18 is a perspective and sectional view of a MEMS die, according to another embodiment.

In an embodiment, channels in a MEMS substrate may be defined by pillars. An example of such a MEMS die is shown in FIG. 18. The MEMS die, generally labelled 750, includes an electrode 754 and a substrate 752 forming a cavity 756 (e.g., back volume) in which a plurality of pillars 758 are disposed. The pillars 758 are cylinders that extend upwardly from a lower surface of the cavity 756 in a substantially perpendicular orientation relative to the lower surface (the pillars 758 extend toward the diaphragm 706). In other embodiments, the shape of the pillars 758 may be different. The pillars 758 may be formed into a substrate 752 for the MEMS die 750. A conductive layer 715 is deposited onto or otherwise connected to an upper surface of each one of the pillars 758. Together, the conductive layers 715 form a single electrode. A lateral distance between adjacent pillars 758 (e.g., a radial distance relative to a central axis of each of the pillars 758) is less than two times the thermal boundary layer thickness over a majority of an audio frequency band of the MEMS die 750. In other embodiments, the geometry of the channels (FIG. 16 and FIG. 17) and pillars (FIG. 18) may be different. In some embodiments, a porous silicon substrate may be used in lieu of channels or pillars. Among other benefits, using a porous silicon substrate increases the effective compliance of the air within the back volume, without requiring additional manufacturing operations to form channels, pillars, or other geometry into the substrate.

Figure 19:
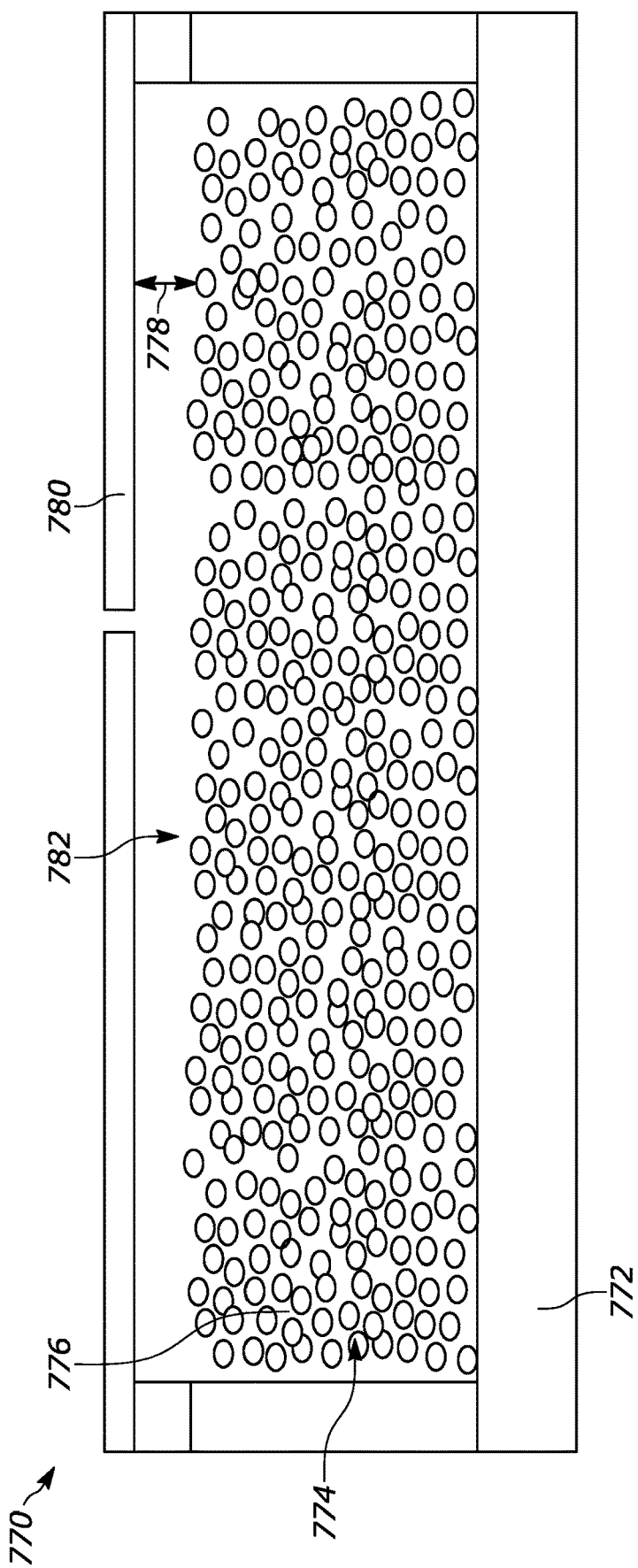
FIG. 19 is a side cross-sectional view of a MEMS die, according to another embodiment.

Turning to FIG. 19, an example of a MEMS die that uses porous silicon in accordance with an embodiment will now be described. The MEMS die, generally labeled 770, includes a substrate 772. Being formed of silicon, the substrate 772 can be doped to make it conductive so that the surface of a porous region 774 is effectively the counter electrode for a capacitive transducer. The size of the pores 776 is much less than a single thermal boundary layer thickness and yet allows air flow in all directions. The percentage of open volume in the porous region 774 can be controlled by well-known electrochemical processes and can be made fairly large. The gap size, shown as height 778, between the upper surface of the porous region 774 (e.g., the counter electrode) and the diaphragm 780 still must be less than two thermal boundary layer thicknesses, but in this embodiment the gap size does not dominate the size of the back volume 782 and thus the sensitivity of the MEMS die 770. Alternatively, a sintered material could be used instead of porous silicon with characteristic pore sizes as described above.

Figure 20:
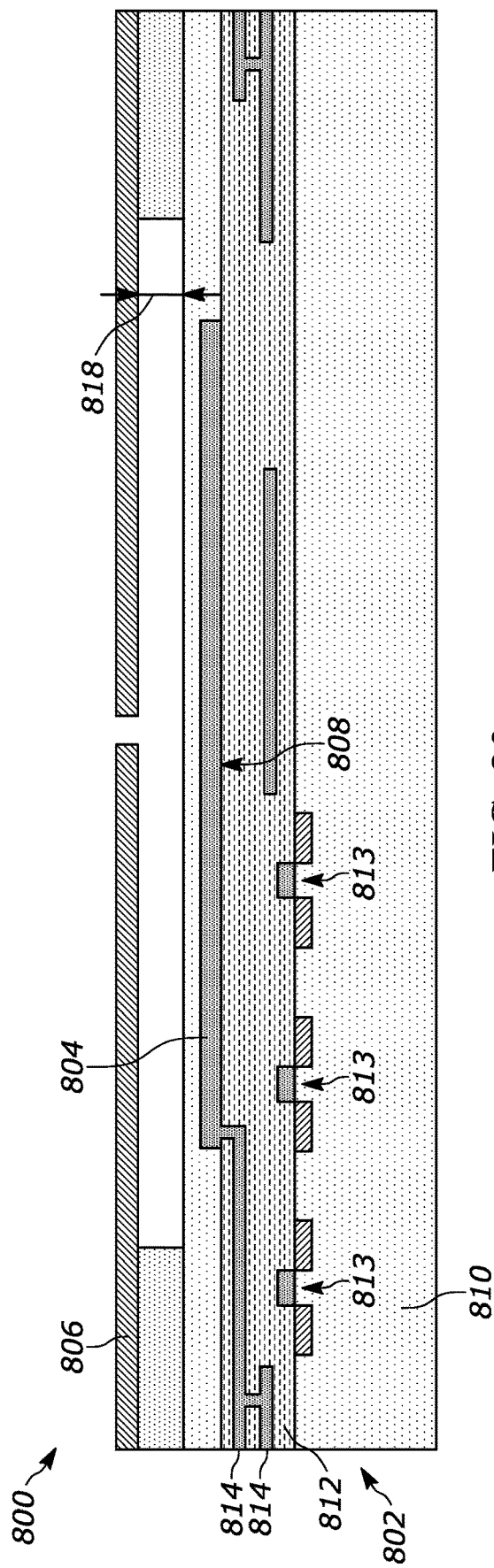
FIG. 20 is a side cross-sectional view of a MEMS die that is integrally formed onto an integrated circuit, according to an embodiment.

Among other benefits, a reduction in the required back volume of a MEMS die as set forth in the above-discussed embodiments allows the overall footprint (e.g., package size, etc.) of a microphone assembly that uses the MEMS die to be substantially reduced. Moreover, because the counter electrode is a solid, unperforated structure, the MEMS die may be integrated with other components of the microphone assembly to further reduce the package size of the microphone assembly. For example, FIG. 20 shows monolithic integration of a MEMS die 800 with an integrated circuit (IC) 802. The IC 802 may be an application specific integrated circuit (ASIC). Alternatively, the IC 802 may include another type of semiconductor die integrating various analog, analog-to-digital, and/or digital circuits. As shown in FIG. 20, the IC 802 forms a substrate for the MEMS die 800. The MEMS die 800 is integrally formed on the IC 802 as a single unitary structure. An electrode 804 of the MEMS die 800 is directly coupled to IC 802 along an entire lower surface 808 of the electrode 804.

According to an embodiment, the geometry of the electrode 804 may be the same or similar to the geometry of the electrode 104 described with reference to FIG. 5. As shown in FIG. 20, the electrode 804 is directly coupled to the IC 802 (e.g., formed onto an upper surface of the IC 802). The IC 802 includes a substrate 810 and an upper portion 812 coupled to a first surface (e.g., an upper surface, etc.) of the substrate 810. The IC 802 additionally includes a plurality of transistors 813 embedded in the upper surface of the substrate 810, between the substrate 810 and the upper portion 812. The upper portion 812 is structured to electrically couple (e.g., connect, etc.) the electrode 804 to the IC 802 and/or to other parts of the microphone assembly (not shown). In particular, the upper portion 812 includes a plurality of metal layers 814 embedded within the upper portion 812. The metal layers 814 electrically connect the electrode 804 to a contact disposed at an outer surface of the upper portion 812 (e.g., to an outer surface of the combined MEMS die 800 and IC 802).

Figure 21:
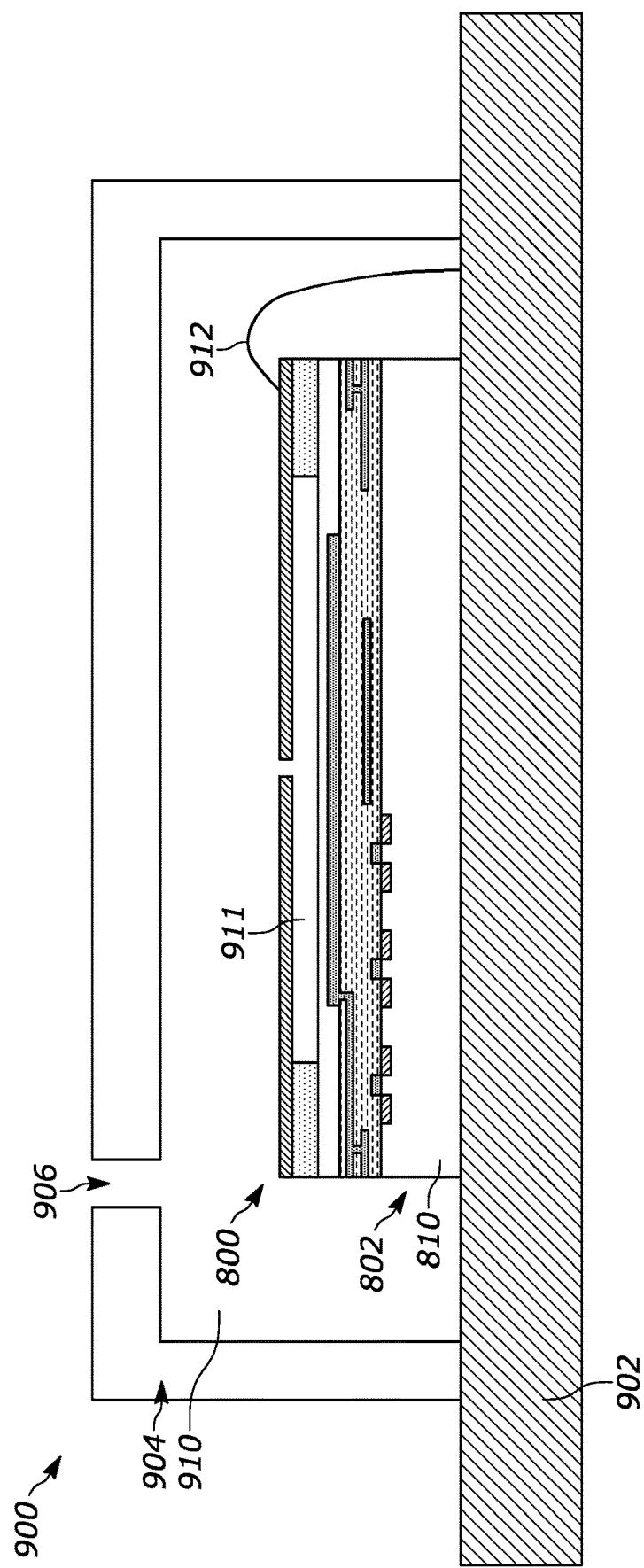
FIG. 21 is a side cross-sectional view of a microphone assembly, according to an embodiment.

According to an embodiment, as shown in FIG. 21, the combination of the MEMS die 800 and the IC 802 die is configured to fit within a microphone assembly, shown as assembly 900. As shown in FIG. 21, the assembly 900 includes a housing including a base 902, a cover 904 (e.g., a housing lid), and a sound port 906. In some embodiments, the base 902 is a printed circuit board. The cover 904 is coupled to the base 902 (e.g., the cover 904 may be mounted onto a peripheral edge of the base 902). Together, the cover 904 and the base 902 form an enclosed volume for the assembly 900 (e.g., a front volume 910 of the MEMS die 800). As shown in FIG. 21, the sound port 906 is disposed on the cover 904 and is structured to convey sound waves to the MEMS die 800 located within the enclosed volume. Alternatively, the sound port 906 may be disposed on the base 902. The sound waves (e.g., sound pressure, etc.) move the diaphragm 806 of the MEMS die 800, which changes the size of the gap (e.g., the height 818) between the diaphragm 806 and the electrode 804. The volume between the electrode 804 and the diaphragm 806 forms an entire back volume 911 for the MEMS die 800, which, advantageously, reduces the overall footprint of the microphone assembly 900, without limiting the acoustic SNR that can be achieved.

As shown in FIG. 21, the substrate 810 is coupled to a first surface of the base 902 within the enclosed volume 908. In some embodiments, the assembly may form part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

In the embodiment of FIG. 21, the MEMS die 800 is configured to generate an electrical signal (e.g., a voltage) at an output in response to acoustic activity incident on the sound port 906. As shown in FIG. 21, the output includes a pad or terminal of the MEMS die 800 that is electrically connected to the electrical circuit via one or more bonding wires 912. The assembly 900 may further include electrical contacts disposed on a surface of the base 902 outside of the cover 904. The contacts may be electrically coupled to the electrical circuit (e.g. via bonding wires or electrical traces embedded within the base 902) and may be configured to electrically connect the microphone assembly 900 to one of a variety of host devices.

Figure 22:
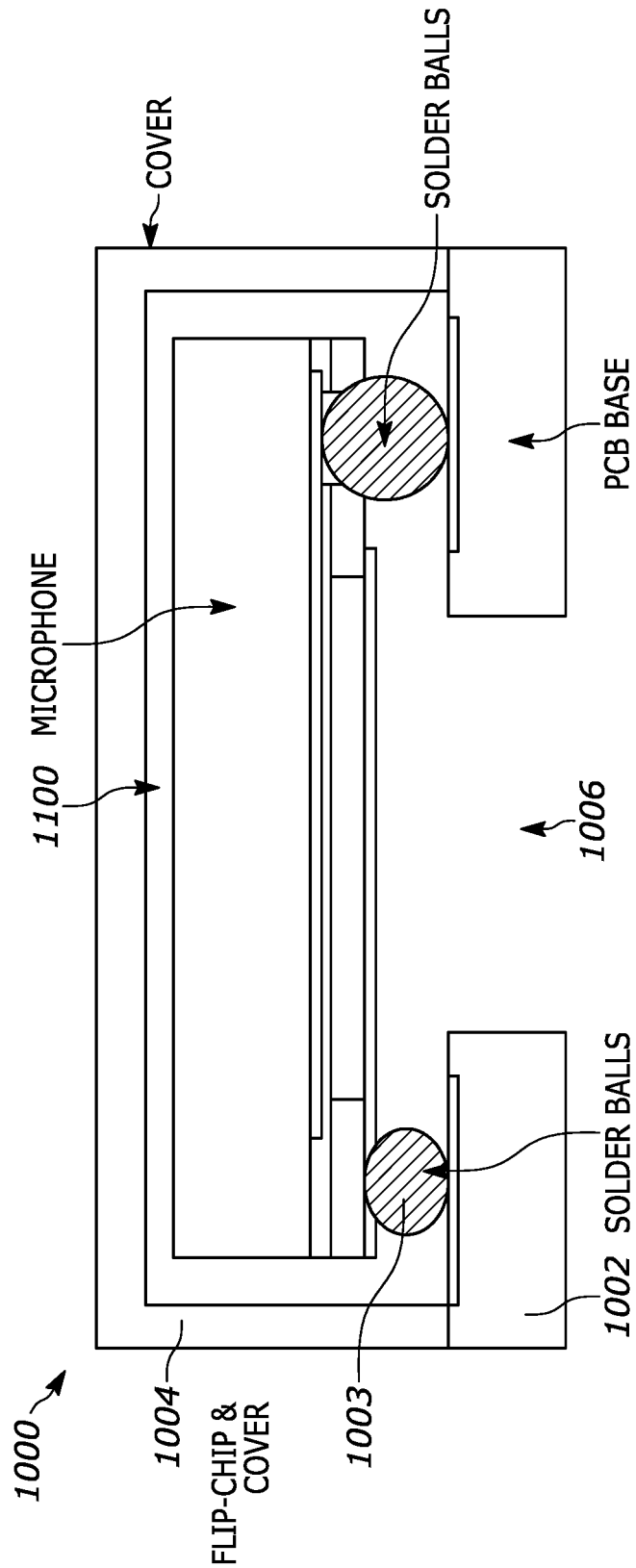
FIG. 22 is a side cross-sectional view of a microphone assembly, according to another embodiment.

The arrangement of components for the microphone assembly embodiment of FIG. 21 should not be considered limiting. Many alternatives are possible without departing from the inventive concepts disclosed herein. For example, FIG. 22 shows another embodiment of a microphone assembly 1000 that includes a MEMS die 1100 that is flip-chip bonded to a base 1002 of the microphone assembly 1000. The MEMS die 1100 is separated from the base 1002 (and electrically connected to the base 1002) by balls of solder 1003. The MEMS die 1100 is arranged to receive sound energy through a sound port 1006 disposed centrally within the base 1002. The MEMS die 1100 is suspended within a cavity formed between the base 1002 and a cover 1004 of the microphone assembly 1000.

Figure 23:
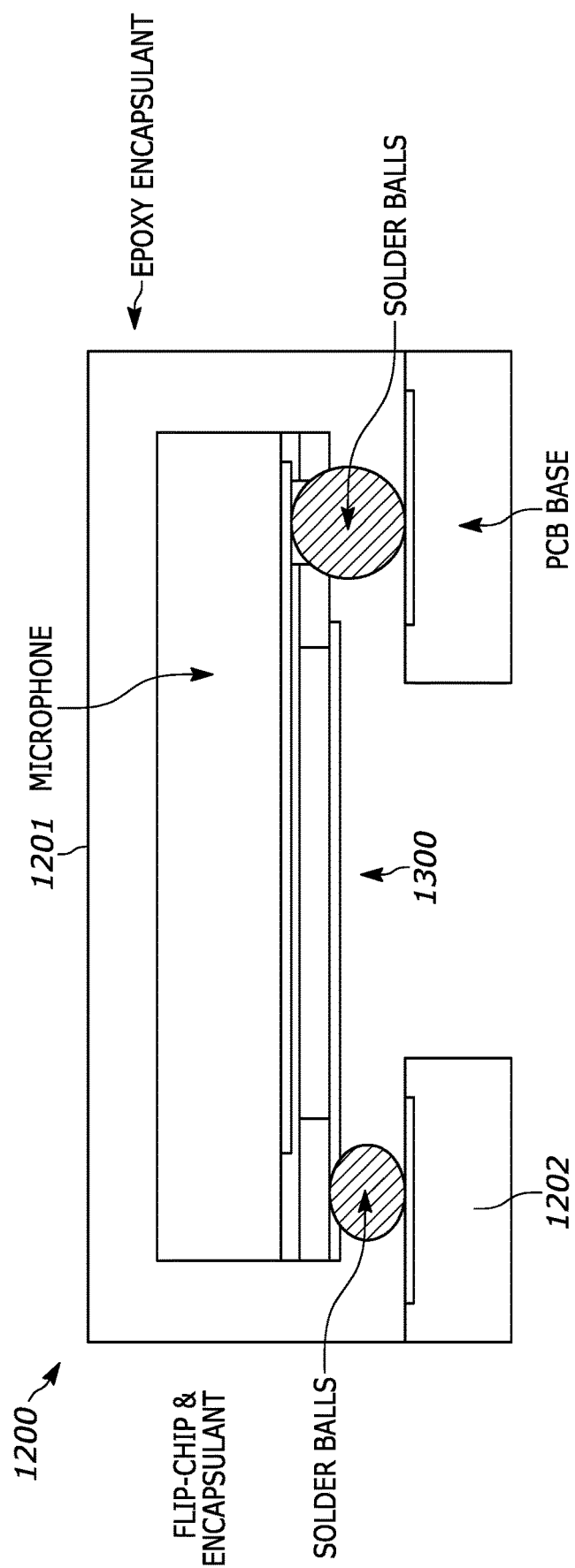
FIG. 23 is a side cross-sectional view of a microphone assembly, according to another embodiment.

FIG. 23 shows another embodiment of a microphone assembly 1200 that is similar to the microphone assembly 1000 of FIG. 22, but where the cover has been replaced by an encapsulant 1201 that surrounds the MEMS die 1300. Among other benefits, the encapsulant 1201 insulates the MEMS die 1300 and helps to support the MEMS die 1300 in position above the base 1202 of the microphone assembly 1200. The encapsulant may include a curable epoxy or any other suitable material.

One potential problem with using a diaphragm in a capacitive MEMS sensor is that the dynamic movement of the diaphragm itself results in a lateral velocity gradient and viscosity-induced losses. Any initial diaphragm deflection due to, for example, applied bias voltage accentuates the viscous losses. According to an embodiment of the disclosure, a capacitive MEMS sensor uses a piston (e.g., a rigid piece of silicon) in place of a diaphragm. In an embodiment, the piston is supported by a resilient structure (e.g., a soft rubber seal, a gasket (made, for example, of PDMS), or a bellowed wall).

In an embodiment, the resilient structure provides a seal that prevents the lateral movement of air, which reduces noise.

According to an embodiment, the MEMS die includes a vent that allows pressure in the back volume to equalize with the ambient pressure (but only at non-acoustic frequencies—it is sealed at acoustic frequencies).

Figure 24A:
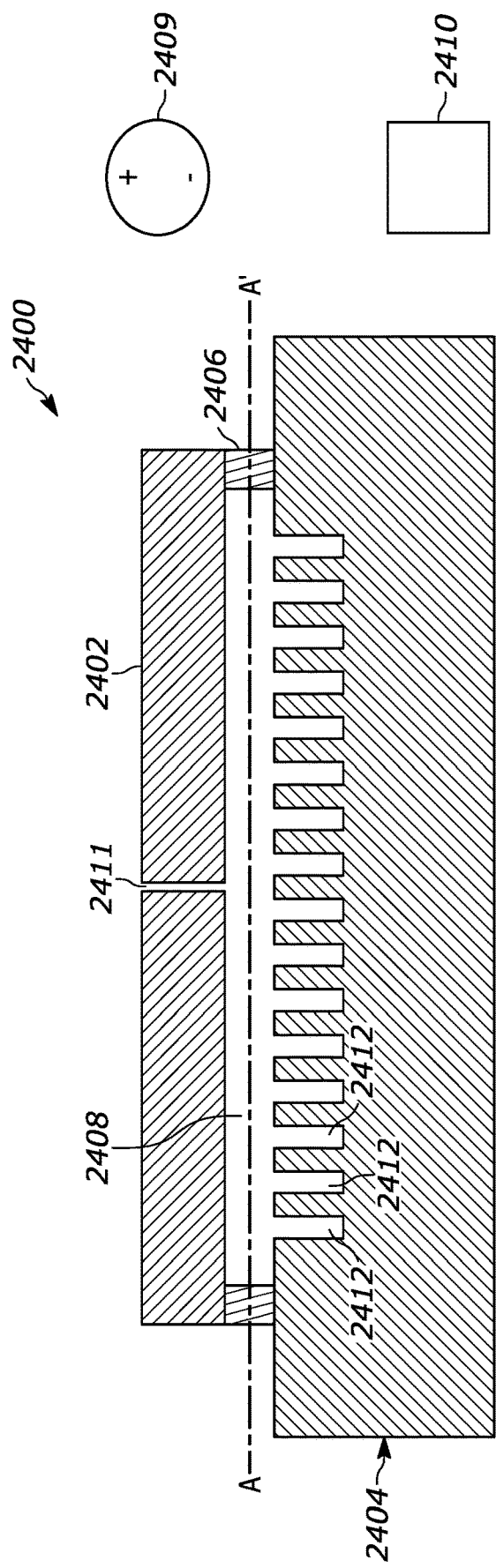
FIG. 24A is a side cross-sectional view of a MEMS die having a movable piston, according to an embodiment.

Turning to FIG. 24A, a MEMS die that uses a piston instead of a diaphragm according to an embodiment will now be described. The MEMS die 2400 includes a piston 2402 that is rigid (e.g., made of relatively thick silicon) and conductive (e.g., made of a conductive material such as a metal or a doped semiconductor (such as crystalline silicon)), an electrode 2404 facing the piston 2402, and a resilient structure 2406 that supports the piston 2402 on the electrode 2404. A back volume 2408 is bounded on top by the piston 2402, bounded on the bottom by the electrode 2404, and bounded on all sides by the resilient structure 2406. Together, the piston 2402, electrode 2404, and the resilient structure 2406 enclose a back volume 2408. In some embodiments, the electrode 2404 is part of a substrate that also includes insulative material that supports the electrode 2404. The resilient structure 2406 prevents air or other gas from leaving the back volume 2408 (e.g., blocks the air or other gas from travelling in direction radially outward from a central portion of the back volume 2408). Put another way, the resilient structure 2406 seals the back volume 2408 to prevent lateral velocity gradients in the captured air volume. Possible implementations of the resilient structure 2406 include a gasket made of polydimethylsiloxane (PDMS) or rubber. Another possible implementation of the resilient structure 2406 is a pleated wall (made of, for example, PDMS, rubber, or made of more rigid materials such as silicon, silicon nitride, or aluminum). An example of a suitable structure having a pleated wall is a flexible bellow seal. Yet another possible implementation of the resilient structure 2406 is a thin diaphragm at the perimeter.

According to an embodiment, the piston 2402 has a vent 2411 that allows pressure between the back volume 2408 and the area external to the MEMS die 2400 to be equalized when the piston 2402 is at rest or is moving up and down relative to the electrode 2404 at non-acoustic frequencies. The vent 2411 is a hole that is configured to permit pressure equalization between the back volume and a region (e.g., a volume) external to the MEMS die at frequencies below the audio band. For example, the vent 2411 may have a geometry and dimensions that result in an impedance that the vent 2411 has no impact on the flow of air at non-audio frequencies but which blocks flow of air at acoustic frequencies. The vent 2411 need not be located in the piston 2402, but may be anywhere (e.g., in the resilient structure 2406) to facilitate pressure equalization.

In the embodiment depicted in FIG. 24A, the piston 2402 and the electrode 2404 form a capacitive element, with the piston 2402 serving as a first electrode of the capacitive element, the electrode 2404 serving as a second electrode of the capacitive element, and the air or other gas in the back volume 2408 acting as a dielectric. During operation, the piston 2402 and the resilient structure 2406 behave like a classic spring-mass system. The capacitance between the piston 2402 and the electrode 2404 changes as the distance between them changes (i.e., as distance increases or decreases). The resilient structure 2406 resists the movement of the piston 2402 towards the electrode (e.g., in response to incoming pressure waves, such as those produced by sound). In particular, as the piston 2402 moves towards the electrode 2404, the resilient structure 2406 compresses, builds up potential energy, and (when the external force pushing the piston 2402 decreases sufficiently) pushes the piston 2402 away from electrode 2404. Further MEMS die embodiments with a piston-spring structure will be described with respect to FIG. 24B, FIG. 25A, FIG. 25C, FIG. 25D, FIG. 26A, FIG. 26D, FIG. 26E, and FIG. 26F. It is to be understood, however, that the principles and variations described in conjunction with FIG. 24A (including the inclusion of a vent) may also be applied to these further MEMS die embodiments.

In an embodiment, when the MEMS die 2400 is integrated into a microphone, the piston 2402 is electrically connected to a bias voltage source 2409 and the electrode 2404 is electrically connected to an integrated circuit 2410 (e.g., to an amplifier input thereof). Alternatively, the piston 2402 may be electrically connected to the integrated circuit 2410 and the electrode 2404 may be electrically connected to the bias voltage source 2409.

Figure 24B:
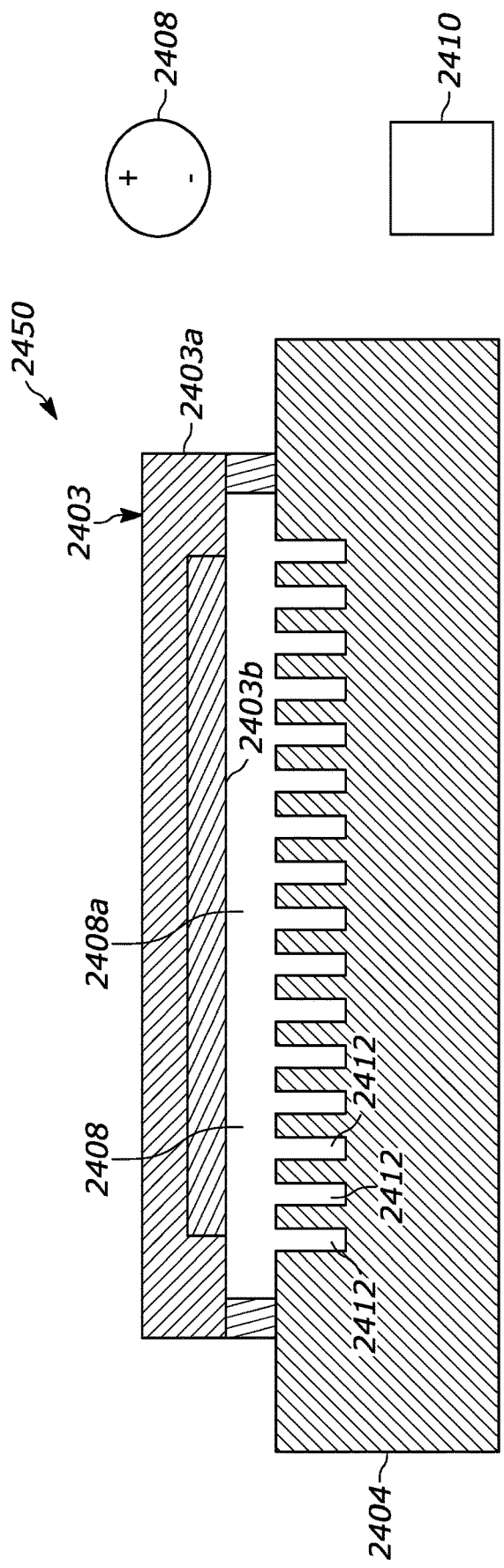
FIG. 24B is a side cross-sectional view of a MEMS die that is a variation of the MEMS die of FIG. 24A.

Referring to FIG. 24B, a variant of the MEMS die 2400 configured according to an embodiment is shown. The MEMS die 2450 includes a piston 2403 that has an insulative portion 2403a and an electrode 2403b. In this embodiment, it is the electrode 2403b that functions as the first electrode in the capacitive element (with the electrode 2404 acting as the second electrode).

In an embodiment, channels 2412 are formed into the electrode 2404 of FIG. 24A and FIG. 24B. In an embodiment, the dimensions of the channels 2412 are such that any point within the channels 2412 is less than a single thermal boundary layer thickness from a nearest surface. Each of the channels 2412 extends away from the piston 2402 in a substantially perpendicular orientation relative to the piston 2402 (e.g., parallel to a central axis of the MEMS die). Among other benefits, the channels 2412 increase the overall compliance of air within the MEMS die (e.g., by adding air volume away from the space between the electrode and the piston) without fully penetrating through electrode 2404. The space within the channels 2412 is part of the back volume.

Figure 24C:
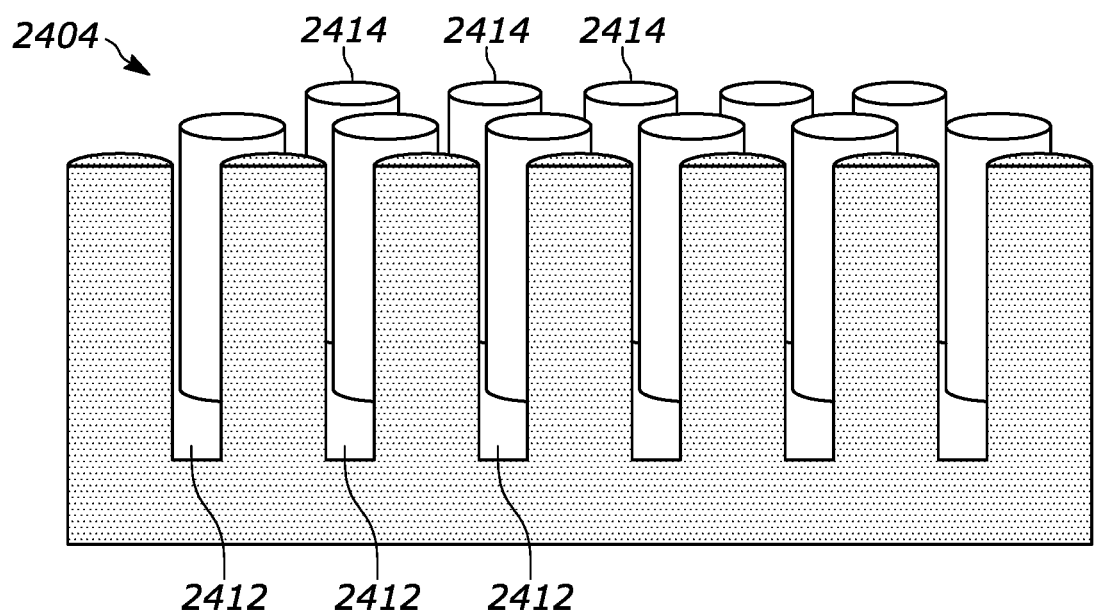
FIG. 24C is a partial perspective cross-sectional view of a possible implementation of the electrode of FIG. 24A.

Turning to FIG. 24C, a perspective view of the electrode 2404 of FIG. 24A (after the MEMS die 2400 is cross sectioned along line A-A') according to an embodiment is shown. In this embodiment, pillars 2414 are formed into the electrode 2404 and the spaces between the pillars 2414 constitute the channels 2412. The channels 2412 and the pillars 2414 may be of any shape as long as any point within the channel is less than a thermal boundary layer thickness from a surface of a pillar 2414 at the upper limit of audio frequency.

Figure 24D:
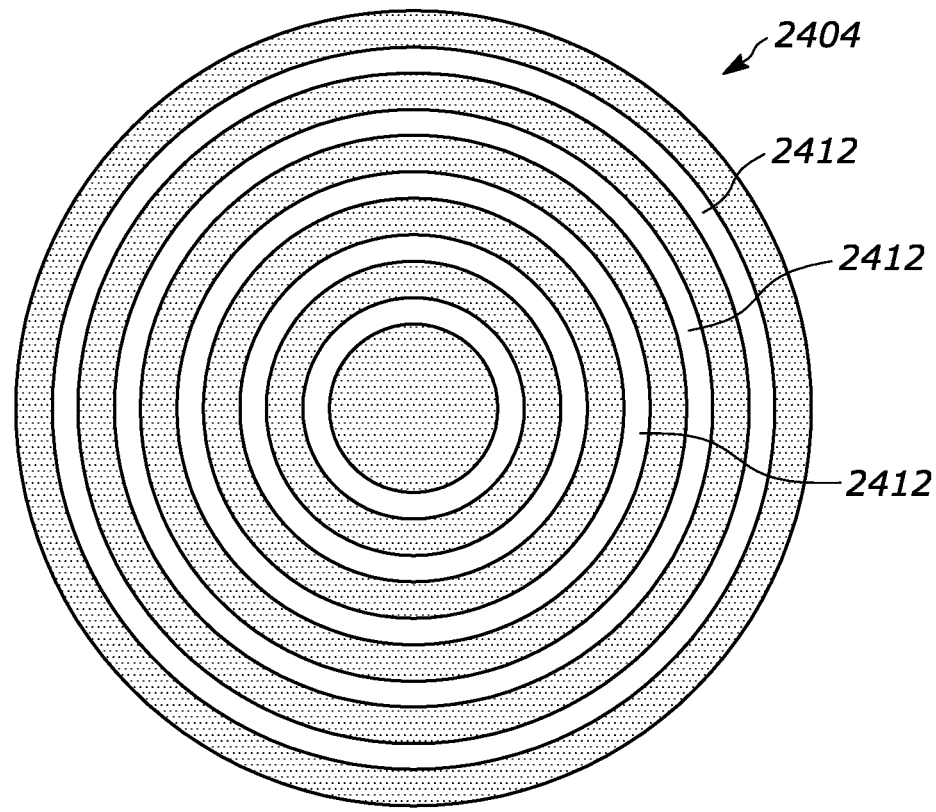
FIG. 24D is a top-down view of another possible implementation of the electrode of FIG. 24A.

Turning to FIG. 24D, a top view of the electrode 2404 of FIG. 24A (after the MEMS die 2400 is cross sectioned along line A-A') according to another embodiment is shown. In this embodiment, the channels 2412 are formed in the electrode 2404 in concentric rings.

Figure 25A:
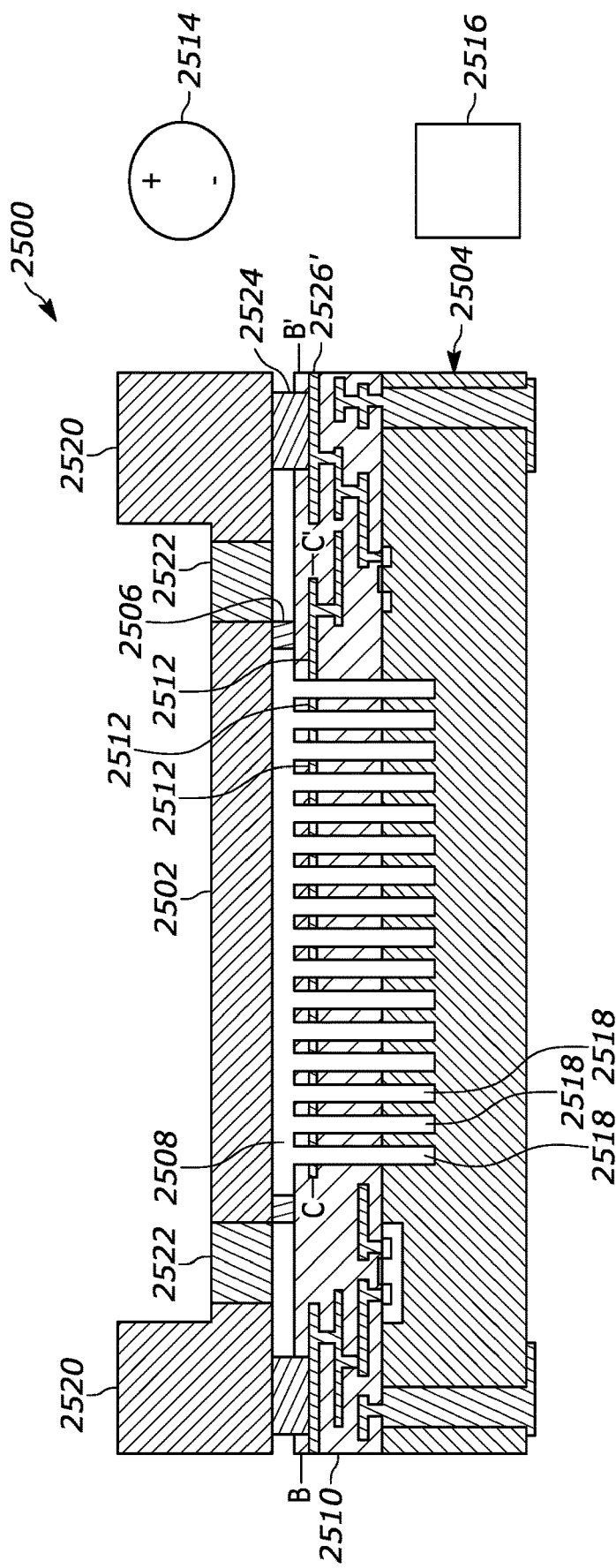
FIG. 25A is a side cross-sectional view of a MEMS die having a movable piston, according to an embodiment.

In various embodiments, the electrode facing the piston (on the opposite side of the gap/dielectric) is part of a layered structure generally referred to as a substrate, which may include, for example, a layer of polycrystalline silicon and a layer of insulator, with the electrode being embedded in the substrate (e.g., within the insulative material) or disposed on the surface of the substrate (e.g., on top of the insulative material). Turning to FIG. 25A, a MEMS die configured according to such an embodiment is shown. The MEMS die 2500 includes a piston 2502, which is configured like the piston 2402 of FIG. 24A and has the same possible variations, including a distinct electrode and insulative material. The MEMS die 2500 further includes a substrate 2504, and a resilient structure 2506 that supports the piston 2502 on the substrate 2504. Possible implementations of the piston 2502 and the resilient structure 2506 include those discussed in conjunction with piston and resilient structures of FIG. 24A and FIG. 24B. A back volume 2508 is bounded on top by the piston 2502, bounded on the bottom by the substrate 2504, and bounded on all sides by the resilient structure 2506. The piston 2502, substrate 2504, and the resilient structure 2506 enclose a back volume 2508. The resilient structure 2506 prevents air from leaving the back volume 2508, and particularly blocks air from travelling in a direction radially outward from a central portion of the back volume 2508. The substrate 2504 includes an insulative layer 2510 (made, for example, of silicon dioxide or silicon nitride) and an electrode 2512 that is embedded in the insulative layer 2510. The electrode 2512 faces the piston 2502 such that a capacitance exists between the piston 2502 and the electrode 2512 (with the piston 2502 acting as a first electrode of a capacitor, the electrode 2512 acting as a second electrode of the capacitor, and the air or other gas in the back volume 2508 acting as the dielectric). However, in some embodiments, the piston 2502 includes both insulative material and a conductive portion or layer, in which the conductive portion or layer acts as the first electrode of the capacitor. In an embodiment, when the MEMS die 2500 is integrated into a microphone, the piston 2502 is electrically connected to a bias voltage source 2514 and the electrode 2512 is electrically connected to an integrated circuit 2516 (e.g., to an amplifier input thereof). Alternatively, the piston 2502 may be electrically connected to the integrated circuit 2516 and the electrode 2512 may be electrically connected to the bias voltage source 2514.

In an embodiment, channels 2518 are formed into the substrate 2504, and the electrode 2512 spans the channels 2518. In an embodiment, the dimensions of the channels 2518 are such that any point within the channels 2518 is less than a single thermal boundary layer thickness from a nearest surface. In the embodiment of FIG. 25A, each of the channels 2518 extends away from the piston 2502 in a substantially perpendicular orientation relative to the piston 2502 (e.g., parallel to a central axis of the MEMS die 2500). The channels 2518 extend through the electrode 2512. Among other benefits, the channels 2516 increase the overall compliance of air within the MEMS die 2500 (e.g., by adding air volume away from the space between the second electrode 2512 and the piston 2502) without fully penetrating through the substrate 2504. The space within the channels 2518 is part of the back volume 2508.

According to an embodiment, the MEMS die 2500 includes walls 2520 and one or more external conductors 2522. Each external conductor 2522 is electrically connected to the piston 2502 (or to an electrode on the piston

Figure 25B:
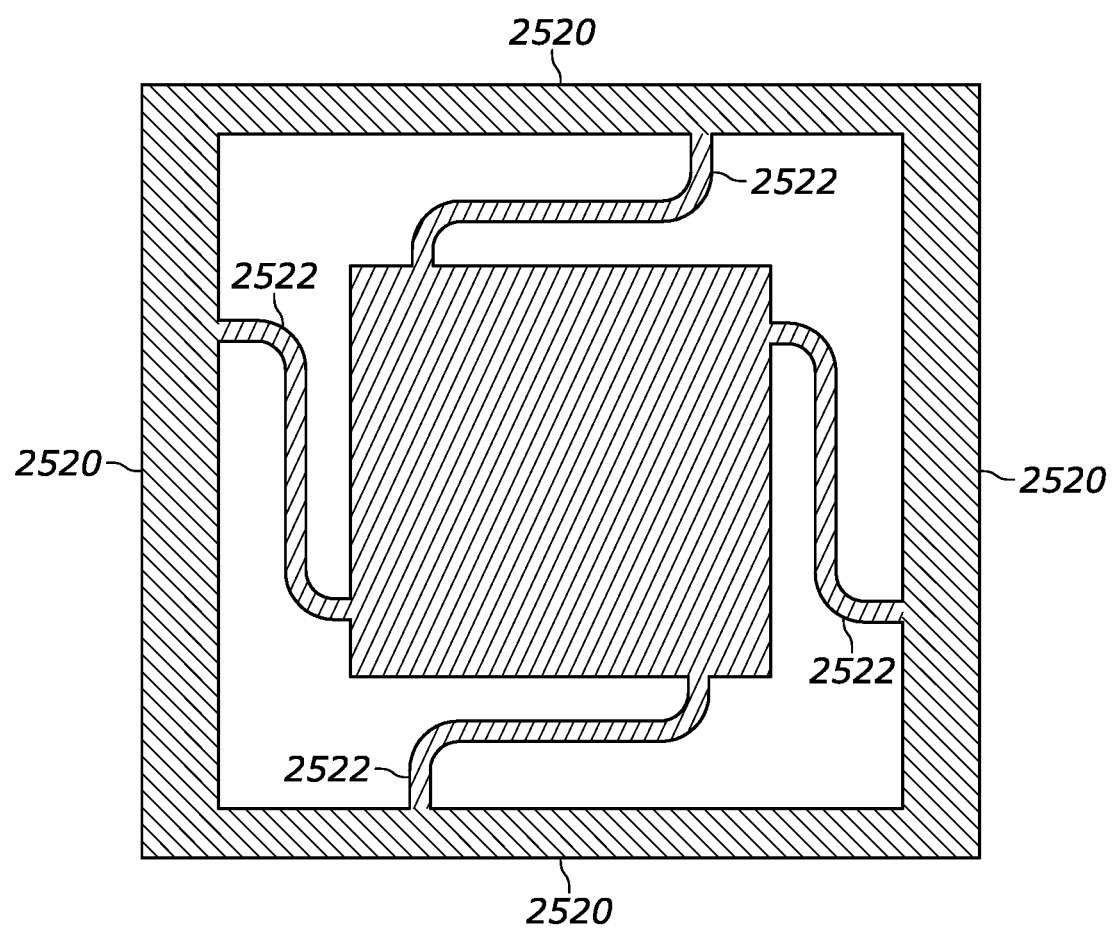
FIG. 25B is a top view of the piston, walls, and external conductors of a possible implementation of the MEMS die of FIG. 25A.

2502 if the piston includes insulative material) at one end and to a wall 2520 at the other end. In an embodiment, each of the one or more external conductors 2522 is a resilient member, such as a metallic spring. The walls 2520 are connected to the bias voltage source 2514 by way of a contact 2524 (e.g., a eutectic metal contact) and a conductive path 2526 within the insulative layer 2510 of the substrate 2504 (with through-silicon vias (TSVs) as appropriate). FIG. 25B depicts the walls 2520 and the external conductors 2522 as seen from above the piston 2502.

Figure 25C:
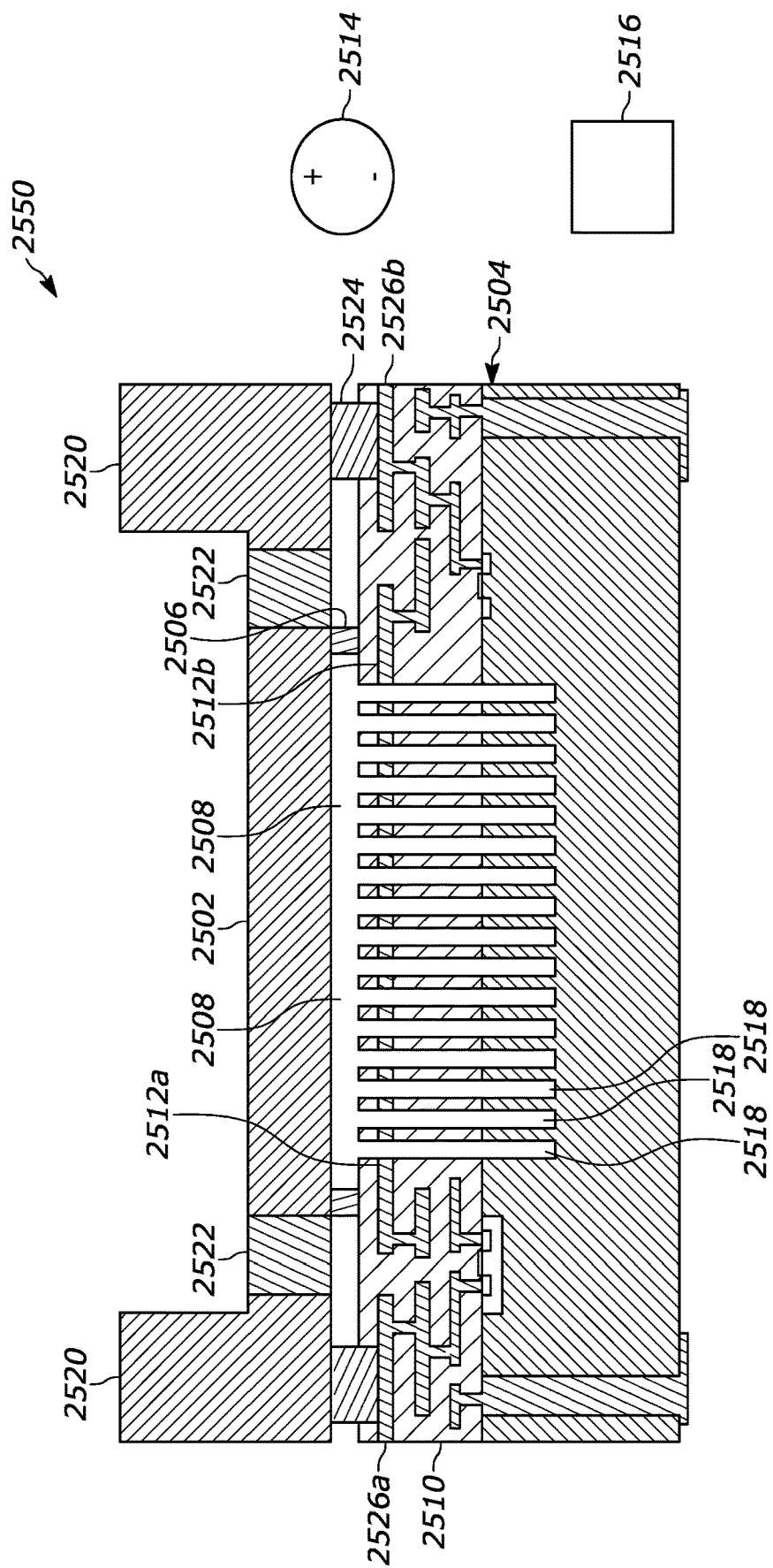
FIG. 25C is a side cross-sectional view of a MEMS die that is a variation of the MEMS die of FIG. 25A.

In a variation on the embodiment described in conjunction with FIG. 25A, the function of the electrode 2512 may be carried out by two electrodes, shown in the MEMS die 2550 of FIG. 25C. In this embodiment, the function of the electrode 2512 is carried out by an electrode 2512a and an electrode 2512b, both of which are depicted as being embedded in the substrate 2504 (in the insulative layer 2510). In this embodiment, the electrode 2512a is electrically connected to the bias voltage source 2514 via a conductive path 2526a and the electrode 2512b is electrically connected to the integrated circuit 2516 (e.g., to an amplifier input thereof) via a conductive path 2526b.

Figure 25D:
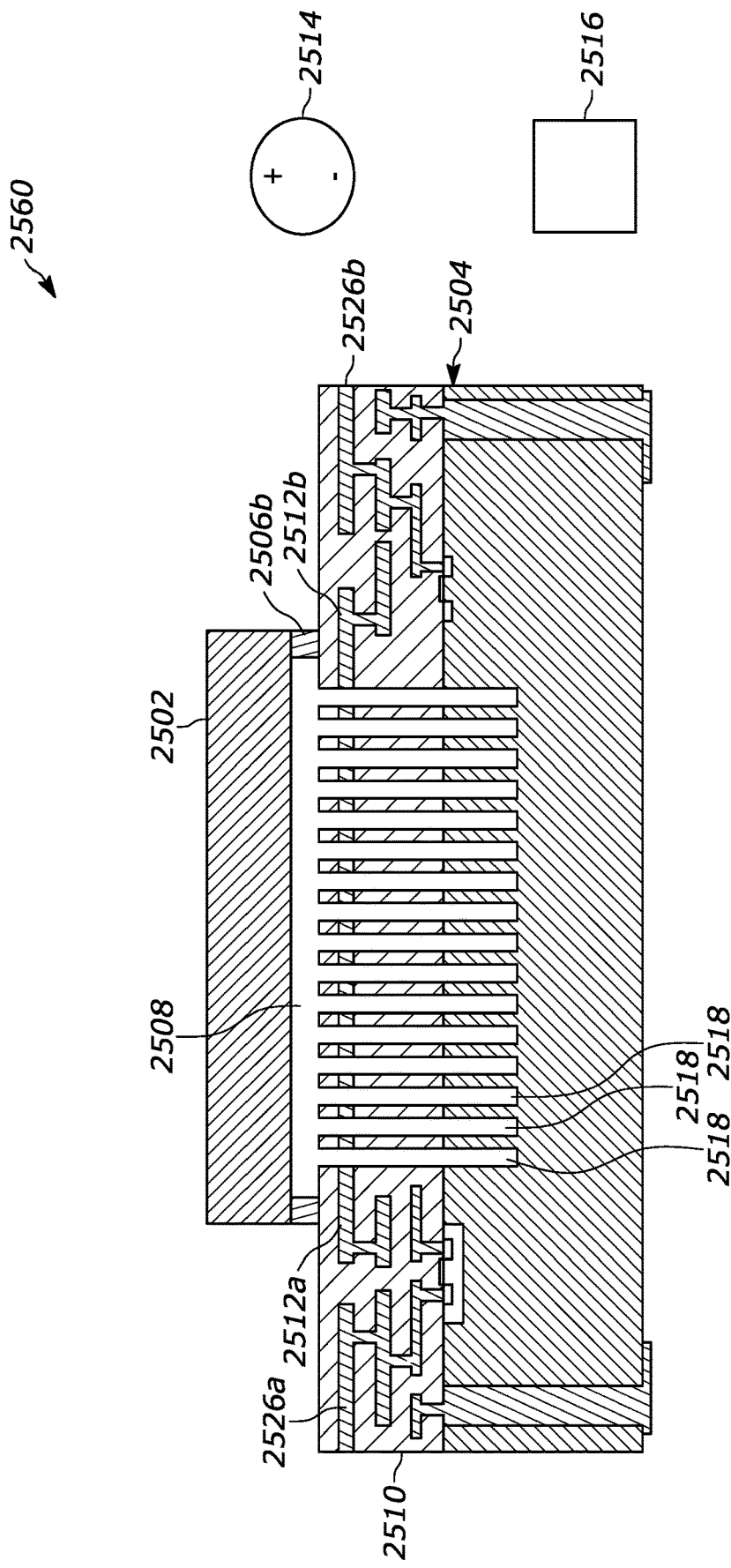
FIG. 25D is a side cross-sectional view of a MEMS die that is another variation of the MEMS die of FIG. 25A.

In an embodiment, the piston is connected to an electrical potential through a very large resistor. In an embodiment, the electrical potential may be electrical ground. The resistance of the resistor should be large enough to set the electrical corner frequency below that of the desired low acoustic corner frequency (e.g. 20 Hz). In an embodiment, the resistance may be 10^12 ohm. In other embodiments, the resistance may be less or more than 10^12 ohm. In an embodiment, the resistor is formed by the electrical leakage conductance of resilient structure 2506b and insulative layer 2510. In operation, the piston is connected to an electrical potential in a DC sense, but is electrically isolated in the AC sense. In such an embodiment, the movement of the piston towards and away from the electrodes facing the piston results in a change in capacitance between the piston and the electrodes and induces a signal in one of the electrodes (the other electrode being supplied with a DC voltage). An example of this is shown in FIG. 25D (which is a variation on the embodiment described in conjunction with FIG. 25C). In FIG. 25D, a MEMS die 2560 has the piston 2502 configured to be electrically floating. In this embodiment, the electrode 2512a is connected to the bias voltage source 2414 via a conductive path 2526a and the electrode 2412b is connected to the integrated circuit 2416 (e.g., to an amplifier input thereof) via a conductive path 2526b.

Figure 25E:
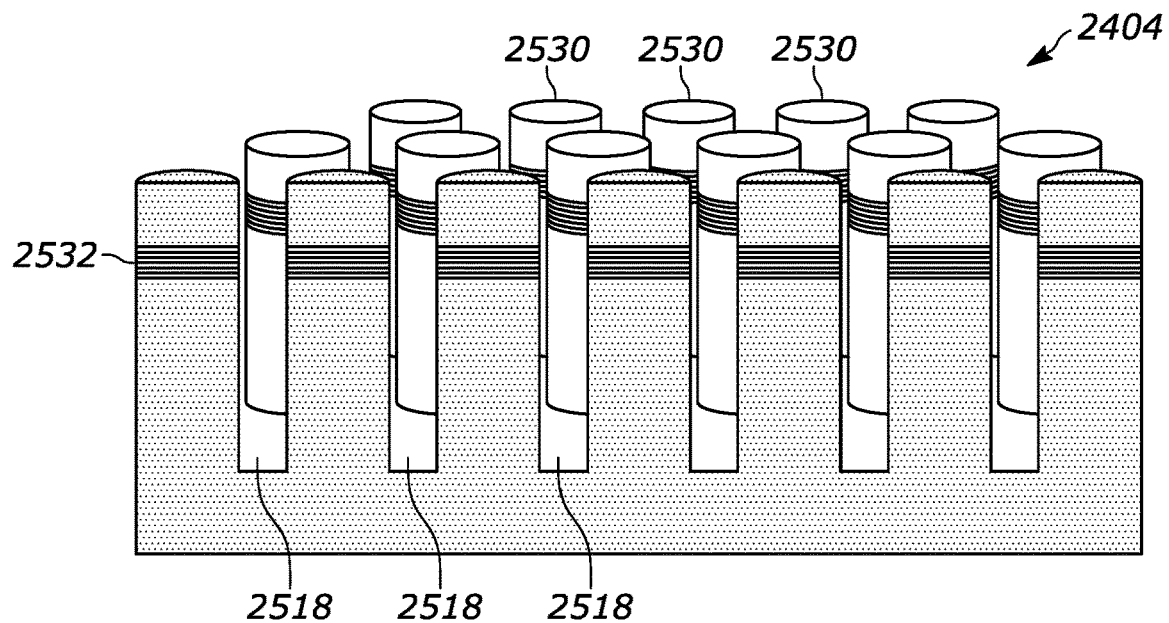
FIG. 25E is a partial perspective cross-sectional view of a possible implementation of the substrate of the MEMS die FIG. 25A.

Turning to FIG. 25E, a partial perspective view of the substrate 2504 cross sectioned along line B-B' (of FIG. 25A) according to an embodiment is shown. In this embodiment, pillars 2530 are formed into the substrate 2504 and the spaces between the pillars 2530 constitute the channels 2518. At least some of the pillars (all of them in some embodiments) include an electrically conductive layer 2532 that is connected (e.g., with a TSV down the long axis of the pillar) to a single, common conductor so that all of the electrically conductive layers are part of the electrode 2512. This substrate configuration may also be used in the embodiments of FIG. 25C and FIG. 25D, but with two electrically separate conductive layers instead of the single electrically conductive layer 2522 that is shown in FIG. 25E.

Figure 25F:
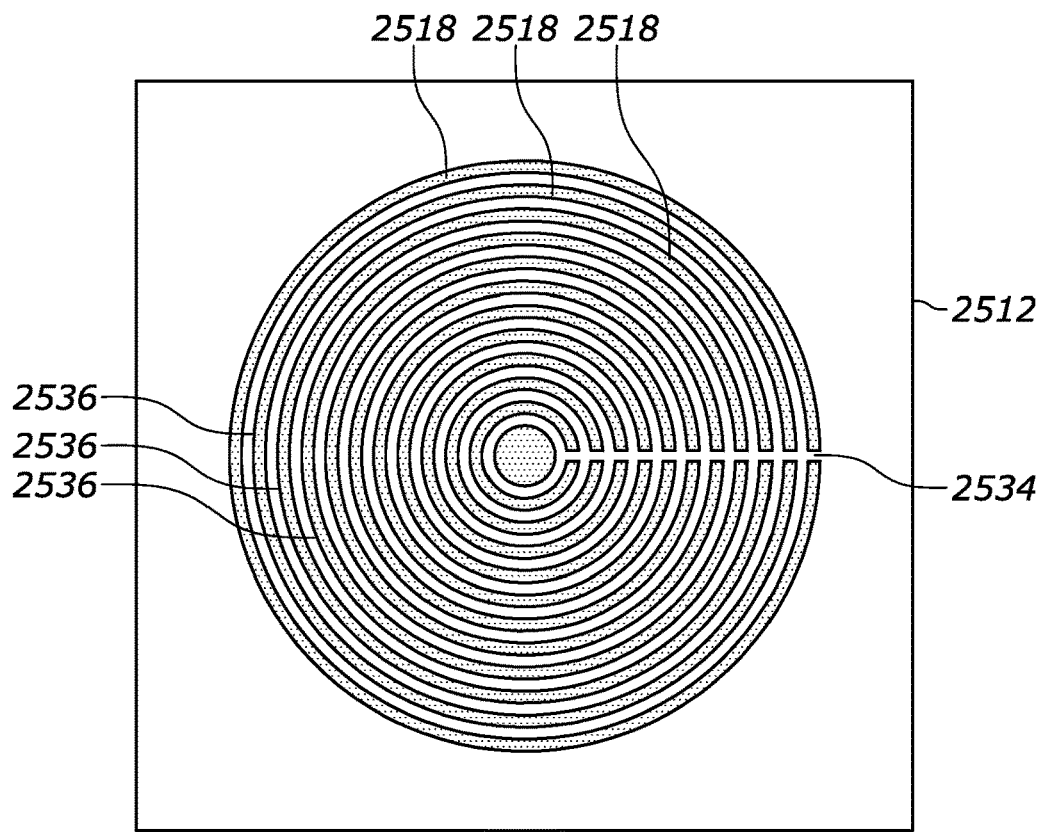
FIG. 25F is a top-down cross-sectional view of another possible implementation of the substrate of the MEMS die of FIG. 25A.

Turning to FIG. 25F, a top view of the substrate 2504 cross sectioned along line C-C' (of FIG. 25A) according to another embodiment is shown. In this embodiment, the channels 2518 are formed into the substrate 2504 in rings, such as the concentric rings shown in FIG. 25F between parts of the electrode 2512, which is also formed in concentric rings 2536. In this embodiment, a single conductive rib 2534 electrically connects the rings 2536 of the electrode 2512. This substrate configuration may also be used in the embodiments of FIG. 25C and FIG. 25D, but with two separate electrodes (e.g., with two separate conductive ribs).

Figure 26A:
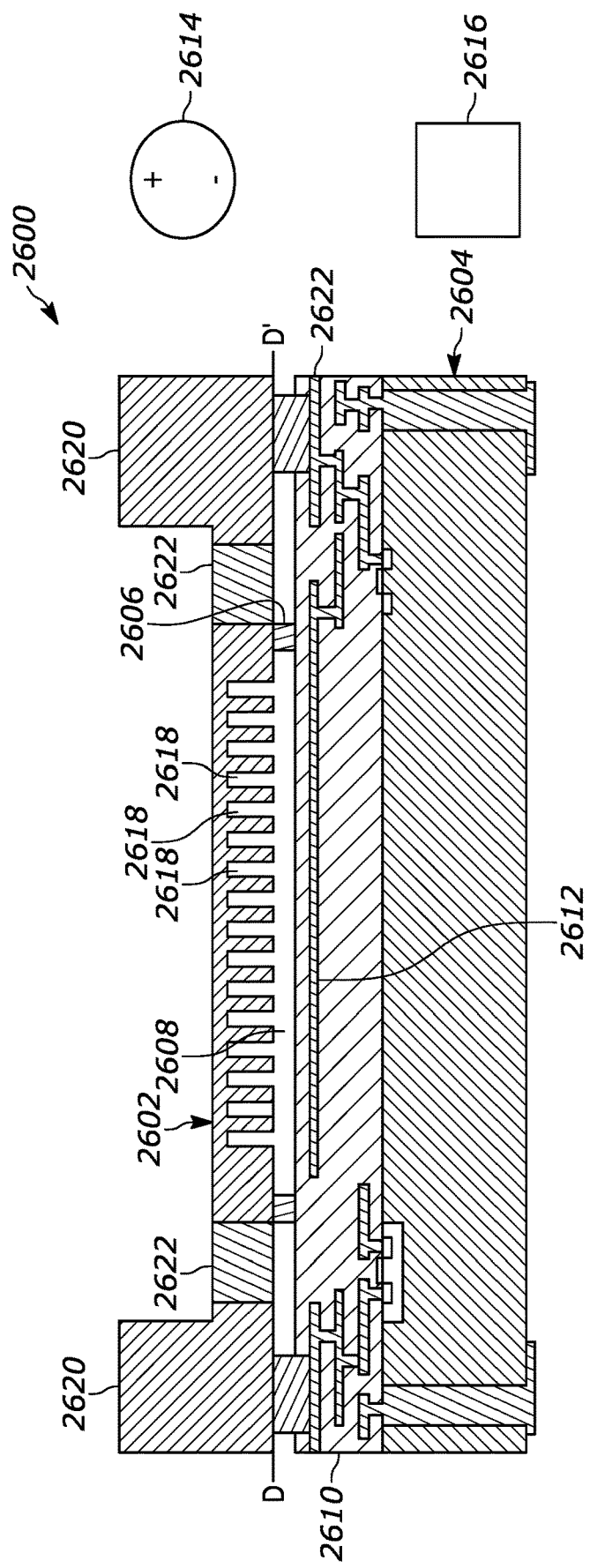
FIG. 26A is a side cross-sectional view of a MEMS die having a movable piston, according to an embodiment.

According to various embodiments, channels are provided in the piston to increase the compliance of the air in the back volume. Turning to FIG. 26A, a MEMS die configured according to such an embodiment is shown. The MEMS die 2600 includes a piston 2602 that is rigid (e.g., made of relatively thick silicon) and that is conductive (e.g., a semiconductor like crystalline silicon), a substrate 2604, and a resilient structure 2606 that supports the piston 2602 on the substrate 2604. Possible implementations of the piston 2602 and the resilient structure 2606 include those discussed in conjunction with the piston 2402 and the resilient structure 2406 of FIG. 24A. The piston 2602, substrate 2604, and the resilient structure 2606 enclose a back volume 2608. The resilient structure 2606 blocks air from leaving the back volume 2608, and particularly blocks air from travelling in a direction radially outward from a central portion of the back volume 2608. The substrate 2604 includes an insulative layer 2610 (made, for example, of silicon dioxide) and an electrode 2612 that is embedded in the insulative layer 2610.

Referring still to FIG. 26A, the electrode 2612 faces the piston 2602 such that a capacitance exists between the piston 2602 and the electrode 2612 (with the piston 2602 acting as a first electrode of a capacitor, the electrode 2612 acting as a second electrode of the capacitor, and the air or other gas in the back volume 2608 acting as the dielectric). However, in some embodiments, the piston 2602 includes both insulative material and a conductive portion or layer, in which the conductive portion or layer acts as the first electrode of the capacitor. In an embodiment, when the MEMS die 2600 is integrated into a microphone, the piston 2602 is electrically connected to a bias voltage source 2614 (e.g., via external conductors 2622) and the electrode 2612 is electrically connected to an integrated circuit 2616 (e.g., to an amplifier input thereof) (e.g., via a conductive path 2622). Alternatively, the piston 2602 may be electrically connected to the integrated circuit 2616 and the electrode 2612 may be electrically connected to the bias voltage source 2614.

According to an embodiment, the piston 2602 includes channels 2618. The space within the channels 2618 is part of the back volume 2608. The dimensions of the channels 2618 are such that any point within the channels 2618 is less than a single thermal boundary layer thickness from a nearest surface. In the embodiment of FIG. 26A, each of the channels 2618 extends away from the substrate 2604 in a substantially perpendicular orientation relative to the substrate 2604 (e.g., parallel to a central axis of the MEMS die 2600). Among other benefits, the channels 2618 increase the overall compliance of air within the MEMS die 2600 (e.g., by adding air volume away from the space between the substrate 2604) without fully penetrating through the piston 2602.

According to an embodiment, the MEMS die 2600 includes walls 2620 and one or more external conductors 2622. Each external conductor 2622 is configured as described previously with respect to the external conductor 2522 of FIG. 25A (including the possible implementations) and their function and relationship to the walls 2620 is also as described previously with respect the walls 2520 of FIG. 25A and FIG. 25B.

Figure 26B:
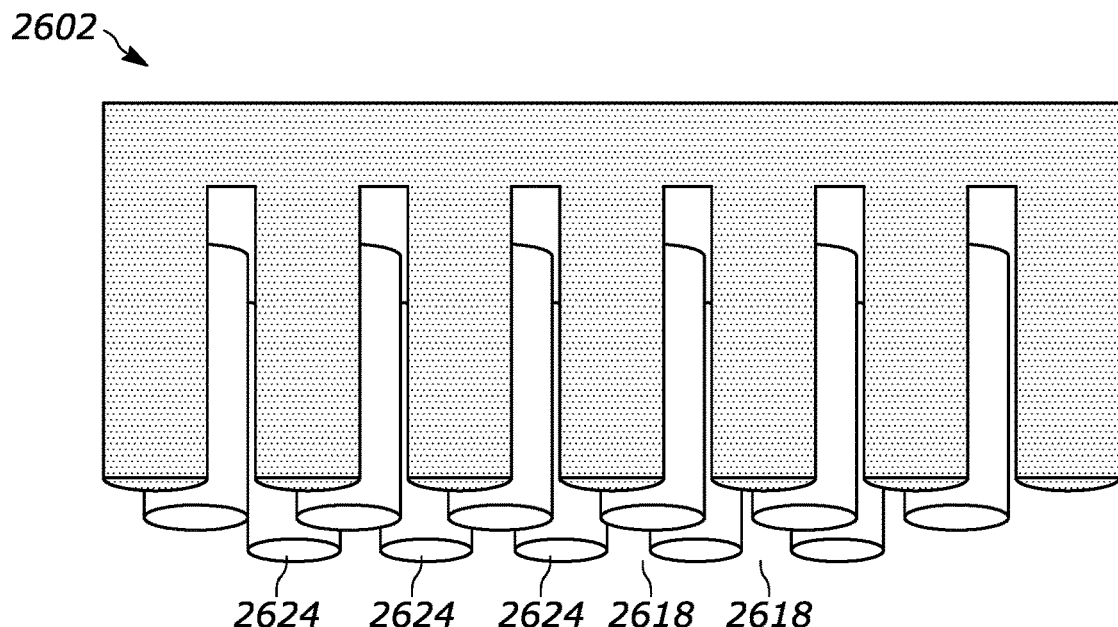
FIG. 26B is a partial perspective cross-sectional view of a possible implementation of the substrate of the piston of FIG. 26A.

FIG. 26B shows a partial perspective view of a cross section of the piston 2602 along line D-D'. In this embodiment, pillars 2624 are formed into the piston 2602 and the spaces between the pillars 2624 constitute the channels 2618.

Figure 26C:
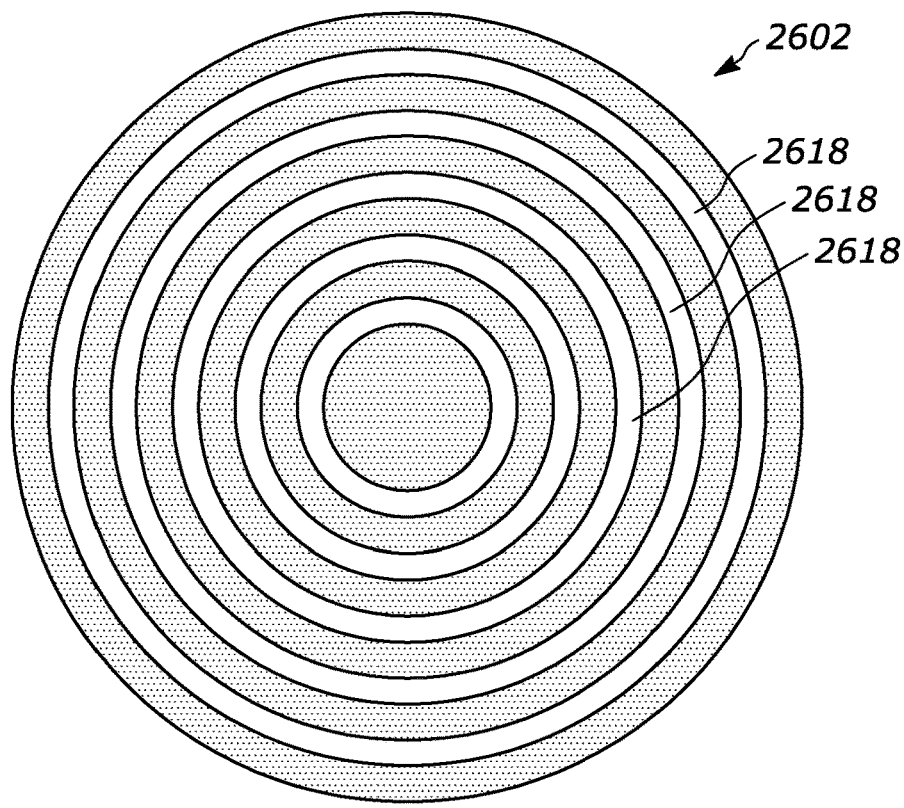
FIG. 26C is a bottom-up view of a possible implementation of the piston of the MEMS die of FIG. 26A.

Turning to FIG. 26C, a bottom view of the piston 2602 cross sectioned along line D-D' according to another embodiment is shown. In this embodiment, the channels 2618 are formed into the piston 2602 in concentric rings.

Figure 26D:
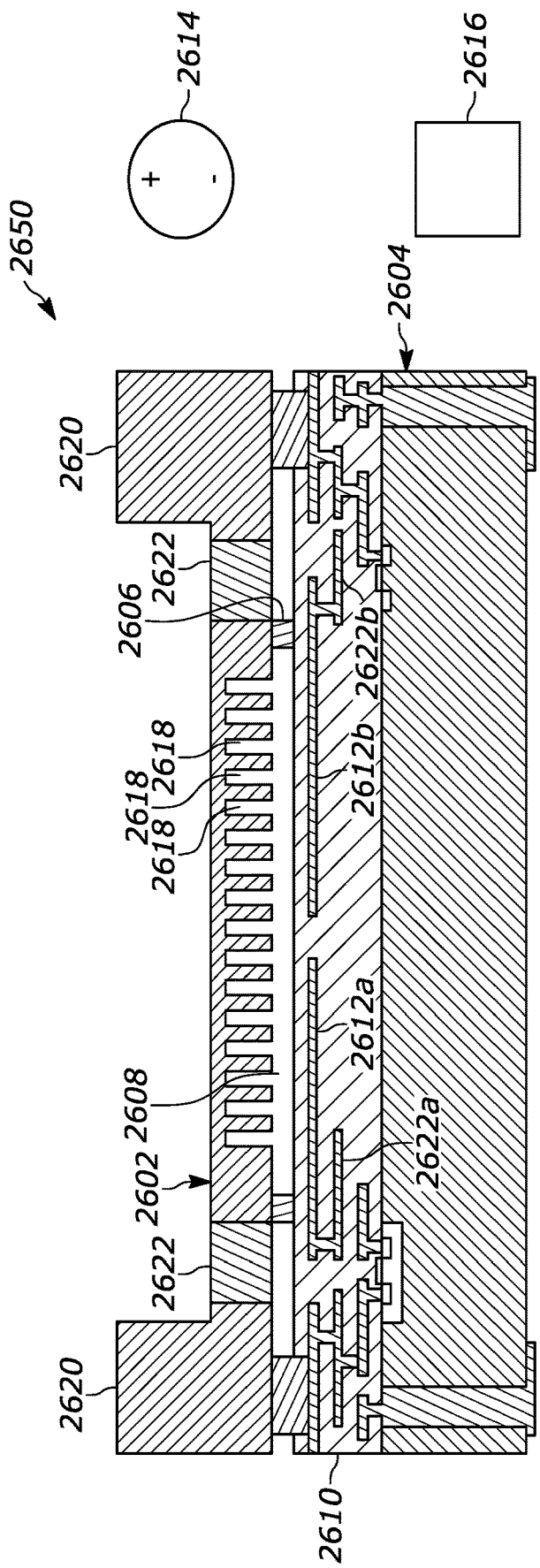
FIG. 26D is a side cross-sectional view of a MEMS die that is a variation of the MEMS die of FIG. 26A.

In a variation on the embodiment described in conjunction with FIG. 26A, the function of the electrode 2612 may be carried out by two electrodes, as shown in the MEMS die 2650 of FIG. 26D. In this embodiment, the functions of the electrode 2612 are carried out by an electrode 2612a and an electrode 2612b. In this embodiment, the electrode 2612a is connected to the bias voltage source 2614 and the electrode 2612b is connected to the integrated circuit 2616 (e.g., to an amplifier input thereof) via respective conductive pathways 2622a and 2622b.

Figure 26E:
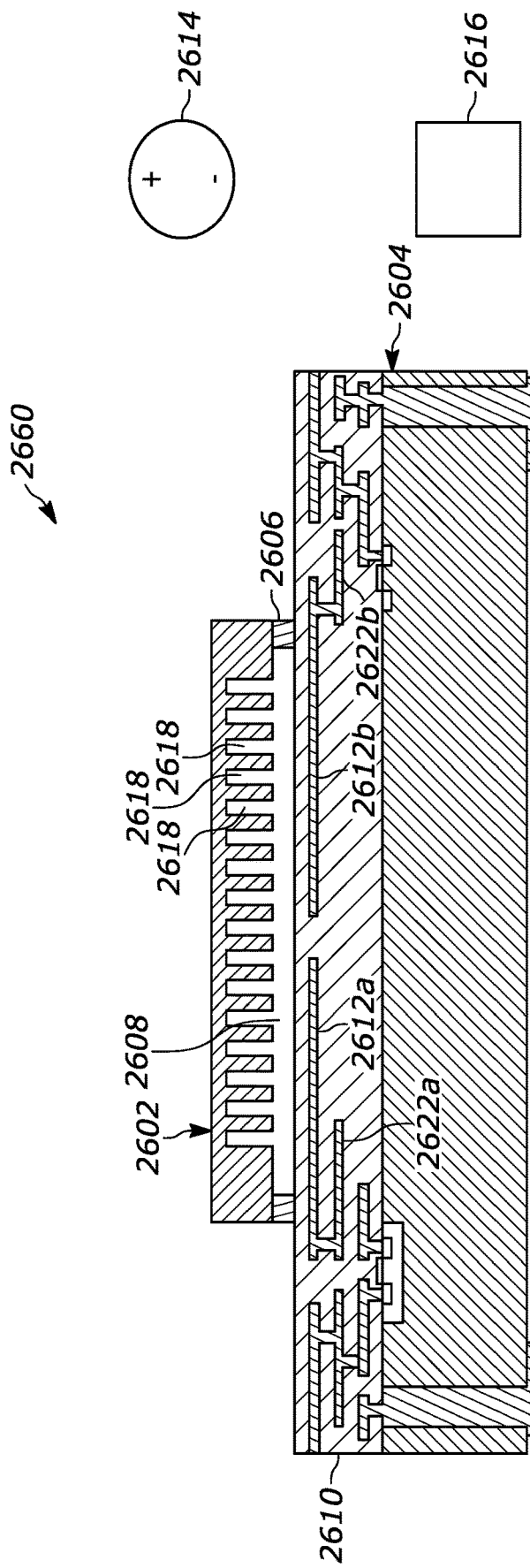
FIG. 26E is a side cross-sectional view of a MEMS die that is another variation of the MEMS die of FIG. 26A.

In a variation on the embodiment described in conjunction with FIG. 26D, the piston 2602 may be electrically floating, as shown in the MEMS die 2660 of FIG. 26E. In this embodiment, the electrode 2612a is connected to the bias voltage source 2614 via a conductive path 2622a and the electrode 2612b is connected to the integrated circuit 2616 (e.g., to an amplifier input thereof) via a conductive path 2622b.

Figure 26F:
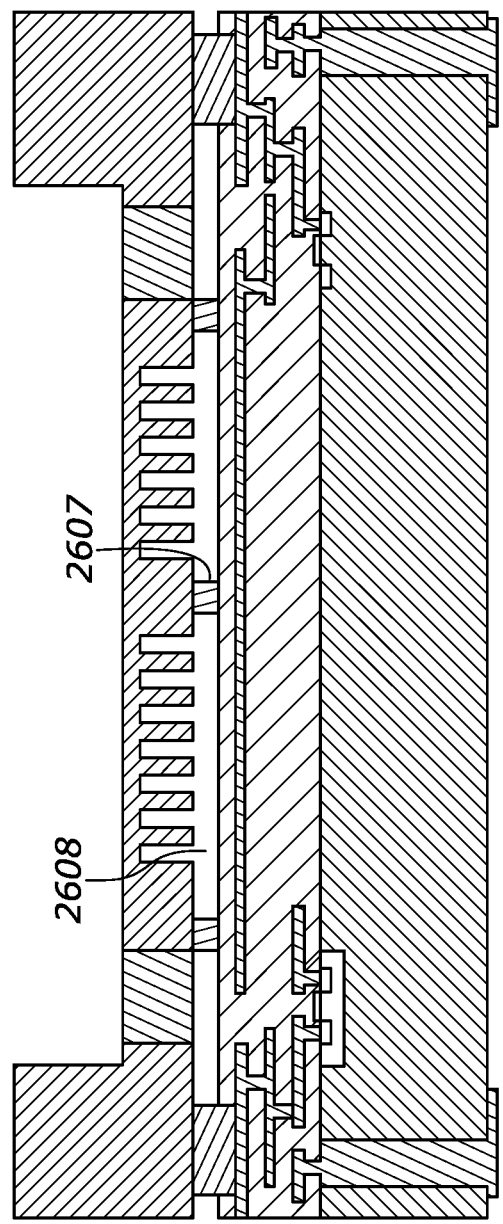
FIG. 26F is a side cross-sectional view of a MEMS die that is yet another variation of the MEMS die of FIG. 26A, according to another embodiment.

In the various MEMS die embodiments described herein (e.g., the MEMS dies of FIG. 24B, FIG. 25A, FIG. 25C, FIG. 25D, FIG. 26A, FIG. 26D, and FIG. 26E), the MEMS die may also include a resilient structure inside the back volume (e.g., near a central axis of the MEMS die). Such a resilient structure is in addition to a resilient structure at the periphery of the piston. An example of such an embodiment is shown in FIG. 26F, in which a MEMS die 2670 is configured like the MEMS die 2600 of FIG. 26A except that the MEMS die 2670 includes a second resilient structure 2607 inside the back volume 2608. One possible advantage to the second resilient structure 2607 is that it may increase the resonance frequency for the MEMS die 2670 to limit adverse effects that would result from having the resonance in or near the audio band.

In various embodiments of MEMS dies described above, certain innovations allow for a back volume configured such that every point within the back volume is no more than a single thermal boundary layer thickness from a solid surface. What follows is a description of further embodiments in which MEMS dies with such back volume configurations are combined with diaphragm assemblies.

Figure 27:
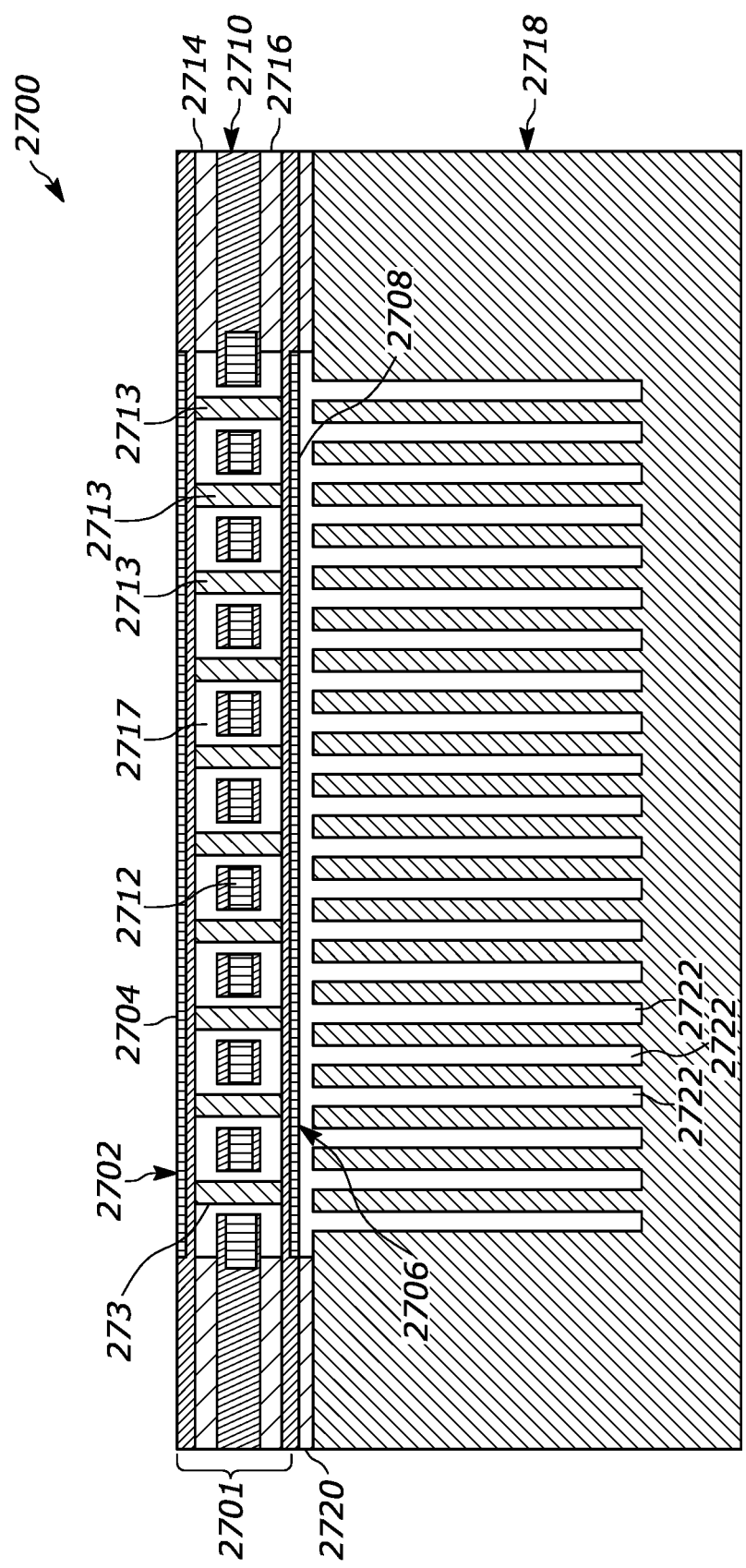
FIG. 27 is a side cross-section view of a MEMS die that includes a dual-diaphragm assembly, according to an embodiment.

For example, turning to FIG. 27, a MEMS die 2700 includes a dual-diaphragm diaphragm assembly 2701. The dual-diaphragm assembly 2701 includes a first diaphragm 2702 comprising a first electrode 2704, a second diaphragm 2706 comprising a second electrode 2708, and a backplate 2710 comprising a third electrode 2712. The first diaphragm 2702 and the second diaphragm 2706 are oriented so that they face one another, and the backplate 2710 is disposed in between the first diaphragm 2702 and the second diaphragm 2706 and facing both the first diaphragm 2702 and the second diaphragm 2706. The first diaphragm 2702 and the second diaphragm 2706 are connected to one another by pillars 2713, which extend through the backplate 2710. The MEMS die 2700 further includes a spacer 2714 that is sandwiched between and connected to the first diaphragm 2702 and the backplate 2710, and a spacer 2716 that is sandwiched between and connected to the second diaphragm 2706 and the backplate 2710. A region 2716 between the first diaphragm 2702 and the second diaphragm 2706 is sealed off and is at a lower pressure than standard atmospheric pressure (e.g., 50% atmospheric pressure) and may be at or near a vacuum. The MEMS die 2700 further includes an enclosure 2718 that is formed from and acts as a substrate. The second diaphragm 2706 is attached to the enclosure 2718 via a spacer 2720.

In an embodiment, channels 2722 are formed into the enclosure 2718. In an embodiment, the dimensions of the channels 2722 are such that any point within the channels 2722 is less than a single thermal boundary layer thickness from a nearest surface. The channels 2722 increase the overall compliance of air within the MEMS die 2700. The space within the channels 2722 is part of the back volume. Possible configurations for the topography of the substrate 2718 include those discussed in conjunction with FIG. 24C and FIG. 24D with pillars or rings, respectively.

Figure 28A:
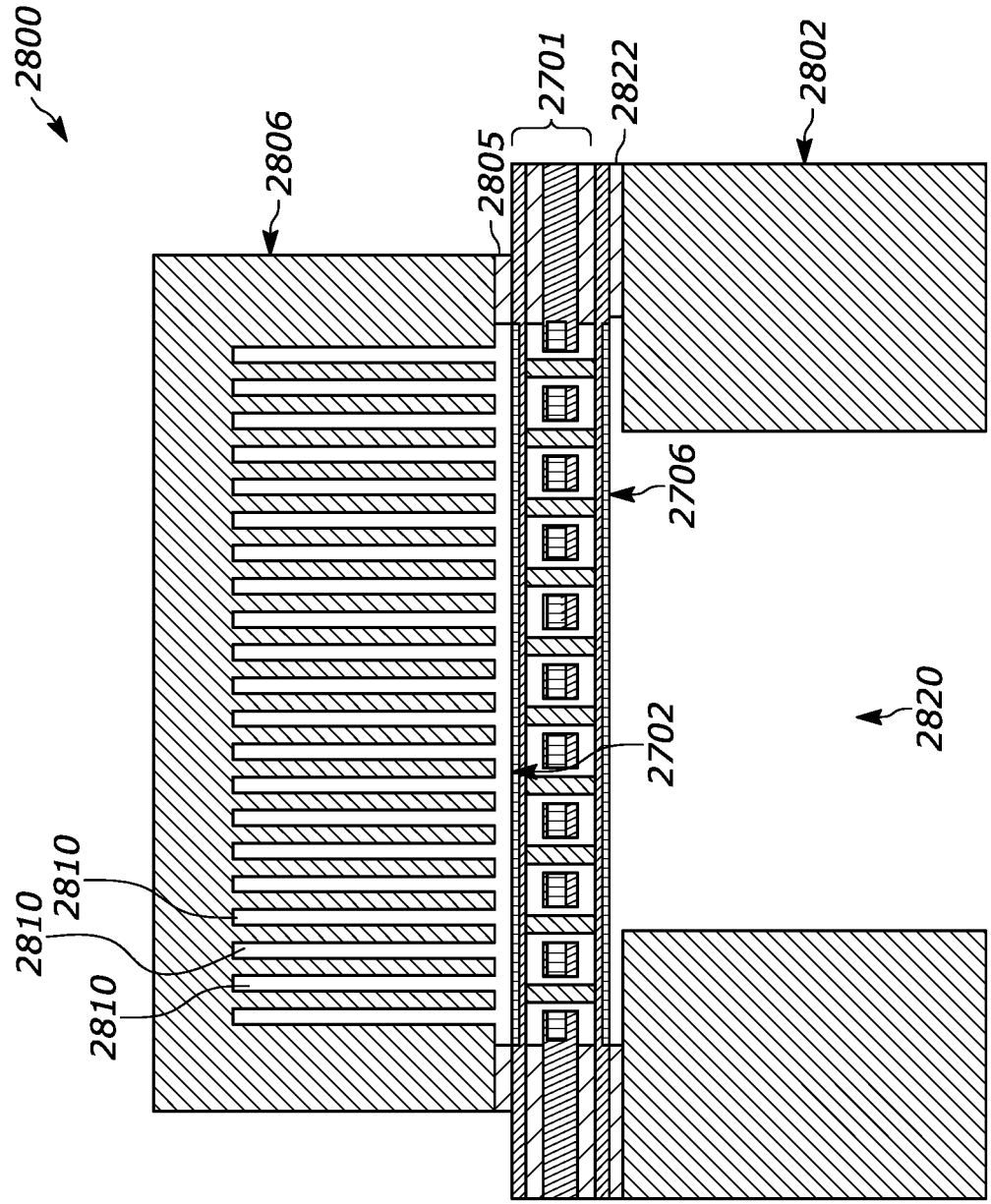
FIG. 28A is a side cross-section view of a MEMS die that includes a dual-diaphragm assembly, according to another embodiment.

A variation of the MEMS die 2700 is shown in FIG. 28A. The MEMS die 2800 includes the dial-diaphragm assembly 2701 of FIG. 27, but with a substrate, labeled 2802. Attached to the first diaphragm 2702 (via a spacer 2805) is an enclosure 2806. Channels 2810 are formed into the enclosure 2806. In an embodiment, the dimensions of the channels 2810 are such that any point within the channels 2810 is less than a single thermal boundary layer thickness from a nearest surface. The space within the channels 2810 is part of the back volume. Possible configurations for the topography of the enclosure 2806 include those discussed in conjunction with FIG. 26B and FIG. 26C with pillars or rings, respectively. The substrate 2802 has a hole 2820 through which sound passes. The second diaphragm 2706 is attached to the substrate 2802 via a spacer 2822.

Figure 28B:
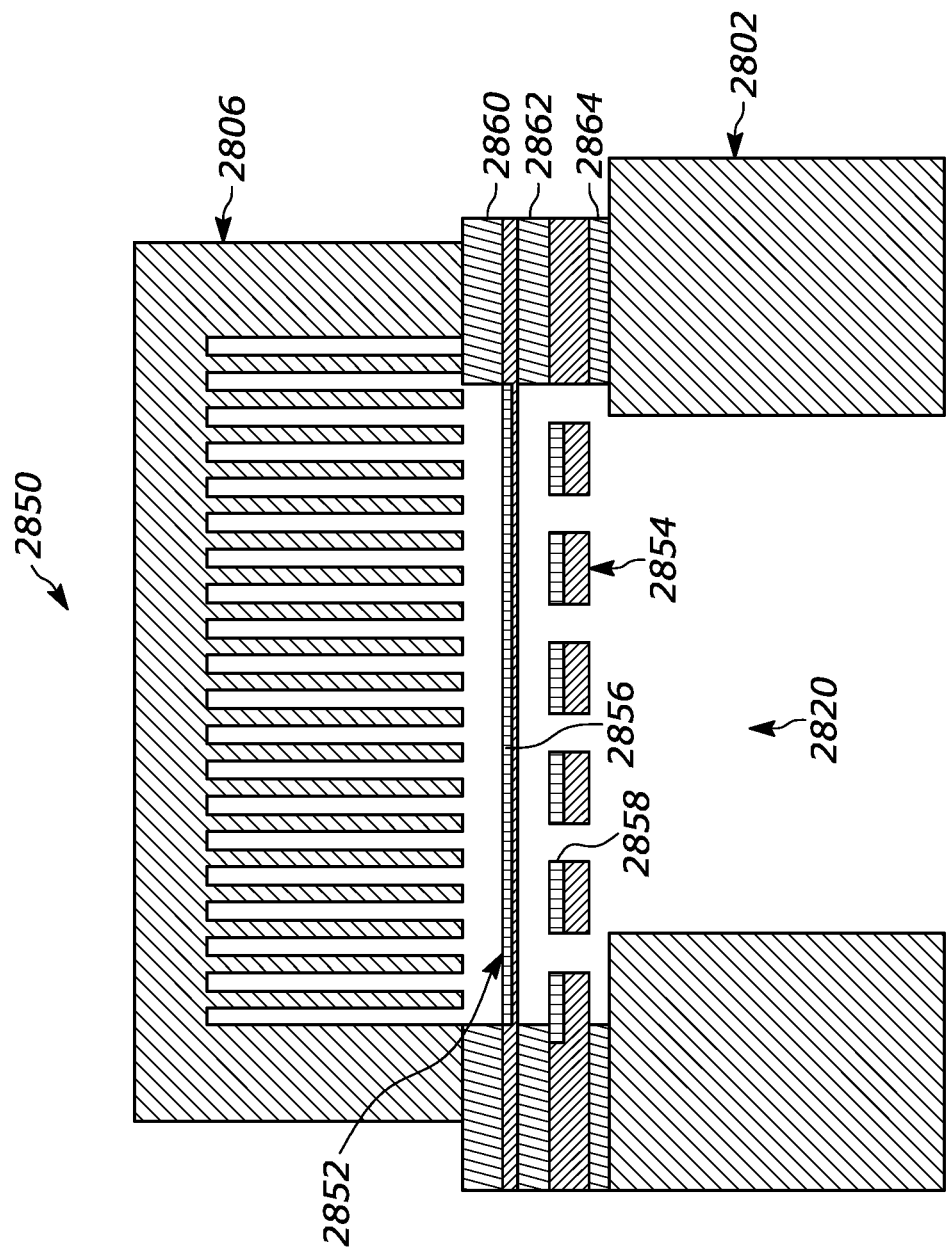
FIG. 28B is a side cross-section view of a MEMS die that includes a single-diaphragm assembly but with the same enclosure and substrate as the MEMS die of FIG. 28A, according to an embodiment.

A variation of the MEMS die 2800 is shown in FIG. 28B. A MEMS die 2850 includes the enclosure 2806 and the substrate 2802. Additionally, the MEMS die 2850 has a single diaphragm 2852 and a backplate 2854 facing the diaphragm 2852. The diaphragm 2852 has a first electrode 2856 and the backplate 2854 has a second electrode 2858. The diaphragm 2852 is attached to the enclosure 2806 via a spacer 2860. The backplate 2854 is attached to the diaphragm 2852 via a spacer 2862 and to the substrate 2802 via a spacer 2864. During operation, sound enters the hole 2820, passes through the backplate 2854 and strikes the diaphragm 2852.

Figure 28C:
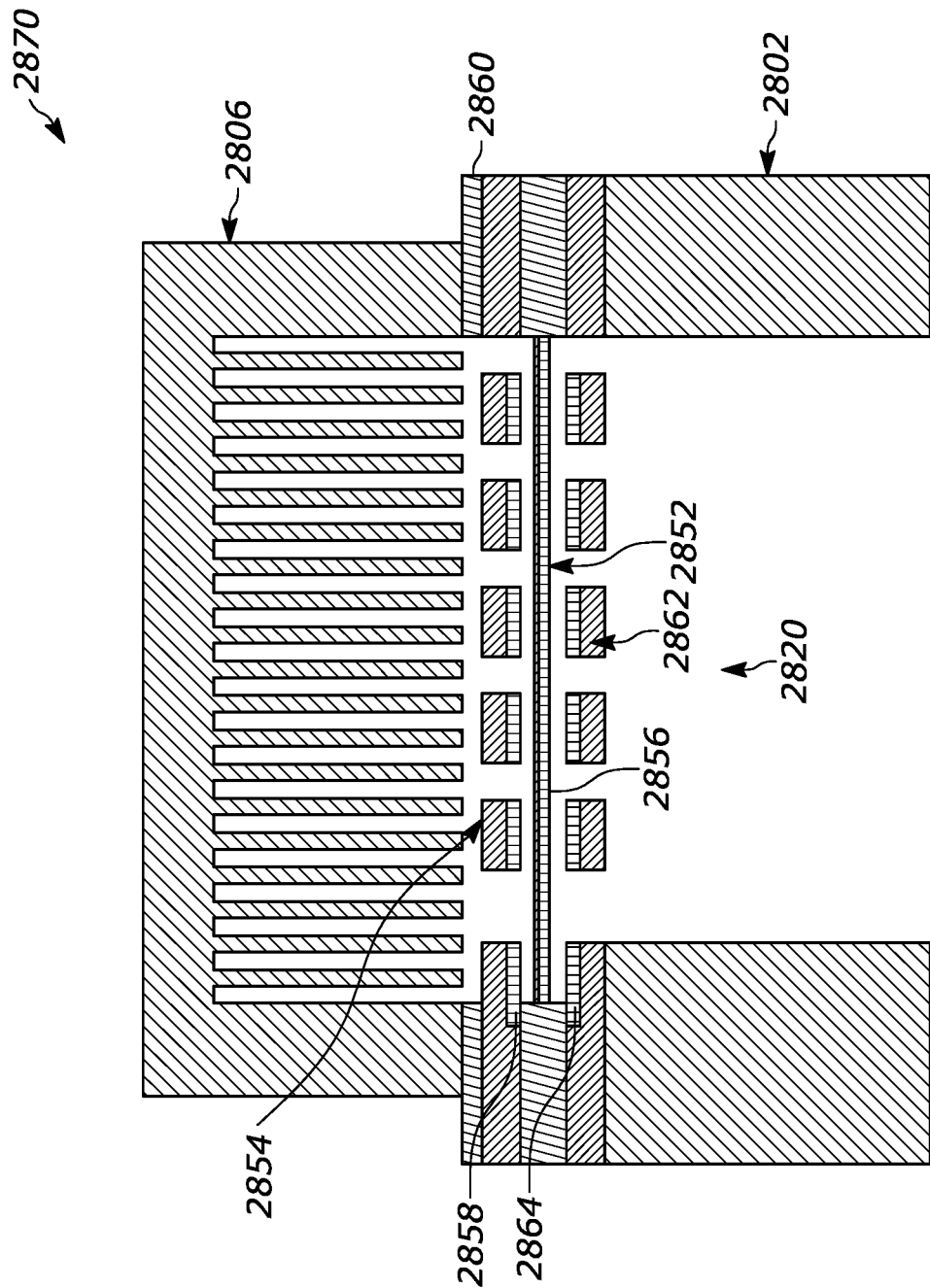
FIG. 28C is a side cross-sectional view of a variation of the MEMS die of FIG. 28B.

Another variation of the MEMS die 2800 is shown in FIG. 28C. The MEMS die 2870 is similar to the MEMS die 2850 of FIG. 28B except that the positions of the backplate 2854 and the diaphragm 2852 are reversed and there is a second backplate 2862 that has an electrode 2864.

Figure 29:
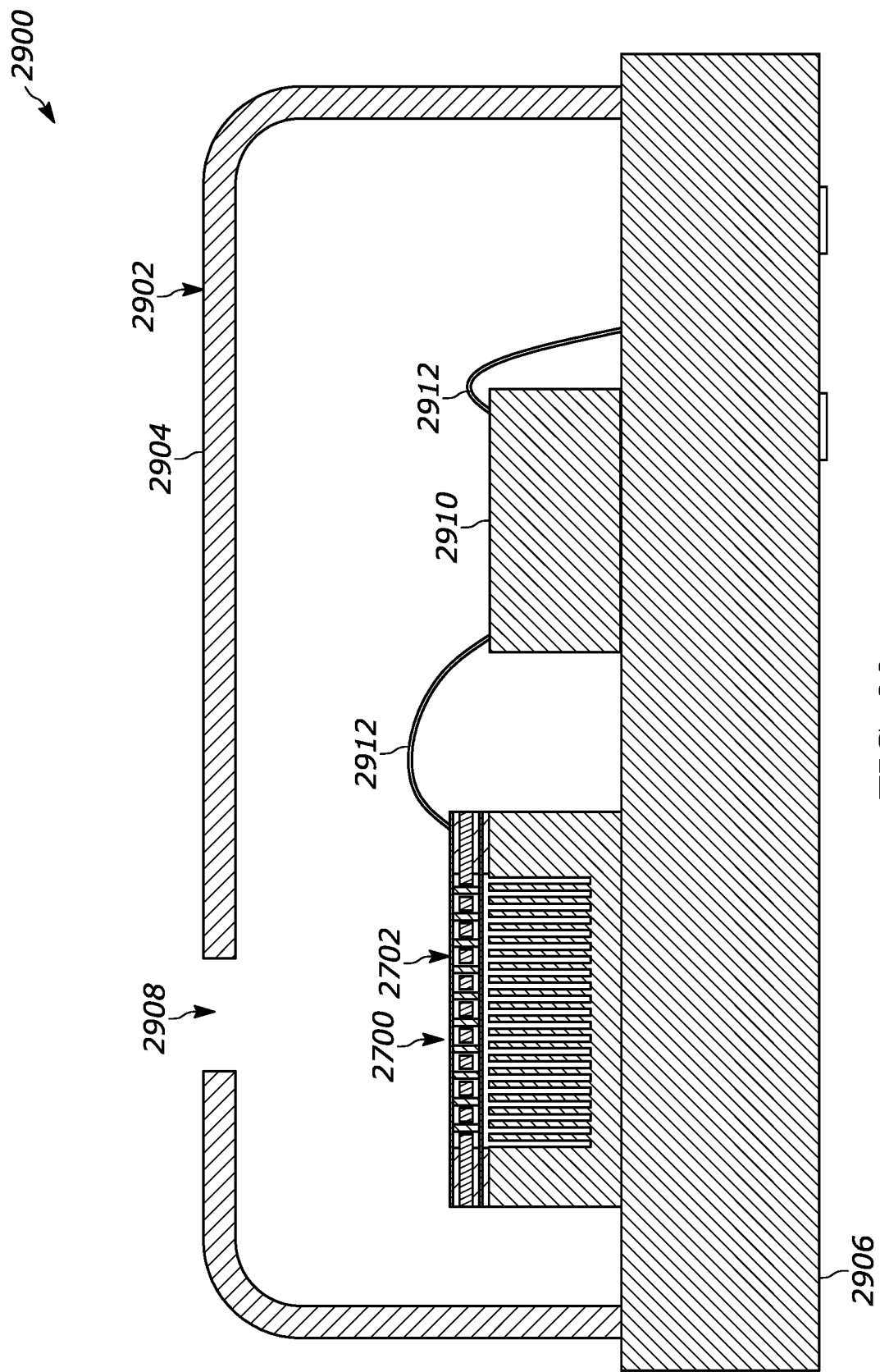
FIG. 29 is a sensor that incorporates the MEMS die of FIG. 27, according to an embodiment.

Turning to FIG. 29, an example use of the MEMS die 2700 of FIG. 27 is depicted in the context of a sensor, specifically an acoustic sensor referred to as a microphone 2900. The microphone 2900 has a housing 2902 that includes a can 2904 and a base 2906. The can 2904 is attached to the base 2906. Pressure waves (e.g., sound waves) enter a port 2908 on the can 2904 and strike the first diaphragm 2702, cause it to flex and to induce corresponding flexion in the second diaphragm 2706 (via the pillars 2713). Consequently, the distance between the first electrode 2704 and the third electrode 2712, altering the capacitance between the first electrode 2704 and third electrode 2712. Likewise, the distance between the second electrode 2708 and the third electrode 2712 changes, altering the capacitance between the second electrode 2708 and the third electrode 2712. These capacitance changes are read by an electrical circuit (e.g., integrated circuit) 2910, which is attached to MEMS die 2700 via one or more signal pathways (e.g., wires) 2912. The electrical circuit 2910 then interprets the signals representing the capacitance changes and interprets the signals as, for example, sound. The electrical circuit then provides further signals representing the interpretation via one or more additional signal pathways (e.g., wires) to external devices.

Figure 30:
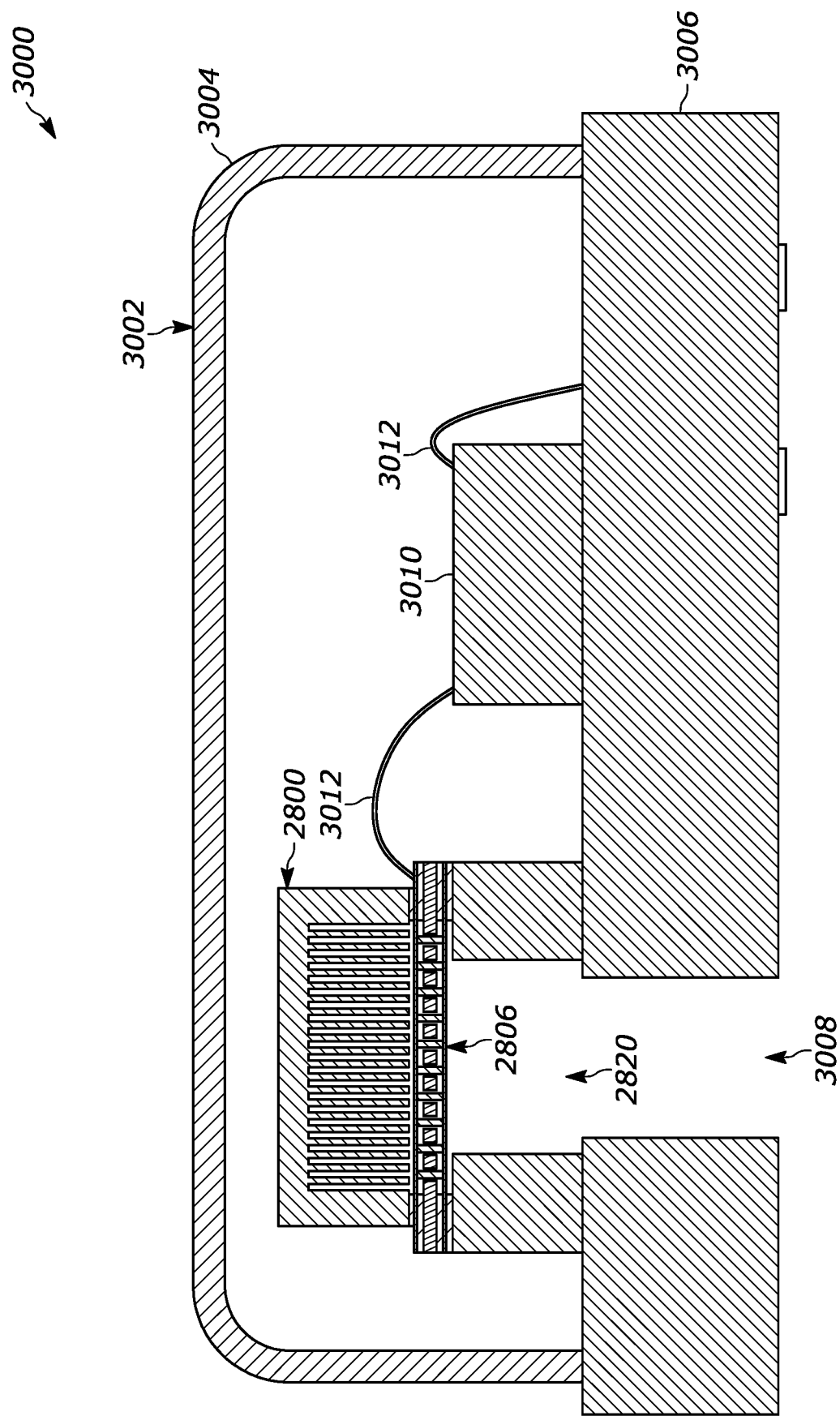
FIG. 30 is a sensor that incorporates the MEMS die of FIG. 28A, according to an embodiment.

Turning to FIG. 30, an example use of the MEMS die 2800 is depicted in the context of a sensor, specifically an acoustic sensor referred to as a microphone 3000. The microphone 3000 has a housing 3002 that includes a can 3004 and a base 3006. The can 3004 is attached to the base 3006. Pressure waves (e.g., sound waves) enter a port 3008 on the base 3006, pass through the hole 2820 in the substrate 2802 and strike the second diaphragm 2806, cause it to flex and to induce corresponding flexion in the first diaphragm 2802 (via the pillars 2813). Consequently, the distance between the first electrode 2804 and the third electrode 2812, altering the capacitance between the first electrode 2804 and third electrode 2812. Likewise, the distance between the second electrode 2808 and the third electrode 2812 changes, altering the capacitance between the second electrode 2808 and the third electrode 2812. These capacitance changes are read by an electrical circuit (e.g., integrated circuit) 3010, which is attached to MEMS die 2800 via one or more signal pathways (e.g., wires) 3012. The electrical circuit 3010 then interprets the signals representing the capacitance changes and interprets the signals as, for example, sound. The electrical circuit then provides further signals representing the interpretation via one or more additional signal pathways (e.g., wires) to external devices.

Other types of dual-diaphragm assemblies may also be used in place of the dual-diaphragm assembly 2701 of FIG. 27, FIG. 28A, FIG. 29, and FIG. 30. For example, a dielectric motor MEMS assembly may be used. The principles of such an assembly according to an embodiment will now be described with reference to FIG. 31A, FIG. 31B, and FIG. 32.

Figure 31A:
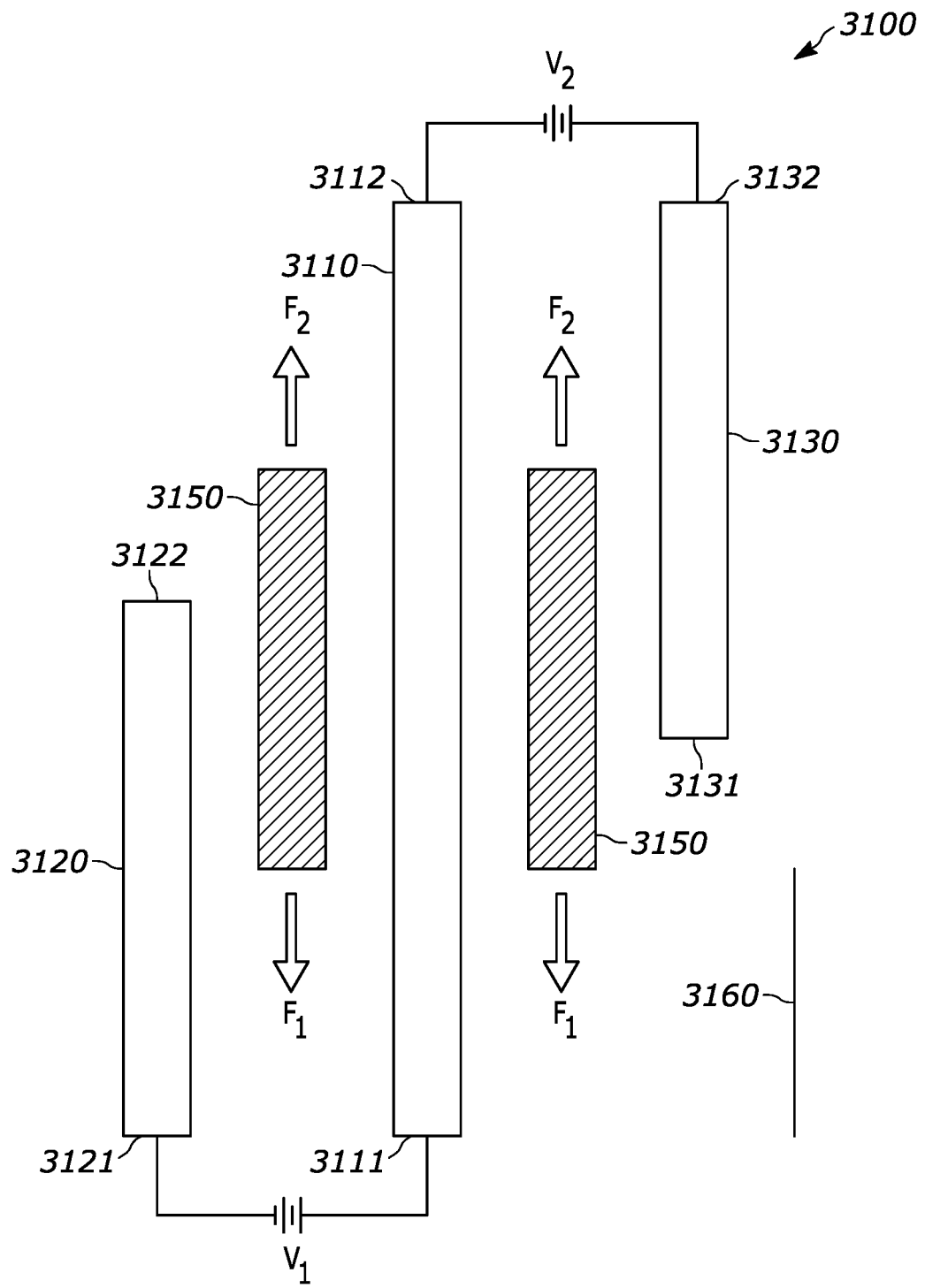
FIG. 31A and FIG. 31B depict the operation of a dielectric motor MEMS device, according to an embodiment.

Turning to FIG. 31A, in an embodiment, a dielectric motor MEMS device 3100 includes a first electrode 3110 oriented lengthwise along and parallel to an axis 3160. The first electrode 3110 has a first end 3111 and a second end 3112. The MEMS device 3100 also includes a second electrode 3120 oriented lengthwise along and parallel to the axis 3160. The second electrode 3120 has a first end 3121 and a second end 3122. The MEMS device 3100 further includes a third electrode 3130 oriented lengthwise along and parallel to the axis 3160. The third electrode 3130 has a first end 3131 and a second end 3132. The electrodes 3110, 3120, and 3130 may be cylinders, plates, cuboids, prisms, polyhedrons, or other shapes of electrodes. The length of the first electrode 3110 is longer than the length of the second electrode 3120 and longer than the length of the third electrode 3130. The MEMS device 3100 has a solid dielectric 3150 interspersed among the electrodes. The dielectric 3150 may be made, for example, of silicon nitride. The electrodes 3110, 3120, and 3130 are made of a conductor or a semiconductor, such as plated metals or poly silicon.

In an embodiment, the first electrode 3110 is an electrically conductive pin of a plurality of first electrically conductive pins electrically connected to each other, the second electrode 3120 is an electrically conductive pin of a plurality of second electrically conductive pins electrically connected to each other, and the third electrode 3130 is an electrically conductive pin of a plurality of third electrically conductive pins electrically connected to each other.

Figure 31B:
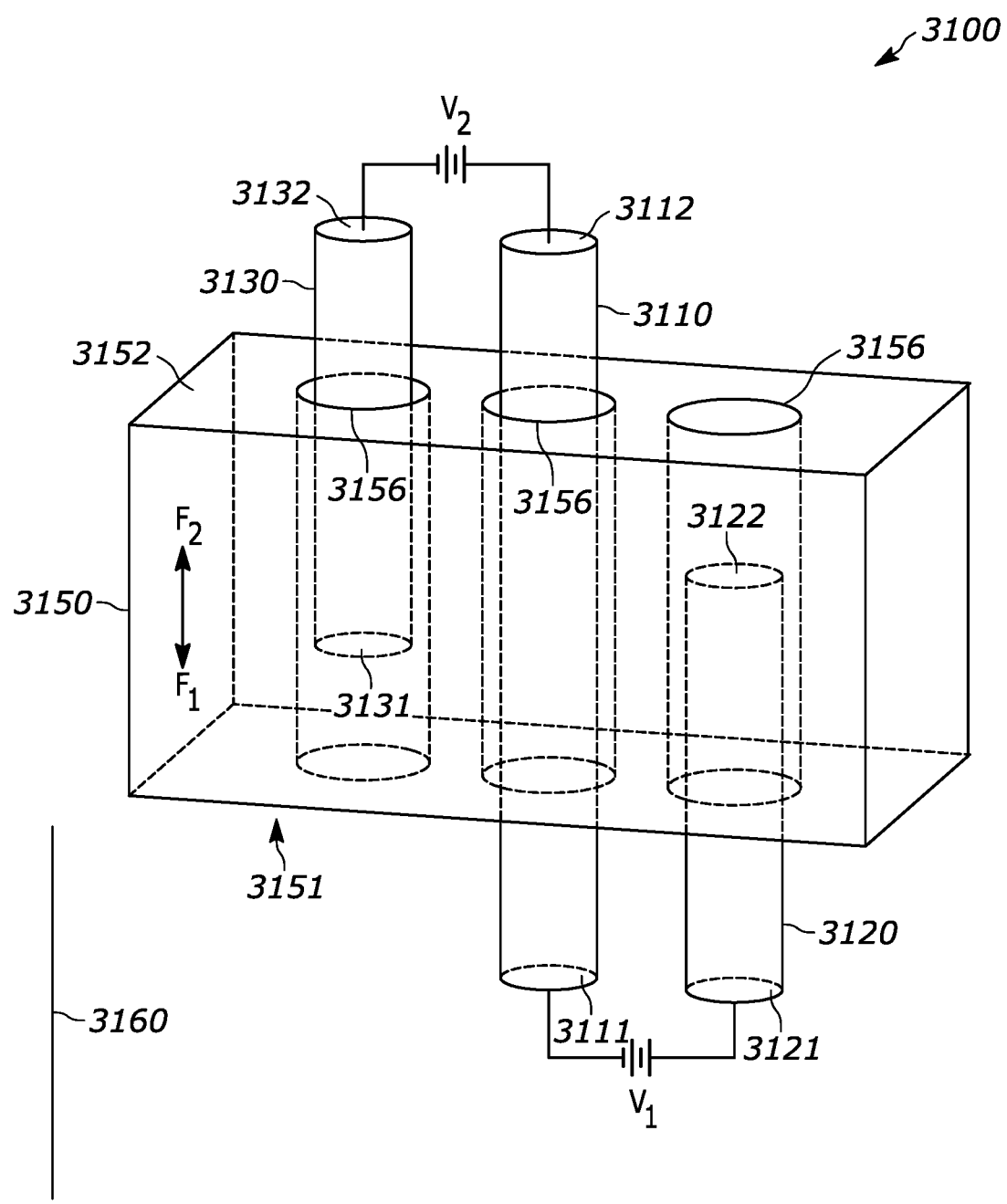

Turning to FIG. 31B, in an embodiment, the dielectric 3150 has a plurality of apertures 3156 that penetrate through the dielectric 3150 in a direction parallel to an axis 3160. The apertures 3156 are depicted as cylindrical but may be any suitable shape. The first, second, and third electrodes can each be located at least partially within an aperture of the plurality of apertures 3156. In other words, part of an electrode may be located within an aperture and/or the electrode may be located in part of the aperture. According to a possible embodiment, at least the second and third electrodes are located only partially within the apertures 3156 for the ends to be located outside the dielectric 3150. For example, the first electrode 3110 may be disposed at least partially within a first aperture of the plurality of apertures 3156. The second end 3122 of the second electrode 3120 may be disposed within a second aperture of the plurality of apertures 3156. The first end 3131 of the third electrode 3130 may be disposed within a third aperture of the plurality of apertures 3156.

Referring to FIG. 31B, the dielectric 3150 has a first surface 3151 and a second surface 3152. The first surface 3151 and the second surface 3152 are parallel to a plane perpendicular to the axis 3160. In the configuration depicted in FIG. 31B, the first end 3111 of the first electrode 3110 and the first end 3121 of the second electrode 3120 extend beyond the first surface 3151, and the second ends 3112 and 3132 of the respective first and third electrodes 3110 and 3130 extend beyond the second surface 3152.

According to an embodiment, the electrodes of the device 3100 are substantially fixed relative to each other. For example, the electrodes may allow for some minor relative movement with respect to one another due to flexion and other forces. The dielectric 3150 and electrodes may also be free to move relative to each other. For example, the dielectric 3150 may be movable parallel to the axis 3160 relative to the first, second, and third electrodes. Additionally or alternatively, the first, second, and third electrodes may be movable relative to the dielectric 3150. The dielectric 3150 may also take other forms such as one or more segments or members.

According to a possible embodiment, the dielectric 3150 can fill at least 50% of a distance (e.g., a distance perpendicular to the first length of the first electrode 3110) between the first and second electrode 3120. For example, the dielectric 3150 may fill at least 75% of the distance, at least 80% of the distance, or at least between 80-90% of the distance. However, the dielectric 3150 may fill any amount from 1% to 99% of the distance. The more the dielectric fills the gap between the electrodes, the more the capacitance changes per unit of displacement and thus the higher the force generated for a given voltage bias between electrodes. Some minimal gap should remain between the dielectric and the electrodes, subject to fabrication constraints, so that the dielectric and electrodes remain moveable relative to each other.

According to an embodiment, a first capacitance exists between the first electrode 3110 and the second electrode 3120 and a second capacitance exists between the first electrode 3110 and the third electrode 3130. The capacitance between electrodes is a function of their positions relative to the dielectric 3150. For example, values of the first and second capacitance can change in opposite directions when the dielectric 3150 moves relative to the electrodes in a direction parallel to the axis 3160. Thus, for example, when the dielectric 3150 moves and causes the first capacitance to increase, the second capacitance may simultaneously decrease. An electrostatic force on the dielectric 3150 relative to the electrodes 3110, 3120, and 3130 may, however, be substantially unchanged relative to the displacement.

According to an embodiment, during operation of the MEMS device 3100, a voltage from a first voltage source V1 is applied between the first electrode 3110 and the second electrode 3120 producing a relatively constant force F1. A voltage from a second voltage source V2 is applied between the first electrode 3110 and the third electrode 3130 to produce a relatively constant force F2. Forces F1 and F2 are in opposition. If the structure is relatively symmetric and the magnitude of the voltage sources V1 and V2 are equal, forces F1 and F2 are equal and thus a net zero force is exerted between the dielectric and the electrodes. The magnitude of the voltages from the voltage sources V1 and V2 can be unequal to compensate for asymmetries in the structure or to intentionally create a non-zero net force between the dielectric and the electrodes.

Figure 32:
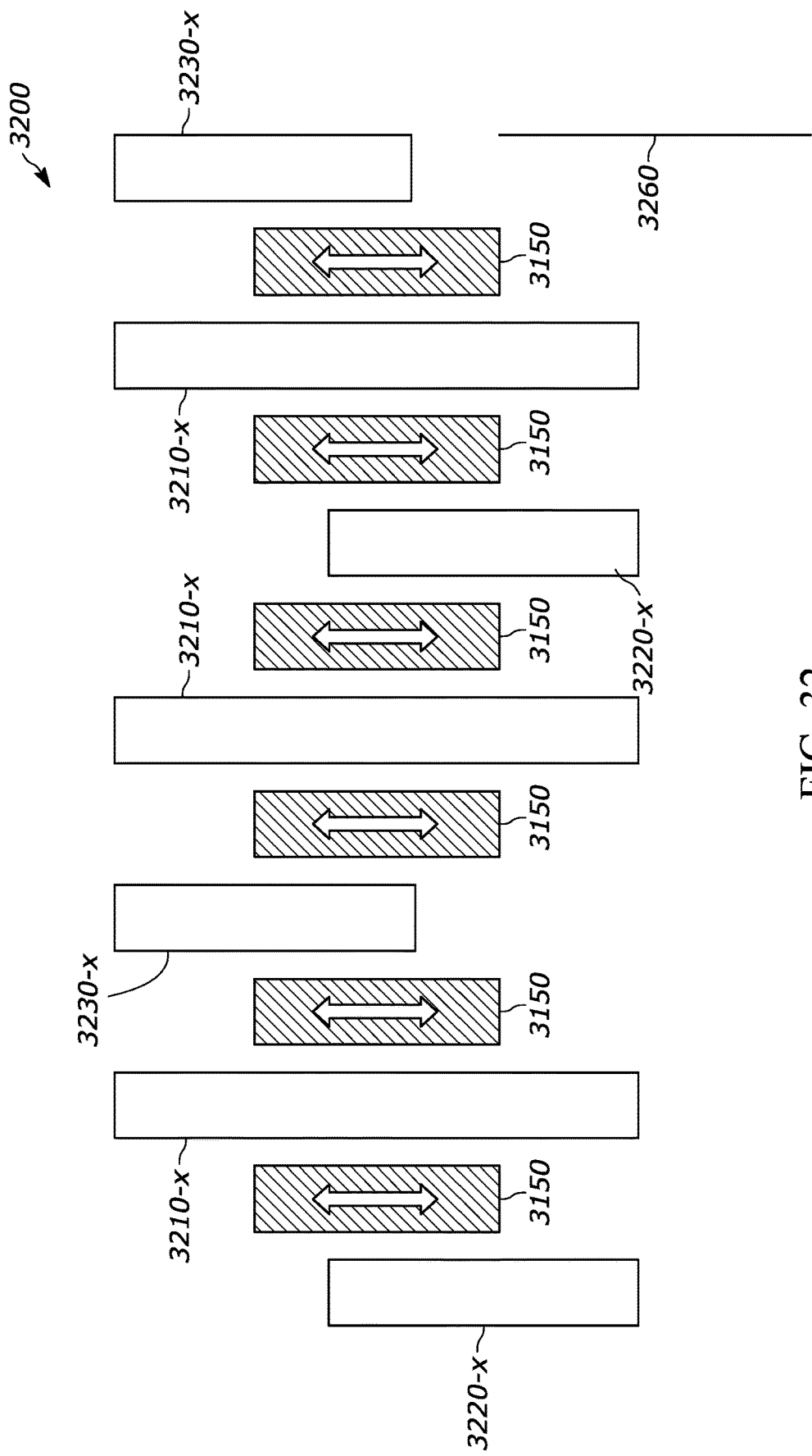
FIG. 32 depicts the operation of a dielectric motor MEMS device, according to another embodiment.

Turning to FIG. 32, a dielectric motor MEMS device 3200 according to another embodiment will now be described. In this embodiment, the function of the first electrode 3110 (from FIG. 3A and FIG. 3B) is carried out by a first set of electrically interconnected electrodes 3210-*x*, the function of the second electrode 3120 is carried out by a second set of electrically interconnected electrodes 3220-*x*, and the function of the third electrode 3130 is carried out by a third set of electrically interconnected electrodes 3230-*x*. The second and third sets of electrodes 3220-*x* and 3230-*x* can be staggered on either side of the first set of electrodes 3210-*x*. This allows for more capacitance and an increase in the change of capacitance with displacement. Other configurations of conductive and dielectric elements, such as bars or rings, may also be used.

Figure 33:
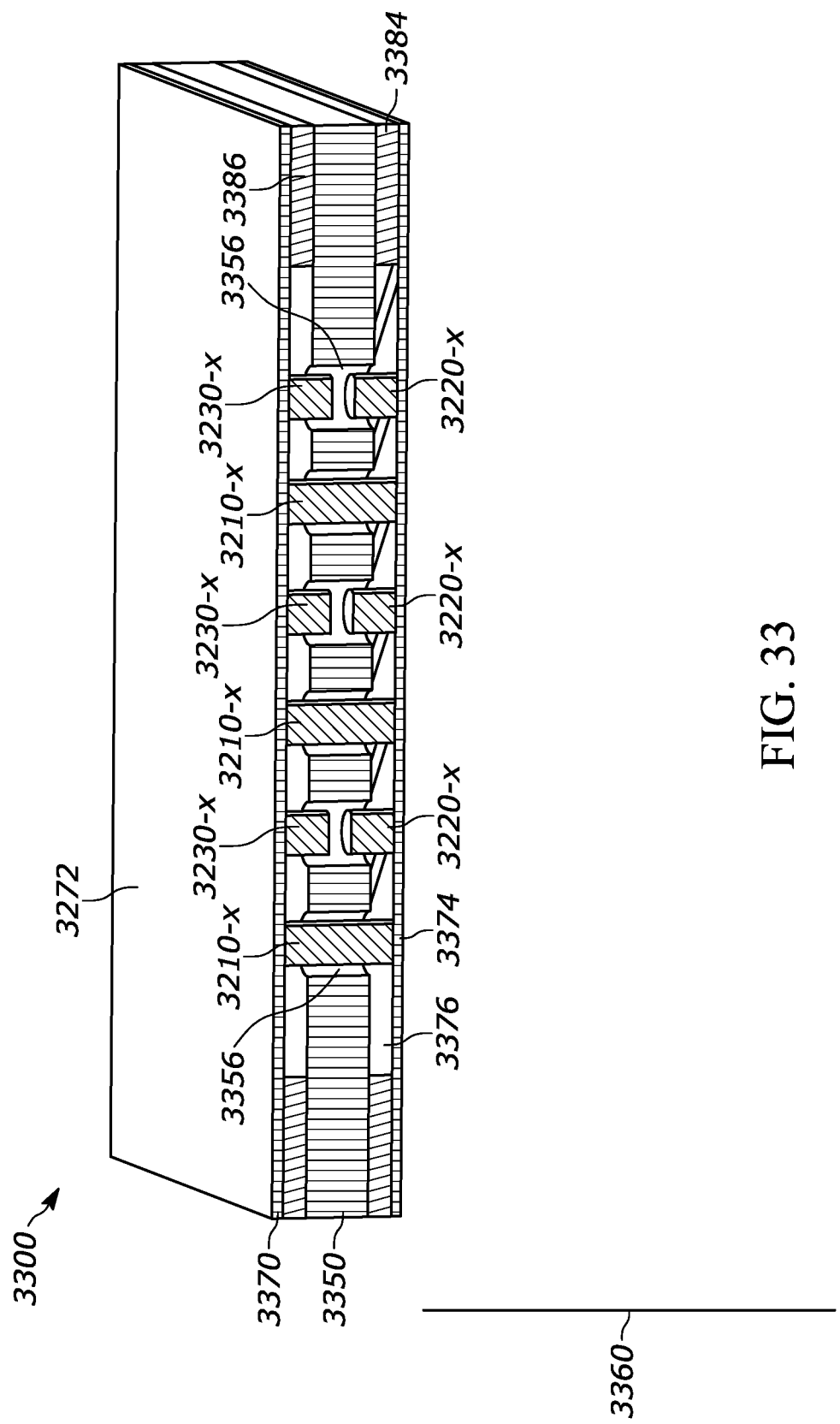
FIG. 33 is a perspective view of a dual-diaphragm, solid dielectric MEMS assembly, according to an embodiment.

Turning to FIG. 33, a dual-diaphragm assembly that incorporates the MEMS device 3200 of FIG. 32 is shown. The dual-diaphragm assembly 3300 includes a diaphragm 3370 coupled to the first set of electrodes 3210-*x* and the third set of electrodes 3230-*x*. The diaphragm 3370 has a surface 3372 perpendicular to the axis 3360. The surface 3372 is substantially planar (e.g., planar but with imperfections on the surface 3372 or slightly curved or uneven while still allowing the surface 3372 to operate in a manner useful for a diaphragm). The diaphragm 3370 may be made of sandwiched layers. The dual-diaphragm assembly 3300 also includes a second diaphragm 3374 located on an opposite side of the dielectric 3350 from the first diaphragm 3370. The second diaphragm 3374 is coupled to the first set of electrodes 3210-*x* and the second set of electrodes 3220-*x*. The second diaphragm 3374 has substantially planar surface 3376 and is oriented perpendicular to the axis 3360. The first diaphragm 3370 and the second diaphragm 3374 are spaced from the dielectric 3350 to permit relative movement between the electrodes connected to the first and second diaphragms and the dielectric 3350.

In an embodiment, a sealed low-pressure region is defined between the diaphragms 3370 and 3374. This low-pressure region serves to reduce noise and damping of the assembly 3300. The first set of electrodes 3210-*x* (which are connected to both the first diaphragm 3370 and the second diaphragm 3374) help prevent the diaphragms from collapsing onto the dielectric 3350. This low-pressure region may be substantially a vacuum (e.g., with a pressure less than 1 Torr, less than 300 mTorr, or less than 100 mTorr). According to an embodiment, the dielectric 3350 is relatively thick and stiff compared to the diaphragms 3370 and 3374 and remains relatively motionless when the diaphragms 3370 and 3374 are deflected. Deflection of the diaphragms 3370 and 3374 moves the electrodes 3210-*x*, 3220-*x*, and 3230-*x* relative to the dielectric 3350

The diaphragms 3370 and 3374 may be made of a dielectric material, such as silicon nitride. However, other materials can be used. For example, one or more of the diaphragm 3370, the diaphragm 3374, and the dielectric 3150 can be polyimide.

In an embodiment, if employed as an acoustic sensor, the MEMS die 3300 operates as follows. Pressure (e.g., from sound waves) reaches at least one of the diaphragms, causing it to flex and to move the electrodes attached thereto relative to the dielectric, thereby causing respective capacitances between the various elements to change. This change in capacitance manifests as a change in one or more signals being output from the MEMS die 3300. The one or more signals are read and interpreted by an IC and passed on to other external components.

Figure 34:
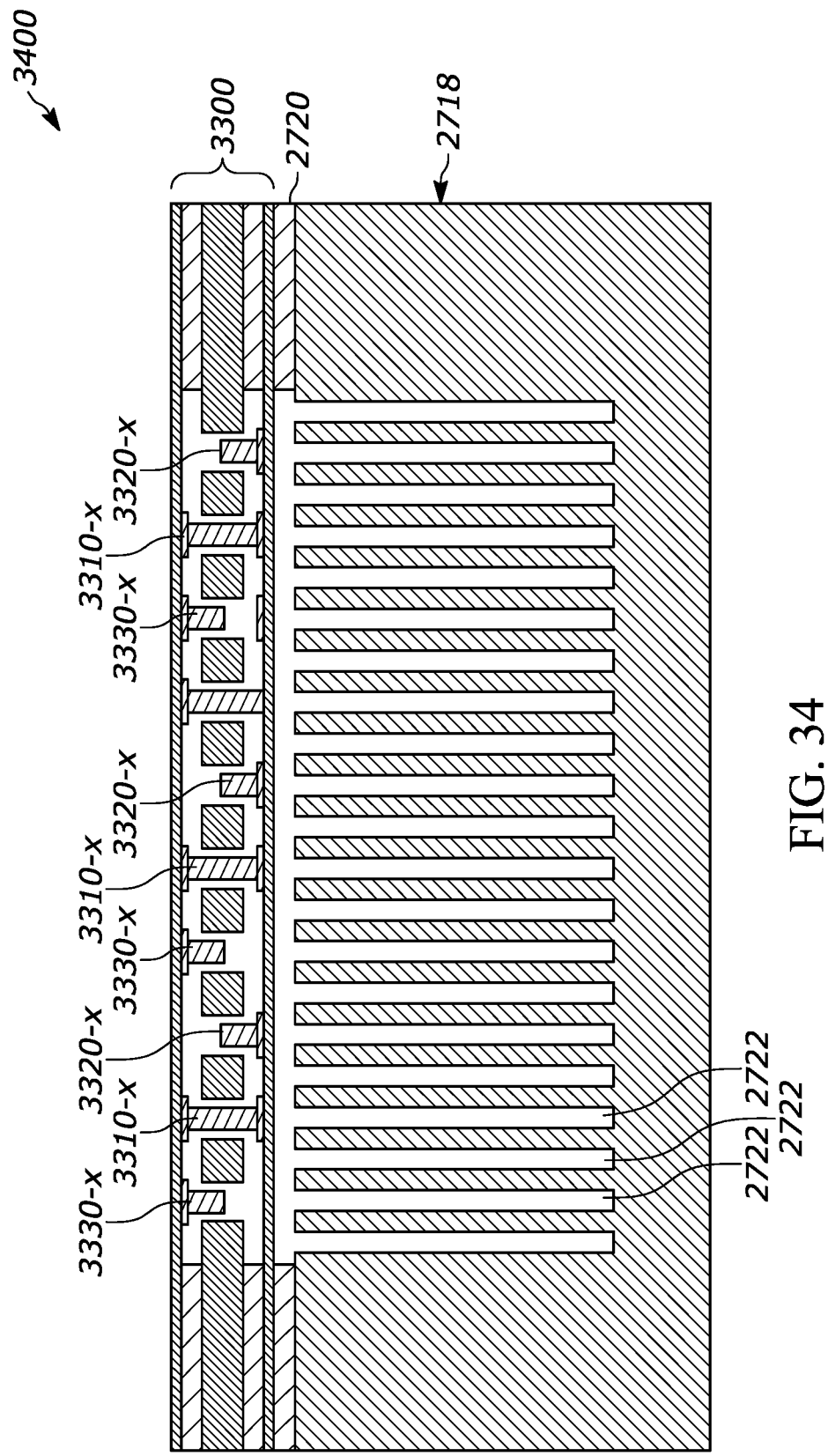
FIG. 34 is a side cross-sectional view of a MEMS device having the assembly of FIG. 33, according to an embodiment.

FIG. 34 depicts a MEMS device 3400 that includes all of the elements of the MEMS device 2700 from FIG. 27 but with the dual-diaphragm assembly 2701 replaced by the dual-diaphragm dielectric motor assembly 3300. The MEMS device 3400 otherwise functions similarly to the MEMS device 2700.

Figure 35:
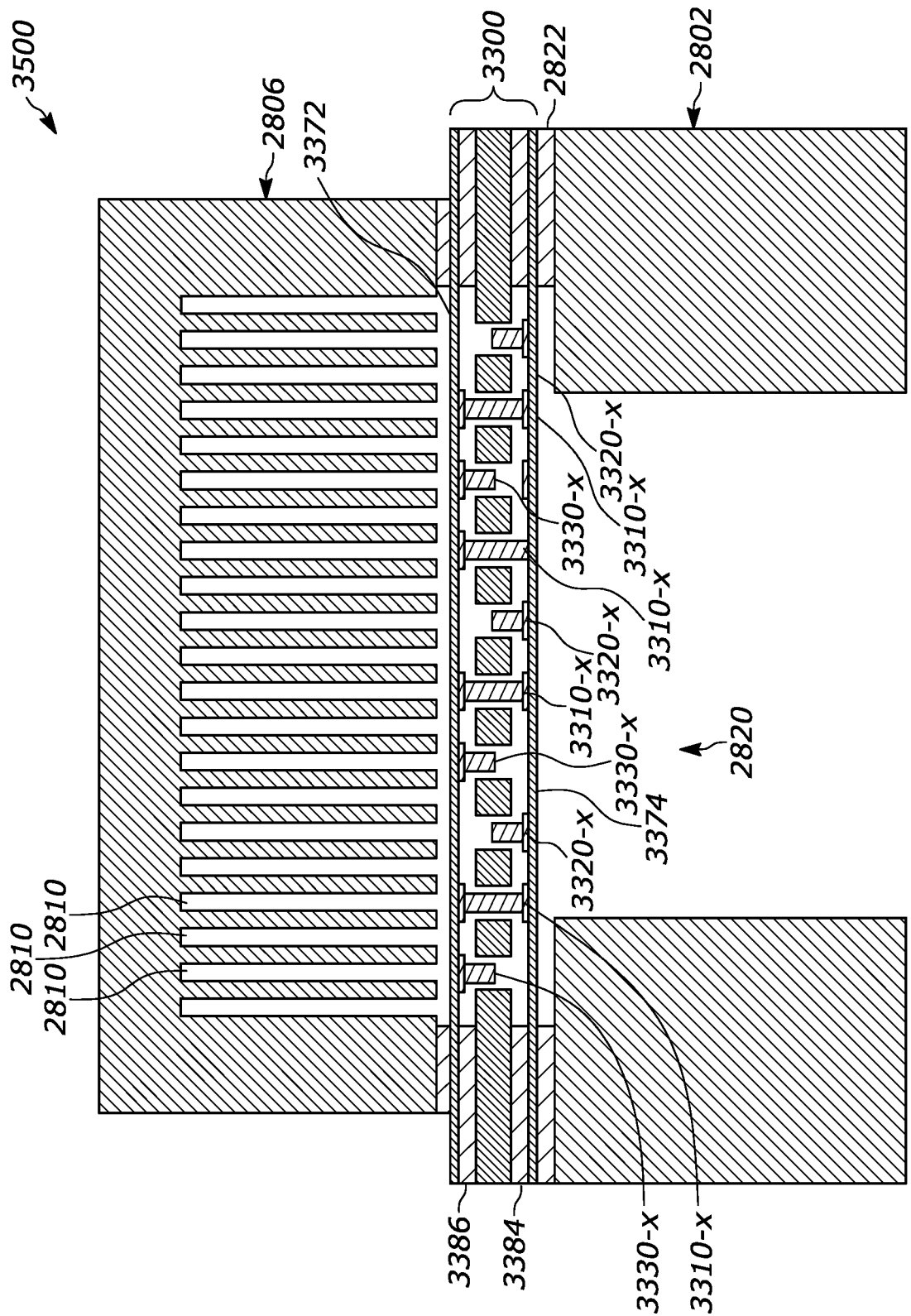
FIG. 35 is a side cross-sectional view of another MEMS device having the assembly of FIG. 33, according to an embodiment.

FIG. 35 depicts an embodiment in which a MEMS device 3500 includes all of the elements of the MEMS device 2800 from FIG. 28A but with the dual diaphragm-assembly 2701 replaced by the dual-diaphragm dielectric motor assembly 3300. The MEMS device 3500 otherwise functions similarly to the MEMS device 2800.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A micro-electro-mechanical systems (MEMS) die comprising:
   an enclosure;
   a diaphragm disposed across an opening of the enclosure, the diaphragm comprising a first electrode,
   wherein the enclosure and the diaphragm define a back volume and every point within the back volume is less than a thermal boundary layer thickness from a nearest surface; and
   a second electrode disposed outside of the back volume and facing the diaphragm.

2. The MEMS die of claim 1, wherein the thermal boundary layer thickness is defined by the expression, $$\sqrt{\frac{2\kappa}{\omega \rho_0 C_p}}$$

where $\kappa$ is the thermal conductivity of gas within the back volume, $\rho_0$ is the density of the gas, $C_p$ is the specific heat at constant pressure of the gas, and $\omega$ is the radian frequency.

3. The MEMS die of claim 1, further comprising a back plate, wherein the second electrode is disposed on the back plate.

4. The MEMS die of claim 2, further comprising a second back plate disposed between the diaphragm and the opening.

5. The MEMS die of claim 1, wherein the diaphragm comprises a first diaphragm, wherein the MEMS die further comprises a second diaphragm facing the second electrode, the second diaphragm comprising a third electrode, wherein the second electrode is disposed between the first diaphragm and the second diaphragm.

6. The MEMS die of claim 5, further comprising a plurality of posts that extend through the second electrode and connect the first diaphragm to the second diaphragm.

7. The MEMS die of claim 5, wherein the first diaphragm and the second diaphragm define a sealed region in which the pressure is lower than an atmospheric pressure.

8. The MEMS die of claim 1, wherein the enclosure comprises a plurality of pillars, a plurality of channels is defined between the pillars.

9. The MEMS die of claim 1, wherein ring-shaped channels are formed into the enclosure.

10. A sensor comprising:
micro-electro-mechanical systems (MEMS) die comprising:
an enclosure;
a diaphragm disposed across an opening of the enclosure, the diaphragm comprising a first electrode, wherein the enclosure and the diaphragm enclose a back volume;
a second electrode disposed outside of the back volume and facing the diaphragm;
wherein:
every point within the back volume is less than a thermal boundary layer thickness from a nearest surface, and
during operation of the sensor, the MEMS die outputs a signal that is based on a capacitance between the first electrode and the second electrode changing due to a change in a distance between the first electrode and the second electrode.

11. The sensor of claim 10, wherein the diaphragm comprises a first diaphragm, wherein the sensor further comprises a second diaphragm facing the second electrode, the second diaphragm comprising a third electrode, wherein
the second electrode is disposed between the first diaphragm and the second diaphragm,
during operation, the MEMS die outputs a second signal that is based on a capacitance between the third electrode and the second electrode changing due to a change in a distance between the third electrode and the second electrode.

12. The sensor of claim 11, further comprising a plurality of posts that extend through the second electrode and connect the first diaphragm to the second diaphragm.

13. The sensor of claim 11, wherein the first diaphragm and the second diaphragm define a sealed region in which the pressure is lower than an atmospheric pressure.

14. The sensor of claim 10, wherein the enclosure comprises a plurality of pillars, a plurality of channels is defined between the pillars.

15. The sensor of claim 10, wherein ring-shaped channels are formed into the enclosure.

16. The sensor of claim 10, further comprising:
a base having a port;
a can attached to the base, wherein the MEMS die is disposed within the can and wherein sound enters through the port and causes the diaphragm to move during operation of the sensor.

17. A micro-electro-mechanical systems (MEMS) die comprising:
an enclosure;
a first diaphragm disposed across an opening of the enclosure, wherein the enclosure and the first diaphragm define a back volume and every point within the back volume is less than a thermal boundary layer thickness from a nearest surface;
a second diaphragm disposed outside of the back volume and facing the first diaphragm;
a solid dielectric disposed between the first diaphragm and the second diaphragm, the solid dielectric having a plurality of apertures;
a first electrode having a first end coupled to the first diaphragm and a second end coupled to the second diaphragm, the first electrode extending through an aperture of the plurality of apertures;
a second electrode oriented lengthwise and parallel to the first electrode, the second electrode having a first end attached to the second diaphragm and a second end disposed within an aperture of the plurality of apertures; and
a third electrode oriented lengthwise and parallel to the first electrode and the second electrode, the third electrode having a first end attached to the first diaphragm and a second end disposed within an aperture of the plurality of apertures.

18. The MEMS die of claim 17, wherein the second end of the second electrode and the second end of the third electrode are disposed within the same aperture of the plurality of apertures.

19. The MEMS die of claim 17, wherein
the first electrode is one of a first plurality of electrodes, each of which has a first end coupled to the first diaphragm, a second end coupled to the second diaphragm, and which extends through an aperture of the plurality of apertures,
the second electrode is one of a second plurality of electrodes, each of which has a first end attached to the second diaphragm and a second end disposed within an aperture of the plurality of apertures, and
the third electrode is one of a third plurality of electrodes, each of which has a first end attached to the first diaphragm and a second end disposed within an aperture of the plurality of apertures.

\* \* \* \* \*